(12) United States Patent
Beeson et al.

(10) Patent No.: US 8,362,502 B2
(45) Date of Patent: *Jan. 29, 2013

(54) SOLID-STATE LIGHT SOURCE

(75) Inventors: Karl W. Beeson, Princeton, NJ (US); Scot M. Zimmerman, Basking Ridge, NJ (US); William R. Livesay, San Diego, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/924,398

(22) Filed: Sep. 27, 2010

(65) Prior Publication Data

US 2011/0018011 A1  Jan. 27, 2011

Related U.S. Application Data

(63) Continuation of application No. 12/315,482, filed on Dec. 3, 2008, now Pat. No. 7,804,099.

(60) Provisional application No. 61/005,258, filed on Dec. 3, 2007, provisional application No. 61/196,439, filed on Oct. 17, 2008.

(51) Int. Cl.
*H01L 33/00* (2010.01)

(52) U.S. Cl. ...... 257/94; 257/98; 257/103; 257/E33.034

(58) Field of Classification Search .................. 257/94, 257/98, 103, E33.034
See application file for complete search history.

(56) References Cited

U.S. PATENT DOCUMENTS

| | | | |
|---|---|---|---|
| 6,630,691 B1 | 10/2003 | Mueller-Mach et al. | |
| 6,696,703 B2 | 2/2004 | Mueller-Mach et al. | |
| 7,687,811 B2 * | 3/2010 | Jang et al. | 257/84 |
| 2005/0006659 A1 | 1/2005 | Ng et al. | |
| 2005/0017253 A1 * | 1/2005 | Hata | 257/80 |
| 2005/0269582 A1 | 12/2005 | Mueller et al. | |
| 2006/0124941 A1 * | 6/2006 | Lee et al. | 257/88 |
| 2009/0140279 A1 * | 6/2009 | Zimmerman et al. | 257/98 |
| 2010/0105159 A1 * | 4/2010 | Kim et al. | 438/46 |

* cited by examiner

*Primary Examiner* — Trung Q Dang
(74) *Attorney, Agent, or Firm* — William Propp, Esq.

(57) ABSTRACT

A solid-state light source includes at least one stack of light emitting elements. The elements are an inorganic light emitting diode chip and at least one wavelength conversion chip or the elements are a plurality of light emitting diode chips and one or more optional wavelength conversion chips. The wavelength conversion chip may include an electrical interconnection means. The light emitting diode chip may include at least one GaN-based semiconductor layer that is at least ten microns thick and that is fabricated by hydride vapor phase epitaxy. A method is described for fabricating the solid-state light source.

18 Claims, 48 Drawing Sheets

SOLID-STATE LIGHT SOURCE

REFERENCE TO PRIOR APPLICATIONS

This application is a continuation of prior U.S. patent application Ser. No. 12/315,482, filed on Dec. 3, 2008 now U.S. Pat. No. 7,804,099 and claims the benefit of U.S. Provisional Patent Application Ser. No. 61/005,258, which was filed on Dec. 3, 2007, and of U.S. Provisional Patent Application Ser. No. 61/196,439, which was filed on Oct. 17, 2008, all of which are herein incorporated by reference.

TECHNICAL FIELD

The present invention is a solid-state light source that includes at least one stack of light emitting elements. The light emitting elements in the stack include an inorganic light emitting diode (LED) chip and a wavelength conversion chip. The wavelength conversion chip may incorporate an electrical interconnection means to allow an electrical connection to the light emitting diode chip. Alternatively, the light emitting elements in the stack include two or more inorganic light emitting diode chips and optionally one or more wavelength conversion chips. A method for fabricating a stack of light emitting elements is disclosed.

BACKGROUND OF THE INVENTION

Solid-state light sources can incorporate, for example, one or more LEDs and optionally may include one or more phosphor materials. A typical conventional, solid-state light source is constructed from one or more packaged LEDs. Each LED package may contain one light emitting, multilayer semiconductor structure mounted on a substrate that includes appropriate electrical contacts. Alternatively, each package may contain one multi-layer semiconductor structure mounted on a substrate and include a wavelength conversion material consisting of phosphor particles that may be embedded in a transparent polymer. The wavelength conversion material usually covers the emitting area of the LED.

Both the LEDs and the phosphors used in conventional solid-state light sources have deficiencies that can be eliminated in order to provide less expensive light sources and to provide sources with higher optical outputs. In addition, the standard combined LED/phosphor package is bulky and is deficient in many ways. Some of the deficiencies of conventional solid-state light sources are described below.

Conventional LEDs are fabricated by epitaxially growing multiple layers of semiconductors on a growth substrate. Inorganic light-emitting diodes can be fabricated from GaN-based semiconductor materials containing gallium nitride (GaN), aluminum nitride (AlN), aluminum gallium nitride (AlGaN), indium nitride (InN), indium gallium nitride (InGaN) and aluminum indium gallium nitride (AlInGaN). Other appropriate materials for LEDs include, for example, aluminum gallium indium phosphide (AlGaInP), gallium arsenide (GaAs), indium gallium arsenide (InGaAs), indium gallium arsenide phosphide (InGaAsP), diamond, boron nitride and zinc oxide (ZnO). Especially important LEDs for this invention are GaN-based LEDs that emit light in the ultraviolet, blue, cyan and green regions of the optical spectrum and AlGaInP-based LEDs that emit in the orange and red spectral regions.

The total thickness of the semiconductor layers for a conventional GaN-based LED is only about 3 microns. The layers are fabricated by epitaxially growing a layered semiconductor structure on a growth substrate using metal organic chemical vapor deposition (MOCVD), which has a very slow growth rate of approximately 0.1 micron per hour. This results in deposition times of tens of hours and makes the growth of thicker layers prohibitively expensive. The approximately 3-micron thick multilayer semiconductor structure is very fragile and will break easily if removed from the growth substrate to form a free-standing die. The semiconductor layers must therefore either remain attached to the growth substrate or, alternatively, be attached to a transfer substrate using wafer bonding techniques followed by removal of the growth substrate. The wafer bonding techniques are expensive and can be unreliable. The added steps increase the cost of manufacturing LEDs. Removal of the growth substrate can be done by a laser liftoff process, chemical processing or mechanical polishing.

The growth substrate for GaN-based LEDs is usually sapphire or silicon carbide and is chosen to closely match the crystallographic structure of the epitaxial layers. A transfer substrate, if utilized, can be a metal, another semiconductor material such as silicon or a ceramic material such as aluminum nitride. Such growth or transfer substrates may not suitable for the final LED device. For example, sapphire is a poor thermal conductor and is therefore not the most effective thermal conductor to direct heat away from the semiconductor layers. Thermal considerations are very important for LEDs, which generate a significant amount of heat during operation. The heat lowers the light output and operating lifetime of the LED. As LED sizes become larger, such heating effects become more important and can seriously degrade the light-output performance and lifetime of the LEDs.

In addition, the growth or transfer substrate may absorb some of the light emitted by the LED, thereby lowering the optical output. The substrate may also trap some of the light generated by the LED, resulting in an additional loss in optical output. Light trapping is caused by the high refractive index of the substrate relative to air and results in total internal reflection of emitted light back through the substrate and back through the epitaxial layers.

It would be desirable to develop thick, rugged LED chips that do not include either growth or transfer substrates and that can be easily handled without breaking. Different growth techniques will be required to make such a structure since MOCVD is too slow to fabricate thick multi-layer semiconductor structures.

In standard LED-based light source designs, the back side of the LED opposite the light emitting side is a reflective surface. It would also be desirable to develop LED chips that do not have a back reflecting surface and that can emit light from all sides. Eliminated the back reflecting surface can reduce the average optical pathlength of the emitted light within the LED structure, thereby reducing optical absorption within the LED and increasing the external quantum efficiency.

A conventional wavelength conversion material for solid-state lighting typically consists of a phosphor powder that may be embedded in a transparent polymer. The wavelength conversion material can be deposited, for example, as a dome that covers the output surface of the LED.

The standard approach to produce wavelength conversion materials begins by making bulk solid phosphors using solid-state processing as known in the art. These phosphors are then ground down to powders in the micron size range and deposited on a surface using a variety of deposition techniques such as settling, encapsulation within a polymer matrix or spray coating. Though relatively inexpensive, the phosphors generated using these methods suffer from high levels of dislocations and lattice defects. In addition, the compositional purity is also difficult to maintain. In the majority of cases, this does not represent a major problem because of the reduced excitation levels. It has been shown in accelerated aging studies, however, that very high excitation levels can degrade the output luminescence of powdered phosphors severely and impact overall life performance. These levels of high excitation exist within solid-state lighting applications. This is mainly due to the small size and concentrated flux density of the LED die itself.

Several material characteristics such as lattice defects, outgassing, and compositional purity contribute to the problems of light output degradation and/or loss in efficiency for phosphor materials. It has been shown that polycrystalline and mono-crystalline phosphor films either grown on a substrate or as single crystal boules tend to exhibit much better luminosity and life characteristics than powders. In addition, every phosphor has a thermal quenching level that can degrade the output at the temperatures created by elevated excitation levels. In the case of powdered phosphors, this can be a major issue because the phosphor particles are usually isolated from any reasonable thermal conduction path. At very high excitation levels, the energy associated with less than unity quantum efficiency and Stokes shift losses can induce a significant localized thermal rise within the phosphor particles. The need exists for the creation of an improved thermal conduction path for the luminescent material. Also, the scattering created by the use of a powder can reduce the overall light output due to the backscattering and subsequent absorption of the generated light.

Mueller-Mach et al. in U.S. Pat. No. 6,696,703 disclose the deposition of a thin film phosphor directly on the LED die. However, as-deposited thin film phosphors have relatively poor wavelength conversion efficiency. A high-temperature annealing step is required in order to properly activate the phosphor. This annealing step can damage the semiconductor layers of the LED. In addition, the absorption cross-sections of most thin film phosphors are low, especially for blue and near ultraviolet (UV) excitations typically used for solid-state lighting. It is neither economical nor practical in most cases to create a sufficiently thick layer of luminescent material grown directly on the LED. Another drawback to depositing a phosphor directly on the LED die is that a large portion of the light generated within a deposited phosphor layer can be trapped due to total internal reflectance. The need therefore exists for a method to utilize high performance phosphors within an LED package such that the best phosphor can be used efficiently (e.g. with sufficient quantity, minimal backscatter, and maximum light extraction). The need also exists for a method to fabricate high efficiency phosphors without damaging the LED semiconductor layers.

Mueller-Mach et al. in U.S. Pat. No. 6,630,691 disclose a thin single-crystal phosphor substrate onto which an LED structure is fabricated by epitaxial growth techniques. However, single-crystal phosphor substrates are expensive and finding a single crystal phosphor substrate that has the proper lattice match to allow the growth of the LED structure can be difficult.

Ng et al. in US Patent Application No. 20050006659 disclose a planar sheet of a single-crystal phosphor that is placed over the output surface of an LED as a portion of a preformed transparent cap. However, single-crystal phosphor sheets must be grown by epitaxial processes or sliced from bulk single crystals of phosphor material. Single crystal phosphor sheets are therefore too expensive for most practical applications. Planar sheets of polycrystalline phosphors are not disclosed in US Patent Application No. 20050006659. Bonding the planar sheet of a single-crystal phosphor directly to the surface of the LED to improve heat dissipation in the phosphor sheet is also not disclosed.

A need exists to maximize the efficiency of wavelength conversion materials within a solid-state lighting application and to improve the thermal conductivity properties of the materials. In addition, a need exits for low-cost phosphors that have light extraction enhancements and the ability to control the level and type of scatter within the phosphor in order to enhance the overall conversion efficiency.

It would be desirable to replace the conventional wavelength conversion material with a solid wavelength conversion chip that could be bonded to the surface of an LED chip. This cannot be done with most types of LED devices since the wavelength conversion chip would cover up one or both of the LED electrodes and prevent attachment of electrical connections to the LED. It would be desirable, therefore, to incorporate an electrical interconnection means within the wavelength conversion chip.

A conventional LED package containing an LED and a wavelength-converting phosphor is bulky compared to the light emitting epitaxial layered structure itself. If many LED packages are used in the solid-state light source, the light source is significantly larger and thicker than necessary.

It would be desirable to form stacks of light emitting chips, where each stack includes one LED chip and one or more wavelength conversion chips. Such stacks of chips can be handled individually or combined with other stacks to form larger distributed light sources. Such stacks of light emitting chips could be utilized for applications such as backlights for liquid crystal displays (LCDs) or for general lighting applications such as room lighting. It would also be desirable if the LED chip used in such a stack has a thick, rugged multilayer semiconductor structure and that the chip does not retain the growth substrate nor utilize a transfer substrate. Eliminating the transfer and growth substrates can improve the thermal conduction properties of the light emitting chips.

It would also be desirable to fabricate a solid-state light source that is a stack of two or more LED chips and optionally includes one or more wavelength conversion chips. Such stacks could be handled and used individually or formed into arrays to construct a distributed light source.

It would also be desirable if the stacks of LED chips and wavelength conversion chips could be electrically connected in series, parallel or anti-parallel configurations or in some combination of series, parallel or anti-parallel configurations. Anti-parallel electrical configurations are desirable if the electrical power source is an alternating current source.

U.S. Patent Publication No. 20050269582 discloses a ceramic phosphor layer bonded to a conventional LED. In one example, the LED is a flip chip device with both electrodes on the side of the LED opposite the ceramic phosphor so that no electrodes are in the way when bonding the ceramic phosphor layer to the LED. The LED includes a growth substrate that is still attached to the top surface of the semiconductor layers of the LED. The phosphor layer is also bonded to the growth substrate, but on the side opposite the semiconductor layers. In a second example, the p-contact layer of the LED is attached to a transfer (host) substrate and the ceramic phosphor layer is attached to the n-layer opposite the transfer (host) layer. The n-contact is adjacent to the ceramic phosphor layer and on the same side of the LED as the phosphor layer. The original growth substrate has been removed but the transfer substrate remains with the device.

U.S. Patent Publication No. 20050269582 does not disclose LEDs that have neither a growth substrate nor a transfer substrate as an element of the LED die. U.S. Patent Publication No. 20050269582 does not disclose LEDs where the n-type layer, the p-type layer or both the n-type layer and the p-type layers are thick enough so that the multilayer semiconductor structure of the LED is rugged and may be handled as a free-standing chip without having the growth or transfer substrate still attached. In addition, U.S. Patent Publication No. 20050269582 does not disclose wavelength conversion chips that include an electrical interconnection means. U.S. Patent Publication No. 20050269582 also does not disclose a stack of light emitting chips where one chip is an LED chip and another chip is a wavelength conversion chip that includes an electrical interconnection means. U.S. Patent Publication No. 20050269582 does not disclose a stack of light emitting chips where at least two of the chips are LED chips and where the stack optionally includes at least one wavelength conversion chip.

Many types of conventional solid-state light sources that emit high output lumens or high output power attempt to generate the required lumens or power from one large LED die or from an array of closely spaced LED die. Although useful for light sources requiring a small emitting area or etendue, this type of light source has two deficiencies for general lighting applications such as room lighting. One deficiency is that the high output intensity from such a concentrated source can exceed eye safety standards and can be a safety hazard. It would be desirable instead to make large-area, distributed light sources using many smaller light source chips so that light intensity safety standards are not exceeded. To accomplish this, the light source chips need to be inexpensive and easy to handle. It would also be desirable if the light source chips were constructed as stacks of LED chips and wavelength conversion chips.

For general lighting applications, a light source brightness of less than 1000 ftL (foot-lamberts) is preferred. Assuming such a brightness level on a lambertian-emitting surface would indicate that the area of a 1000 lumen source would be around 1 square foot. Presently only 10 square millimeters of LED emitter area are required to generate 1000 lumens at a current density of 1 ampere per square millimeter and with a total drive power of less than 20 watts. However, the same 1000 lumens can be generated for less than half the input power if the LED die are operated at their maximum efficiency point. The die area required to do this is larger but still represents less than 0.1% of the 1 square foot area needed to make the 1000 lumen distributed light source.

A conventional high powered LED typically operates at high current density, for example 1-2 amperes per square millimeter of LED area, resulting in lower external quantum efficiency than would be the case if the LED were operating at lower currents. Usually the highest external quantum efficiency for the LED device is obtained at a much lower current density of about 0.1-0.2 amperes per square millimeter of LED area. Using a single LED die operating at high current density instead of several smaller LEDs operating a low current density is usually dictated by the high cost of packaging multiple LED die. It would be desirable to develop lower cost methods to manufacture LEDs so that one large LED can be replaced by several smaller light source chips operating at the most efficient current density. This would allow the low cost production of a 1000 lumen sources with 1 square foot area, for example.

An additional problem with high powered light sources is that a single, high-powered LED die or a closely spaced array of LED die can produce a significant amount of heat that must be dissipated quickly to prevent the die from overheating. Metal heat sinks with large area fins are generally required for convection cooling of such devices. Unlike a 1000 lumen point source, a more desirable 1000 lumen distributed source that covers a 1 square foot area would not need any thermal management due to the large surface area available for cooling. A naturally convection-cooled surface can easily dissipate 30 to 50 watts with a reasonably small increase in temperature. It would be desirable to combine this cooling mechanism with the improved efficiency of operating a distributed array of small LED light source chips at low current densities in order to create an efficient, low cost, uniform light source useful for a variety of applications.

Conventional LED-based light sources are cooled by a heat sink in thermal contact with the LED die. The LED die includes either a growth substrate or a transfer substrate. Heat flows from the LED semiconductor layers, through the growth or transfer substrate and through the heat sink to ambient. The heat sink may include fins or other types of structures to transfer heat to an ambient fluid, such as air or water. It would be desirable to develop LED-based light sources where the LED die do include the growth substrate or a transfer substrate and where the LED die can be cooled without a special heat sink. In such cases, heat will flow directly from the light source to an ambient fluid such as air or water.

The deficiencies of conventional solid-state light sources described above can be eliminated by the various embodiments of this invention that are described below in the summary, the figures and the detailed descriptions of the preferred embodiments.

SUMMARY OF THE INVENTION

One embodiment of this invention is solid-state light source that includes at least one stack of elements. The elements in the stack include at least one inorganic LED chip and at least one wavelength conversion chip. The inorganic LED chip emits internally generated light of a first wavelength range. The wavelength conversion chip converts at least a portion of the light of a first wavelength range into light of a second wavelength range, different than the first wavelength range. The wavelength conversion chip may include an electrical interconnection means to allow an electrical connection to the LED chip. The interconnect means may include a via, a via plus solder bump, an electrode embedded in the wavelength conversion chip or an electrode fabricated on the surface of the wavelength conversion chip.

The wavelength conversion chip electrodes may be optically transparent, semi-transparent, semi-opaque or opaque. The electrodes may be fabricated from metals, metal alloys, high-temperature-fusible conductive materials, semiconductors or transparent conductive oxides. An example of a high-temperature-fusible material is a conductive silver paste or ink. Examples of transparent conductive oxides include indium tin oxide, zinc oxide, indium-doped zinc oxide and aluminum-doped zinc oxide. A preferred transparent conductive oxide is aluminum-doped zinc oxide. Preferably the aluminum-doped zinc oxide is fabricated by metal-organic chemical vapor deposition and preferably the aluminum-doped zinc oxide electrode is greater than 500 nanometers thick.

The inorganic LED chip can be, for example, a conventional LED chip that is fabricated so that the total thickness of the epitaxial semiconductor layers, also denoted as a multilayer semiconductor structure, is less that about 5 microns and is too fragile to form a self-supporting device. To provide structural support, a conventional LED chip retains the growth substrate upon which the multilayer semiconductor structure was fabricated or includes a transfer substrate that is bonded to the multilayer semiconductor structure opposite the growth substrate during the fabrication process. The transfer substrate, if present, provides structural support to the epitaxial layers once the growth substrate is removed.

A conventional LED chip has a first side and an opposing second side. Usually light is emitted predominantly from only one side of the chip. The opposing side is substantially covered by one or more reflecting layers and emits little, if any, light.

The LED chip or chips utilized in this invention do not need to be conventional LED chips. An inorganic LED chip can also be a chip that does not include a growth or a transfer substrate. Such a substrate-free inorganic LED chip has at least one thick epitaxial layer to provide structural support to the chip. The thick epitaxial layer can be an n-doped layer or a p-doped layer. Optionally both the n-doped layer and the p-doped layer may be thick layers. The thick epitaxial semiconductor layer is at least 10 microns thick, preferably at least 15 microns thick, more preferably at least 20 microns thick and most preferably at least 25 microns thick. The total thickness of the entire multilayer semiconductor structure is at preferably least 10 microns, more preferably at least 20 microns and most preferably at least 30 microns. When the LED chip includes at least one thick, epitaxial semiconductor layer to provide structural support, the growth or transfer substrate is no longer needed and the LED chip can be handled as a free-standing device without damage.

The substrate-free LED of this invention includes a first doped layer, a first electrode in electrical contact with the first doped layer, a second doped layer, a second electrode in electrical contact with the second doped layer, and an active region interposed between the first doped layer and the second doped layer. The active region emits internally generated light in a first wavelength range. The first electrode and the second electrode may be optically transparent, semi-transparent, semi-opaque or opaque. The electrodes may be fabricated from metals, metal alloys, high-temperature-fusible conductive materials, semiconductors or transparent conductive oxides (TCOs). An example of a high-temperature-fusible material is a conductive silver paste or ink. Examples of TCOs include indium tin oxide (ITO), zinc oxide (ZnO), indium-doped zinc oxide (IZO) or aluminum-doped zinc oxide (AZO). A preferred TCO is aluminum-doped zinc oxide. Preferably the aluminum-doped zinc oxide is fabricated by metal-organic chemical vapor deposition (MOCVD) and preferably the aluminum-doped zinc oxide electrode is greater than 500 nanometers thick.

Substrate-free LED chips that include high-temperature electrodes can be interconnected and packaged using process temperatures greater than 400 degrees Centigrade. Examples of high-temperature processes include laser welding, brazing, glass encapsulation and fusion bonding.

The LED chip or chips utilized in this invention may also be unconventional chips that have a first side and an opposing second side and that emit light from both the first and second sides. In such a device, neither the first side nor the second side is substantially covered by reflecting layers.

The wavelength conversion chip or chips utilized in this invention include a solid layer formed from wavelength conversion materials. The wavelength conversion materials may be, for example, phosphor materials or quantum dot materials. The phosphor materials may be in the form of powders, ceramics, thin solid films or bulk solids. Preferred forms are ceramics and thin solid films. The wavelength conversion layer may also be formed from two or more different wavelength conversion materials. The wavelength conversion layer may include optically inert host materials for the wavelength conversion phosphors or quantum dots.

Another embodiment of this invention is a solid-state light source that includes at least one stack of elements, where the elements in the stack include at least two substrate-free inorganic LED chips. Preferably, at least one of the substrate-free inorganic LED chips is substantially transparent to light emitted by the second LED chip. Optionally the stack also includes at least one wavelength conversion chip.

Another embodiment of this invention is a solid-state light source that includes at least one stack of elements, where the elements include at least one substrate-free LED chip and two wavelength conversion chips. The substrate-free LED chip has a first side and an opposing second side. Light of a first wavelength range is emitted from both the first side and the second side of the LED chip. One wavelength conversion chip is bonded to the first side of the at least one substrate-free LED chip and the other wavelength conversion chip is bonded to the opposing second side of the at least one substrate-free LED chip. The wavelength conversion chips convert a portion of the light of a first wavelength range into light of at least a second wavelength range. The area of the wavelength conversion chip may be larger than the area of the at least one LED chip. Light is emitted from substantially all sides of the solid-state source.

Another embodiment of this invention is a solid-state light source that includes a plurality of stacks arranged in a linear array or a substantially linear array. Each stack includes at least one substrate-free LED chip and at least one wavelength conversion chip. The stacks can be electrically connected in series, parallel or anti-parallel configurations or in some combination of series, parallel or anti-parallel configurations.

Another embodiment of this invention is a solid-state light source that includes a plurality of stacks arranged in a two-dimensional array, regular or irregular, to form an extended area light source. Each stack includes at least one substrate-free LED chip and at least one wavelength conversion chip. The stacks can be mounted on a reflecting substrate or a transparent substrate. The stacks can be electrically connected in series, parallel or anti-parallel configurations or in some combination of series, parallel or anti-parallel configurations.

Another embodiment of this invention is a solid-state light source that includes at least one stack of elements enclosed in a sealed transparent envelope. Each stack includes at least one substrate-free LED chip and at least one wavelength conversion chip. The stack is substantially cooled by convection utilizing direct contact with a fluid. The fluid can be either a gas or a liquid and the fluid can be either a single chemical element or compound or a mixture of chemical elements or compounds.

Another embodiment of this invention is a method of making a solid-state light source that includes a stack of elements. The elements in the stack include at least one inorganic LED chip and at least one wavelength conversion chip.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein:

FIG. 1A is a top plan view of the LED. FIG. 1B is a side cross-sectional view along the I-I plane illustrated in FIG. 1A.

FIG. 4A is a top plan view of the LED. FIG. 4B is a side cross-sectional view along the I-I plane illustrated in FIG. 4A.

FIG. 5A is a top plan view of the chip. FIGS. 5B and 5C are side cross-sectional views along the I-I plane illustrated in FIG. 5A.

FIG. 11A is a top plan view. FIG. 11B is a side cross-sectional view along the I-I plane illustrated in FIG. 11A.

FIG. 13A is a top plan view. FIG. 13B is a side cross-sectional view along the I-I plane illustrated in FIG. 13A.

FIG. 14A is a top plan view. FIG. 14B is a side cross-sectional view along the I-I plane illustrated in FIG. 14A.

FIG. 15A is a top plan view. FIG. 15B is a side cross-sectional view along the I-I plane illustrated in FIG. 15A.

FIG. 16A is a top plan view. FIG. 16B is a side cross-sectional view along the I-I plane illustrated in FIG. 16A.

FIG. 17A is a top plan view of the chip. FIG. 17B is a side cross-sectional view along the I-I plane illustrated in FIG. 17A.

FIG. 18A is a top plan view of the chip. FIG. 18B is a side cross-sectional view along the I-I plane illustrated in FIG. 18A.

FIG. 19A is a bottom plan view of the chip. FIG. 19B is a side cross-sectional view along the I-I plane illustrated in FIG. 19A.

FIG. 20A is a bottom plan view. FIG. 20B is a side cross-sectional view along the I-I plane illustrated in FIG. 20A.

FIG. 20C is a bottom plan view of a wavelength conversion chip where the bottom surface is substantially covered with a transparent electrode. FIG. 20D is a side cross-sectional view along the I-I plane illustrated in FIG. 20C.

FIG. 21A is a bottom plan view of the chip. FIG. 21B is a side cross-sectional view along the I-I plane illustrated in FIG. 21A.

FIG. 22A is a bottom plan view of the chip. FIG. 22B is a side cross-sectional view along the I-I plane illustrated in FIG. 22A.

FIG. 33A is a top plan view. FIG. 33B is a side cross-sectional view along the I-I plane illustrated in FIG. 33A.

FIG. 34A is a top plan view. FIG. 34B is a side cross-sectional view along the I-I plane illustrated in FIG. 34A.

DETAILED DESCRIPTION OF THE PREFERRED EMBODIMENTS

Figure 1A:
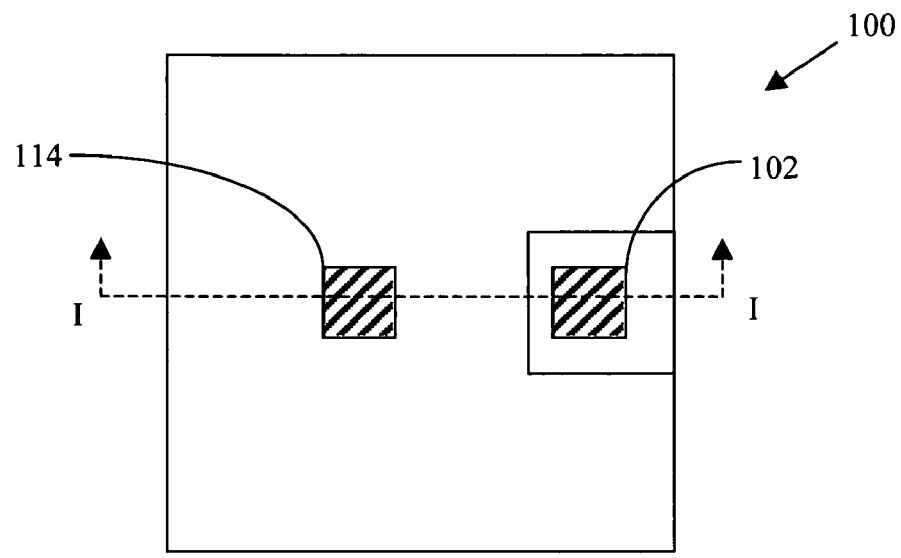
FIGS. 1A and 1B are illustrations of conventional LED chip of the prior art that has two electrodes on the top side and includes a growth substrate.

The preferred embodiments of the present invention will be better understood by those skilled in the art by reference to the above listed figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention.

Light emitting diodes can be fabricated by epitaxially growing multiple layers of semiconductors on a growth substrate. Inorganic light-emitting diodes can be fabricated from gallium nitride (GaN) based semiconductor materials containing, for example, gallium nitride (GaN), aluminum nitride (AlN), aluminum gallium nitride (AlGaN), indium nitride (InN), indium gallium nitride (InGaN) and/or aluminum indium gallium nitride (AlInGaN). Other appropriate materials for LEDs include, for example, aluminum gallium indium phosphide (AlGaInP), gallium arsenide (GaAs), indium gallium arsenide (InGaAs), indium gallium arsenide phosphide (InGaAsP), diamond, boron nitride (BN) and zinc oxide (ZnO).

Especially important LEDs for this invention are GaN-based LEDs that utilize epitaxially-grown layers that can include GaN, AlN, AlGaN, InN, InGaN or AlInGaN. Depending on the composition of the semiconductor layers, GaN-based LEDs emit light in the ultraviolet, blue, cyan or green regions of the optical spectrum. The growth substrate for GaN-based LEDs is typically sapphire ($Al_2O_3$), silicon carbide (SiC), bulk gallium nitride or bulk aluminum nitride. Although the embodiments of this invention will be described using GaN-based LEDs, other types of LEDs including, but not limited to, AlGaInP and ZnO LEDs may also be utilized in the embodiments.

Typical epitaxial growth methods for thin semiconductor layers of gallium-nitride-based materials include chemical vapor deposition (CVD), metal-organic chemical vapor deposition (MOCVD), vapor phase epitaxy (VPE), hydride vapor phase epitaxy (HVPE) and molecular beam epitaxy (MBE). MOCVD is the most common method for conventional GaN-based LEDs where the total thickness of the epitaxial layers is less than about 5 microns. MOCVD is a relatively slow deposition method with growth rates of approximately 0.1 micron per hour. HVPE has much higher growth rates (10 microns per hour is possible). HVPE can be used to fabricate substrate-free LEDs that are described in this invention and where the thickness of one of the layers is at least 5 microns and could be as much as 30 microns or more.

The embodiments of this invention can utilize conventional GaN-based LED chips that are fabricated so that the total thickness of the epitaxial semiconductor layers, which include a first doped layer, a second doped layer and an active region interposed between the first doped layer and the second doped layer, is less than about 5 microns thick. The complete set of epitaxial semiconductor layers is also denoted in this application as the multilayer semiconductor structure. The first doped layer and the second doped layers of the multilayer semiconductor structure can be, respectively, an n-doped layer and a p-doped layer or the layers can be reversed so that the first doped layer is a p-doped layer and the second doped layer is an n-doped layer.

When the multilayer semiconductor structure is less that about 5 microns thick, it is too fragile to form a self-supporting device. To provide structural support, a conventional LED chip retains the growth substrate upon which the multilayer semiconductor structure was fabricated or includes a transfer substrate that is bonded to the multilayer semiconductor structure opposite the growth substrate during the fabrication process. The transfer substrate, if present, provides structural support to the epitaxial layers once the growth substrate is removed.

A conventional LED chip usually emits light predominately from one side of the chip. The opposing side is substantially covered by one or more reflecting layers and emits little, if any, light.

Examples of conventional LED chips of the prior art that can be utilized in embodiments of this invention are illustrated in FIGS. 1 to 4.

Figure 1B:
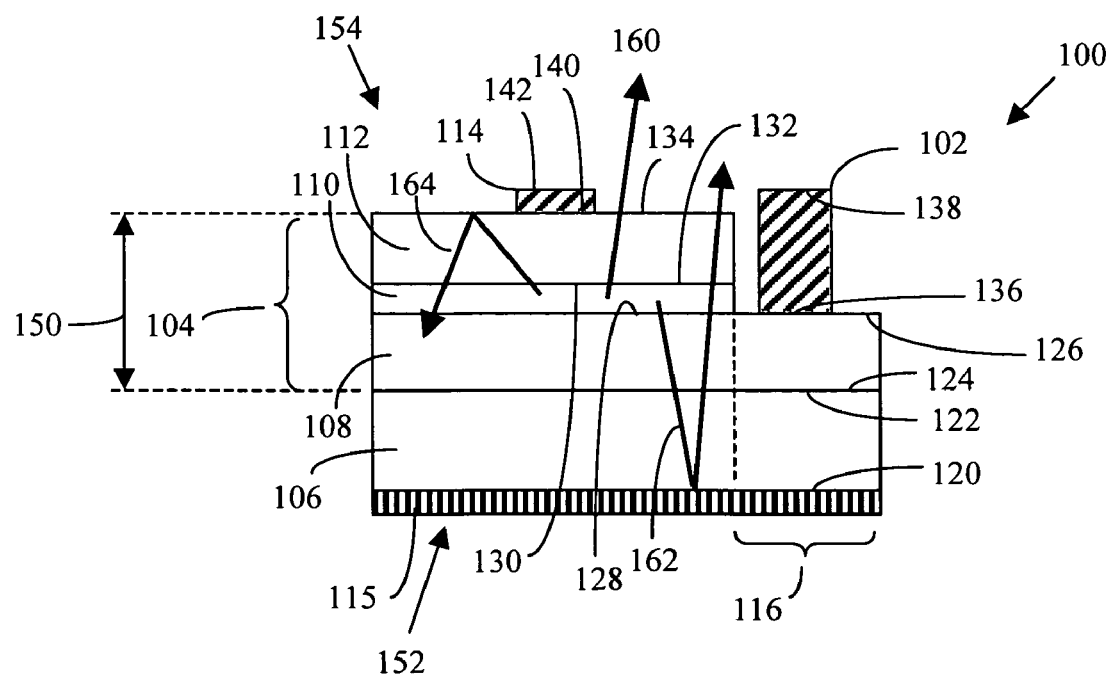

FIGS. 1A and 1B are illustrations of conventional LED chip 100. FIG. 1A is a top plan view of the chip. FIG. 1B is a side cross-sectional view along the I-I plane illustrated in FIG. 1A. Conventional LED chip 100 in FIG. 1 has both the n-electrode and p-electrode on the "top" surface of the device and the chip includes a growth substrate. Conventional LED chip 100 includes a first electrode 102, a multilayer semiconductor structure 104, a second electrode 114, a growth substrate 106 and a back reflector 115. The multilayer semiconductor structure 104 includes a first doped layer 108, an active region 110 and a second doped layer 112, which is on the opposite side of the active region 110 from the first doped semiconductor layer 108. Consequently, the active region is interposed between the first doped layer and the second doped layer. The active region is in electrical contact with the first doped layer and the second doped layer and the active region emits light in a first wavelength range when a current is applied through the first and second electrodes.

The first electrode 102 is in electrical contact with the first doped layer 108 and the second electrode 114 is in electrical contact with the second doped layer 112. The first electrode and the second electrode may be fabricated from metals or metal alloys. For example, the first electrode and the second electrode may be formed from one or more metals or metal alloys containing, but not limited to, silver, aluminum, gold, nickel, titanium, chromium, platinum, palladium, rhodium, rhenium, ruthenium and tungsten.

The multilayer semiconductor structure 104 of the LED chip 100 can be fabricated from GaN-based semiconductor materials containing GaN, AlN, AlGaN, InN, InGaN and/or AlInGaN. Alternatively, the multilayer semiconductor structure can be fabricated from any appropriate light-emitting semiconductor material.

The active region 110 of the multilayer semiconductor structure 104 is a p-n homojunction, a p-n heterojunction, a single quantum well or a multiple quantum well of the appropriate semiconductor material for the LED.

For purposes of illustration, LED chip 100 is assumed to be a GaN-based LED chip. The important fabrication steps for this GaN-based, illustrative example will be briefly summarized.

First a multilayer semiconductor structure 104 is fabricated on a growth substrate 106. The growth substrate is sapphire. The multilayer semiconductor structure includes a first doped layer 108, an active region 110 and a second doped layer 112. The growth substrate 106 has a first surface 120 and a second surface 122 opposite the first surface.

The first doped layer 108 is an n-doped GaN layer, which is epitaxially deposited or otherwise conventionally fabricated on the second surface 122 of the growth substrate. The first doped layer 108 has a first surface 124 and a second surface 126 opposite the first surface. The first surface 124 of the first doped layer is in contact with surface 122 of the growth substrate.

The active region 110 is a GaN-based multiple quantum well structure, which is epitaxially deposited or otherwise conventionally fabricated on the second surface 126 of the first doped layer 108. The active region 110 has a first surface 128 and a second surface 130 opposite the first surface. The first surface 128 of the active region is in electrical contact with the second surface 126 of the first doped layer.

The second doped layer 112 is a p-doped GaN layer, which is epitaxially deposited or otherwise conventionally fabricated on the second surface 130 of the active region 110. The second doped layer has a first surface 132 and a second surface 134 opposite the first surface. The first surface 132 of the second doped layer is in electrical contact with the second surface 130 of the active region.

A portion 116 of the second doped layer 112 and the active region 110 is removed to expose a portion 116 of the second surface 126 of the first doped layer. The first electrode 102 and the second electrode 114 are fabricated from aluminum. An aluminum layer is deposited on the second surface 134 of the second doped layer and the exposed portion 116 of the second surface 126 of the first doped layer. The aluminum layer is patterned by standard photolithographic techniques to form the first electrode 102 and the second electrode 114. First electrode 102 has a first surface 136 and a second surface 138. The first surface 136 of the first electrode is in electrical contact with the second surface 126 of the first doped layer. Second electrode 114 has a first surface 140 and a second surface 142. First surface 140 of the second electrode is in electrical contact with the second surface 134 of the second doped layer.

The first electrode 102 only partially covers the exposed portion 116 of the second surface 126 of the first doped layer. The second electrode 114 only partially covers the second surface 134 of the second doped layer. The remaining portion of the exposed portion 116 of the second surface 126 of the first doped layer and the second surface 134 of the second doped layer are an output or exit surface for the light emitted by the LED 100. To form a back reflector 115, a layer of silver is deposited on the first surface 120 of the growth substrate.

In summary, LED chip 100 has a first electrode 102, a multilayer semiconductor structure 104 that includes first-doped, active and second-doped layers, a growth substrate 106 and a second electrode 114. LED chip 100 has a first side 152 and a second side 154. The first side 152 is substantially adjacent to the first doped layer 108. The second side 154 is substantially adjacent to the second doped layer 112. The active region 110 emits internally generated light in a first wavelength range when a current is applied through the first electrode 102 and the second electrode 114. The light is emitted from the second side 154 of the LED.

The total thickness 150 of the multilayer semiconductor structure 104 for LED chip 100 is less than 5 microns. In this illustrative example, the thickness of the first doped layer (the n-doped layer) is approximately 3 microns, the thickness of the active region (a multi-quantum well structure) is approximately 0.5 microns and the thickness of the second doped layer (the p-doped layer) is approximately 0.5 microns, resulting in a total thickness of 4 microns. In this example, all the semiconductor layers are grown by MOCVD.

When utilized as in a light source, LED chip 100 is normally attached to a submount or leadframe (neither is shown). The submount or leadframe acts as a heat transfer element or heatsink to remove heat generated by the device during operation.

Example light rays 160, 162 and 164 illustrate internally generated light that is emitted by the active region 110 of the LED. Internally generated light ray 160 is emitted by active region 110 toward output surface 134 of the LED chip. Internally generated light ray 160 is directed at an angle to surface 134 that is less than the critical angle, which allows light ray 160 to exit the LED chip through surface 134.

Internally generated light ray 162 is emitted by active region 110 toward the rear reflector 115 of the LED. Internally generated light ray 162 is reflected by reflector 115 and directed to the output surface 134 at an angle less than the critical angle. Internally generated light ray 162 exits the LED chip through surface 134.

Internally generated light ray 164 is directed to surface 134 at an angle that is greater than the critical angle. Internally generated light ray 164 is reflected by total internal reflection and is redirected toward the rear reflector 115 of the LED chip.

In the illustrative example in FIG. 1, the first doped semiconductor layer 108 is a n-doped layer and the second doped semiconductor layer 112 is a p-doped layer. However, the two layers can, in principle, be reversed. If the first doped semiconductor layer 108 is a p-doped layer, then the second doped semiconductor layer 112 is an n-doped layer. The two doped semiconductor layers 108 and 112 will have opposite n and p conductivity types.

It is well known by those skilled in the art that the multilayer semiconductor structure 104 may include additional layers in order to adjust and improve the operation of the LED chip 100. For example, a current spreading layer may be inserted between surface 136 of the first electrode 102 and surface 126 the first doped layer 108. Such a current spreading layer will have the same conductivity type as the first doped layer and will improve the uniformity of current injection across the entire active region. In addition, a current spreading layer may be inserted between surface 134 of the second doped layer and surface 140 of the second electrode 114. The latter current spreading layer will have the same conductivity type as the second doped layer. As another example, an electron blocking layer or a hole blocking layer may inserted either between surface 126 of the first doped layer 108 and surface 128 of the active region 110 or between surface 130 of the active region 110 and surface 132 of the second doped layer 112. An electron blocking layer reduces the escape of electrons from the active region. A hole blocking layer reduces the transfer of holes through the layer.

Figure 2:
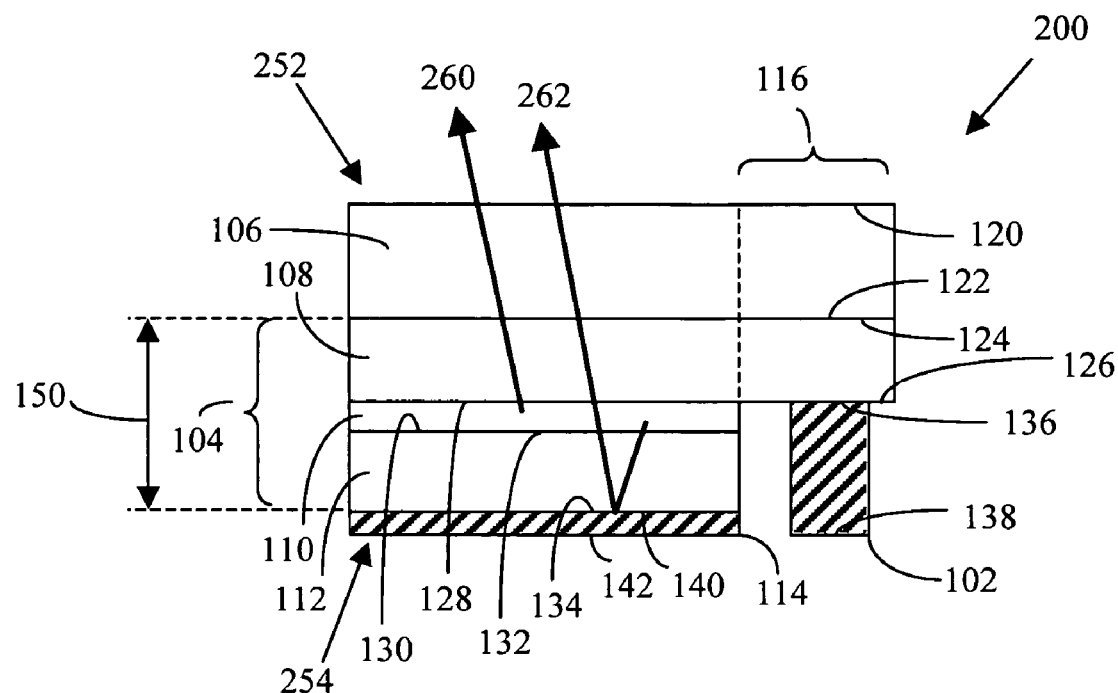
FIG. 2 is a side cross-sectional view of conventional LED chip of the prior art that has two electrodes on the bottom side and includes a growth substrate.

Another conventional LED design is illustrated in FIG. 2. Conventional LED chip 200 in FIG. 2 is similar to LED chip 100 in FIG. 1 except that the LED chip 200 structure is inverted and has both the n-electrode and p-electrode on the "bottom" surface of the device. This configuration is sometimes called a flip-chip design. LED 200 also includes a growth substrate.

Except for the back reflecting surfaces, most of the elements of LED chip 200 are the same as LED chip 100. Conventional LED chip 200 includes a first electrode 102, a multilayer semiconductor structure 104, a second electrode 114 and a growth substrate 106. The multilayer semiconductor structure 104 includes a first doped layer 108, an active region 110 and a second doped layer 112, which is on the opposite side of the active region 110 from the first doped semiconductor layer 108.

The first electrode 102 is in electrical contact with the first doped layer 108 and the second electrode 114 is in electrical contact with the second doped layer 112. For LED chip 200, the second electrode is a reflecting electrode and covers substantially all of surface 134 of the second doped layer 112. The first electrode and the second electrode may be fabricated from reflecting metals.

The multilayer semiconductor structure 104 of LED chip 200 can be fabricated from GaN-based semiconductor materials containing GaN, AlN, AlGaN, InN, InGaN and/or AlInGaN. Alternatively, the multilayer semiconductor structure can be fabricated from any appropriate light-emitting semiconductor material.

The active region 110 of the multilayer semiconductor structure 104 is a p-n homojunction, a p-n heterojunction, a single quantum well or a multiple quantum well of the appropriate semiconductor material for the LED chip 200.

For purposes of illustration, LED chip 200 is assumed to be a GaN-based LED. The important fabrication steps for this GaN-based, illustrative example will be briefly summarized. Many of the fabrication steps are identical to the steps for LED chip 100 and will not be repeated.

First, a multilayer semiconductor structure 104 of LED chip 200 is fabricated on a sapphire growth substrate 106 using the same methods that are described above for LED 100. The growth substrate 106 has a first surface 120 and a second surface 122 opposite the first surface. The multilayer semiconductor structure includes a first doped layer 108 that is n-doped GaN, an active region 110 that is a GaN-based multiple quantum well structure and a second doped layer 112 that is p-doped GaN.

A portion 116 of the second doped layer 112 and the active region 110 is removed to expose a portion 116 of the second surface 126 of the first doped layer. The first electrode 102 and the second electrode 114 are fabricated from aluminum. An aluminum layer is deposited on the second surface 134 of the second doped layer and the exposed portion 116 of the second surface 126 of the first doped layer. The aluminum layer is patterned by standard photolithographic techniques to form the first electrode 102 and the second electrode 114. The first surface 136 of the first electrode is in electrical contact with the second surface 126 of the first doped layer. First surface 140 of the second electrode is in electrical contact with the second surface 134 of the second doped layer.

The first electrode 102 partially covers the exposed portion 116 of the second surface 126 of the first doped layer. The second electrode 114 substantially covers the second surface 134 of the second doped layer. Surface 136 of the first electrode and surface 140 of the second electrode form the back reflector for LED chip 200.

In summary, LED chip 200 has a first electrode 102, a multilayer semiconductor structure 104 that includes first-doped, active and second-doped layers, a growth substrate 106 and a second electrode 114. LED chip 200 has a first side 252 and a second side 254. The first side 252 is substantially adjacent to the first doped layer 108. The second side 254 is substantially adjacent to the second doped layer 112. The active region 110 emits internally generated light in a first wavelength range when a current is applied through the first electrode 102 and the second electrode 114. The light is emitted from the first side 252 of the LED.

The total thickness 150 of the multilayer semiconductor structure 104 for LED chip 200 is less than 5 microns. In this illustrative example, the thickness of the first doped layer (the n-doped layer) is approximately 3 microns, the thickness of the active region (a multi-quantum well structure) is approximately 0.5 microns and the thickness of the second doped layer (the p-doped layer) is approximately 0.5 microns, resulting in a total thickness of 4 microns. In this example, all the semiconductor layers are grown by MOCVD.

When utilized as in a light source, LED chip 200 is normally attached to a submount or a leadframe (neither is shown). The submount or leadframe acts as a heat transfer element or heatsink to remove heat generated by the device during operation. The submount or leadframe also includes electrical interconnections that attach to the first electrode and second electrode.

Example light rays 260 and 262 illustrate internally generated light that is emitted by the active region 110 of the LED. Internally generated light ray 260 is emitted by active region 110 toward the first surface 120 of the growth substrate. Surface 120 is also the output surface of the LED. Internally generated light ray 260 is directed at an angle to surface 120 that is less than the critical angle, which allows light ray 260 to exit the LED chip through surface 120.

Internally generated light ray 262 is emitted by active region 110 toward the second electrode 114 of the LED. Internally generated light ray 262 is reflected by the surface 140 of the second electrode and is directed to the output surface 120 at an angle less than the critical angle. Internally generated light ray 262 exits the LED chip through surface 120.

Figure 3:
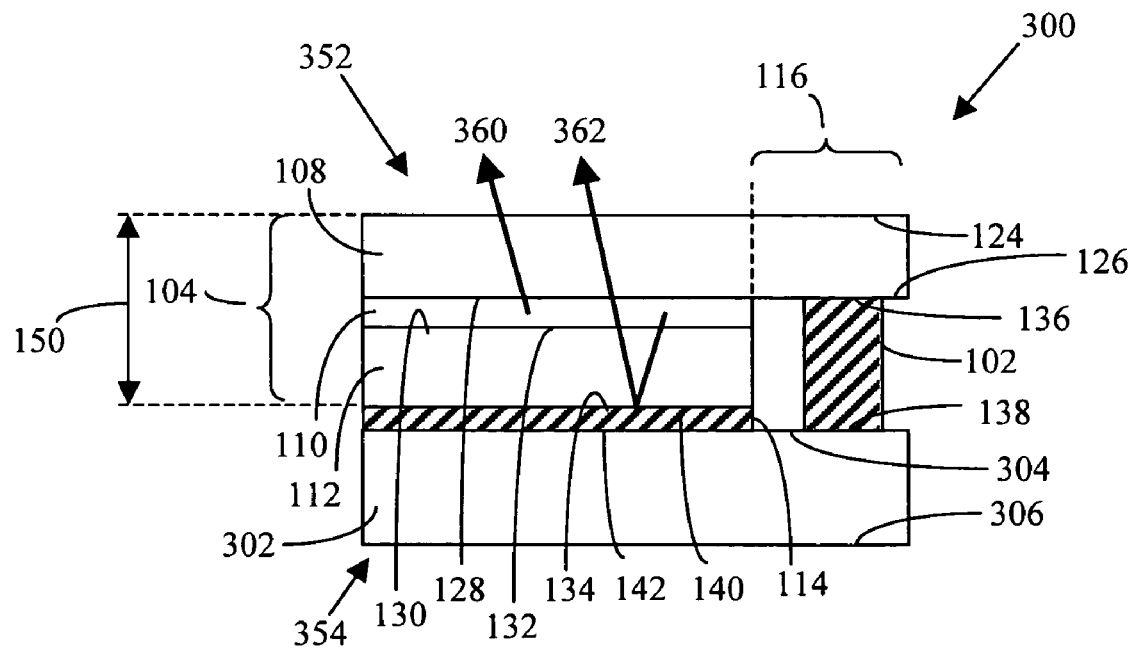
FIG. 3 is a side cross-sectional view of conventional LED chip of the prior art that has two electrodes on the bottom side and includes a transfer substrate.

Another conventional LED design is illustrated in FIG. 3. Conventional LED chip 300 in FIG. 3 is similar to LED chip 100 in FIG. 1 and LED chip 200 in FIG. 2. The LED chip 300 structure is inverted and has both the n-electrode and p-electrode on the "bottom" side of the device. This configuration is another version of a flip-chip structure. However, for the LED chip 300 design, the LED structure is bonded to a transfer substrate 302 that includes electrical connections to the n-electrode and the p-electrode. The original growth substrate has been removed.

Except for the removal of the growth substrate and the addition of a transfer substrate 302, most of the elements of LED chip 300 are the same as LED chip 200. Conventional LED chip 300 includes a first electrode 102, a multilayer semiconductor structure 104, a second electrode 114 and a transfer substrate 302. The multilayer semiconductor structure 104 includes a first doped layer 108, an active region 110 and a second doped layer 112, which is on the opposite side of the active region 110 from the first doped semiconductor layer 108.

The first electrode 102 is in electrical contact with the first doped layer 108 and the second electrode 114 is in electrical contact with the second doped layer 112. For LED 300, the second electrode is a reflecting electrode and covers substantially all of surface 134 of the second doped layer 112. The first electrode and the second electrode may be fabricated from reflecting metals.

The multilayer semiconductor structure 104 of LED chip 300 can be fabricated from GaN-based semiconductor materials containing GaN, AlN, AlGaN, InN, InGaN and/or AlInGaN. Alternatively, the multilayer semiconductor structure can be fabricated from any appropriate light-emitting semiconductor material.

The active region 110 of the multilayer semiconductor structure 104 is a p-n homojunction, a p-n heterojunction, a single quantum well or a multiple quantum well of the appropriate semiconductor material for the LED chip 300.

For purposes of illustration, LED chip 300 is assumed to be a GaN-based LED. The important fabrication steps for this GaN-based, illustrative example will be briefly summarized. Many of the fabrication steps are identical to the steps for LED chip 100 and LED chip 200 and will not be repeated.

First a multilayer semiconductor structure 104 of LED chip 300 is fabricated on a sapphire growth substrate (not shown) using the same methods that are described above for LED 100. The multilayer semiconductor structure includes a first doped layer 108 that is n-doped GaN, an active region 110 that is a GaN-based multiple quantum well structure and a second doped layer 112 that is p-doped GaN.

A portion 116 of the second doped layer 112 and the active region 110 is removed to expose a portion 116 of the second surface 126 of the first doped layer. The first electrode 102 and the second electrode 114 are fabricated from aluminum. An aluminum layer is deposited on the second surface 134 of the second doped layer and the exposed portion 116 of the second surface 126 of the first doped layer. The aluminum layer is patterned by standard photolithographic techniques to form the first electrode 102 and the second electrode 114. The first surface 136 of the first electrode is in electrical contact with the second surface 126 of the first doped layer. First surface 140 of the second electrode is in electrical contact with the second surface 134 of the second doped layer.

The first electrode 102 partially covers the exposed portion 116 of the second surface 126 of the first doped layer. The second electrode 114 substantially covers the second surface 134 of the second doped layer. Surface 136 of the first electrode and surface 140 of the second electrode form the back reflector for LED chip 300.

A transfer substrate 302 is bonded to surface 138 of the first electrode and surface 142 of the second electrode. The transfer substrate is usually chosen to have good thermal conductivity and a thermal expansion coefficient that is similar to GaN. The transfer substrate may be any solid material such as a composite that is chosen for its thermal expansion properties or a ceramic material. In this example, the transfer substrate will have electrical interconnections (not shown) that attach to electrodes 102 and 114.

After the transfer substrate is attached, the growth substrate is removed by standard processing steps. For example, the growth substrate can be removed by a laser liftoff process, a chemical process or by mechanical polishing.

In summary, LED chip 300 has a first electrode 102, a multilayer semiconductor structure 104 that includes first-doped, active and second-doped layers, a transfer substrate 302 and a second electrode 114. LED chip 300 has a first side 352 and a second side 354. The first side 352 is substantially adjacent to the first doped layer 108. The second side 354 is substantially adjacent to the second doped layer 112. The active region 110 emits internally generated light in a first wavelength range when a current is applied through the first electrode 102 and the second electrode 114. The light is emitted from the first side 352 of the LED.

The total thickness 150 of the multilayer semiconductor structure 104 for LED chip 300 is less than 5 microns. In this illustrative example, the thickness of the first doped layer (the n-doped layer) is approximately 3 microns, the thickness of the active region (a multi-quantum well structure) is approximately 0.5 microns and the thickness of the second doped layer (the p-doped layer) is approximately 0.5 microns, resulting in a total thickness of 4 microns. In this example, all the semiconductor layers are grown by MOCVD.

When utilized as in a light source, LED chip 300 may also include a submount (not shown), which acts as a heat transfer element or heatsink to remove heat generated by the device during operation.

Example light rays 360 and 362 illustrate internally generated light that is emitted by the active region 110 of the LED. Internally generated light ray 360 is emitted by active region 110 toward the first surface 124 of the first doped layer. Surface 124 is also the output surface of the LED. Internally generated light ray 360 is directed at an angle to surface 124 that is less than the critical angle, which allows light ray 360 to exit the LED chip through surface 124.

Internally generated light ray 362 is emitted by active region 110 toward the second electrode 114 of the LED. Internally generated light ray 362 is reflected by the surface 140 of the second electrode and is directed to the output surface 124 at an angle less than the critical angle. Internally generated light ray 362 exits the LED chip through surface 124.

Another type of conventional LED that can be used in this invention has one electrode on the "top" side of the device and one electrode on the "bottom" side. LED chip 400 illustrated in FIGS. 4A and 4B is one example of such a device.

Figure 4A:
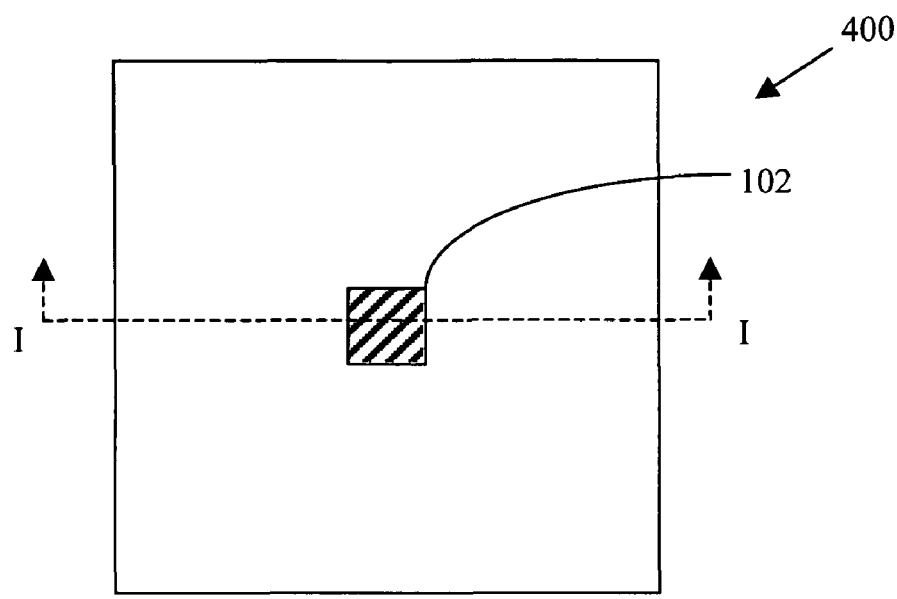
FIGS. 4A and 4B are illustrations of conventional LED chip of the prior art that has one electrode on the top side, one electrode on the bottom side and includes a transfer substrate.
Figure 4B:
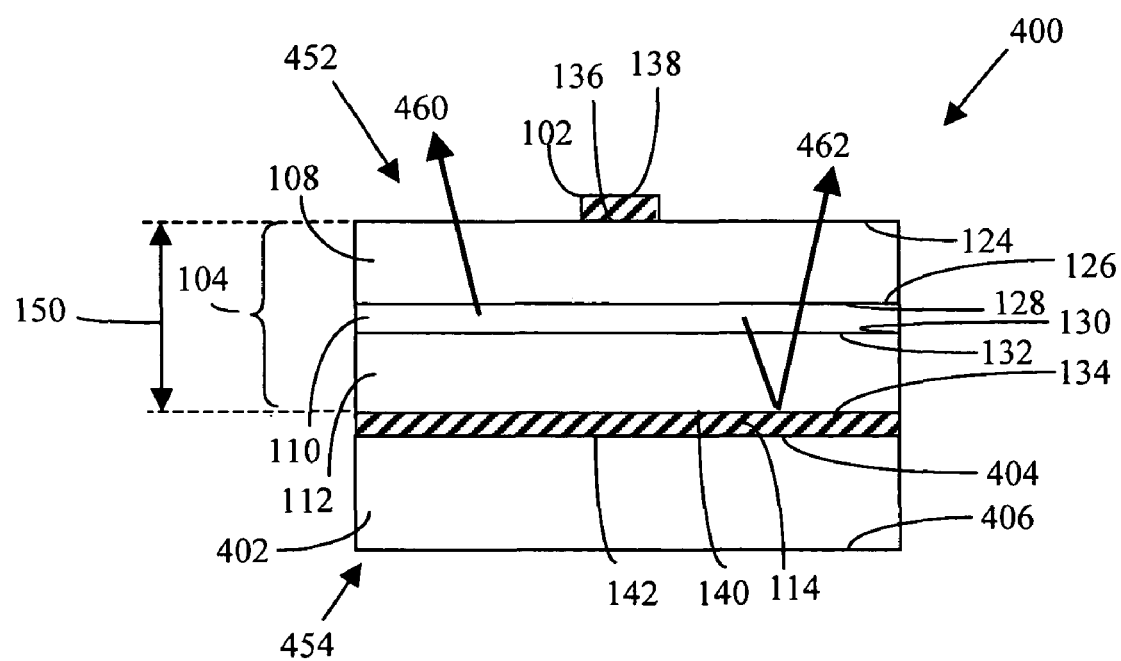

FIGS. 4A and 4B are illustrations of a conventional LED chip 400 that has a top electrode, a bottom electrode and includes a transfer substrate. FIG. 4A is a top plan view of the chip. FIG. 4B is a side cross-sectional view along the I-I plane illustrated in FIG. 4A. The multilayer semiconductor structure of LED chip 400 is inverted relative to the LED chip 100 structure. However, LED chip 400 has one electrode, in this case the n-electrode or first electrode 102, on the "top" side of the device and the other electrode, the p-electrode or the second electrode 114, on the "bottom" side of the device. In a similar manner as the LED chip 300 design, the LED chip 400 structure is bonded to a transfer substrate. The transfer substrate 402 includes an electrical connection to the second or p-electrode. The original growth substrate has been removed.

Except for the arrangement of the electrodes, most of the elements of LED chip 400 are the same as for LED chip 300. Conventional LED chip 400 includes a first electrode 102 on the first side 452 of the device, a multilayer semiconductor structure 104, a second electrode 114 on the second side 454 and a transfer substrate 402. The multilayer semiconductor structure 104 includes a first doped layer 108, an active region 110 and a second doped layer 112, which is on the opposite side of the active region 110 from the first doped semiconductor layer 108.

The first electrode 102 is in electrical contact with the first doped layer 108 and the second electrode 114 is in electrical contact with the second doped layer 112. For LED chip 400, the second electrode is a reflecting electrode and covers substantially all of surface 134 of the second doped layer 112. The first electrode and the second electrode may be fabricated from reflecting metals.

The multilayer semiconductor structure 104 of LED chip 400 can be fabricated from GaN-based semiconductor materials containing GaN, AlN, AlGaN, InN, InGaN and/or AlInGaN. Alternatively, the multilayer semiconductor structure can be fabricated from any appropriate light-emitting semiconductor material.

The active region 110 of the multilayer semiconductor structure 104 is a p-n homojunction, a p-n heterojunction, a single quantum well or a multiple quantum well of the appropriate semiconductor material for the LED chip 400.

For purposes of illustration, LED chip 400 is assumed to be a GaN-based LED. The important fabrication steps for this GaN-based, illustrative example will be briefly summarized. Many of the fabrication steps are identical to the steps for LED chip 100, LED chip 200 and LED chip 300 and will not be repeated.

First a multilayer semiconductor structure 104 of LED chip 400 is fabricated on a sapphire growth substrate (not shown) using the same methods that are described above for LED 100. The multilayer semiconductor structure includes a first doped layer 108 that is n-doped GaN, an active region 110 that is a GaN-based multiple quantum well structure and a second doped layer 112 that is p-doped GaN.

The second electrode 114 is fabricated from aluminum. An aluminum layer is deposited on the second surface 134 of the second doped layer. The first surface 140 of the second electrode is in electrical contact with the second surface 134 of the second doped layer. Surface 140 of the second electrode also forms the back reflector for LED chip 400.

A transfer substrate 402, and in particular surface 404 of the transfer substrate, is bonded to surface 142 of the second electrode. The transfer substrate is usually chosen to have good thermal conductivity and a thermal expansion coefficient that is similar to GaN. The transfer substrate may be any solid material such as a metal composite that is chosen for its thermal expansion properties or a ceramic material. The transfer substrate 402 is also either an electrical conductor or includes and electrical interconnect to the second electrode.

After the transfer substrate is attached, the growth substrate is removed by standard processing steps, exposing the first surface 124 of the first doped layer. For example, the growth substrate can be removed by a laser liftoff process, a chemical process or by mechanical polishing.

The first electrode 102 is fabricated from aluminum. An aluminum layer is deposited on the previously exposed first surface 124 of the first doped layer. The aluminum layer is patterned by standard photolithographic techniques to form the first electrode 102. The first surface 136 of the first electrode is in electrical contact with the first surface 124 of the first doped layer. The first electrode 102 partially covers surface 124 of the first doped layer.

In summary, LED chip 400 has a first electrode 102, a multilayer semiconductor structure 104 that includes first-doped, active and second-doped layers, a transfer substrate 402 and a second electrode 114. LED chip 400 has a first side 452 and a second side 454. The first side 452 is substantially adjacent to the first doped layer 108. The second side 454 is substantially adjacent to the second doped layer 112. The active region 110 emits internally generated light in a first wavelength range when a current is applied through the first electrode 102 and the second electrode 114. The light is emitted from the first side 452 of the LED.

The total thickness 150 of the multilayer semiconductor structure 104 for LED chip 400 is less than 5 microns. In this illustrative example, the thickness of the first doped layer (the n-doped layer) is approximately 3 microns, the thickness of the active region (a multi-quantum well structure) is approximately 0.5 microns and the thickness of the second doped layer (the p-doped layer) is approximately 0.5 microns, resulting in a total thickness of 4 microns. In this example, all the semiconductor layers are grown by MOCVD.

Example light rays 460 and 462 illustrate internally generated light that is emitted by the active region 110 of the LED. Internally generated light ray 460 is emitted by active region 110 toward the first surface 124 of the first doped layer. Surface 124 is also the output surface of LED 400. Internally generated light ray 460 is directed at an angle to surface 124 that is less than the critical angle, which allows light ray 460 to exit the LED chip through surface 124.

Internally generated light ray 462 is emitted by active region 110 toward the second electrode 114 of the LED. Internally generated light ray 462 is reflected by the surface 140 of the second electrode and is directed to the output surface 124 at an angle less than the critical angle. Internally generated light ray 462 exits the LED chip through surface 124.

When utilized as in a light source, LED chip 400 may also include a submount or heatsink (neither are shown) that acts as a heat transfer element to remove heat generated by the device during operation.

The heat flow from the multilayer semiconductor structure of LED chip 400 is illustrated schematically in FIG. 4B. Heat flows from the multilayer semiconductor structure to the transfer substrate with thermal resistance 482, then from the transfer substrate to the submount or heatsink with thermal resistance 484 and finally from the submount or heatsink to the ambient 488 with thermal resistance 486. Both the transfer substrate and the submount/heatsink increase the thermal resistance of the device. A solder layer (not shown) that attaches the multilayer semiconductor structure to the transfer substrate will also increase the thermal resistance of the device.

FIGS. 1 to 4 illustrated conventional LED chips that include multilayer semiconductor structures that are less than 5 microns thick and that include either a growth substrate or a transfer substrate.

Non-conventional substrate-free LED chips may also be utilized in embodiments of this invention. Substrate-free LED chips have multilayer semiconductor structures that are at least 10 microns thick and, furthermore, the chips do not include either a growth substrate or a transfer substrate. The multilayer semiconductor structures utilized for the substrate-free LED chips are thick enough so that the LED chips can be handled as free-standing structures without breaking.

For the substrate-free LED chips that are utilized this invention, either the first doped layer or the second doped layer is at least 10 microns thick. Preferably either the first doped layer or the second doped layer is at least 15 microns thick. More preferably, either the first doped layer or the second doped layer is at least 20 microns thick. Most preferably, either the first doped layer or the second doped layer is at least 25 microns thick. Alternatively, both the first doped layer and the second doped layer are each at least 5 microns thick, preferably each of the two layers is at least 10 microns thick and more preferably each of the two layers is at least 15 microns thick.

The total thickness of the multilayer semiconductor structure for the substrate-free LED chips is at least 10 microns thick. Preferably the total thickness of the multilayer semiconductor structure is at least 20 microns thick. More preferably the total thickness of the multilayer semiconductor structure is at least 30 microns thick.

Since thicker semiconductor layers are utilized for the substrate-free LED chip, the optical absorption coefficients for the various layers must be low in order to prevent the absorption of a significant fraction of the internally generated light that is emitted by the active region of the chip. Lower optical absorption within the LED chip will result in higher light extraction from the chip and higher external quantum efficiency.

In some applications, it is also important that the LED chip be highly reflective to any externally incident light that comes from other light sources and is directed at the chip. The optical absorption coefficients for the various semiconductor layers must also be low in this latter case so that any externally incident light that enters the chip will not undergo significant absorption by the semiconductor layers before exiting the chip. Lowering the optical absorption coefficients of the semiconductor layers will increase the reflectivity of the LED chip to externally incident light.

The multilayer semiconductor structure of the LED chip can absorb light and has an absorption coefficient that depends on wavelength. In many cases, the absorption coefficient is not uniform across the different semiconductor layers of the multilayer semiconductor structure. If the different semiconductor layers that make up the multilayer semiconductor structure have different absorption coefficients, the absorption coefficient for the multilayer semiconductor structure is defined in this specification as the thickness-weighted average absorption coefficient. The weighting function is the fractional thickness of each semiconductor layer in the multilayer semiconductor structure. For example, if 100% of the thickness of the multilayer semiconductor structure has a uniform absorption coefficient of 50 per centimeter in the emitting wavelength range, then the thickness-weighted average absorption coefficient is 50 per centimeter. If 50% of the thickness of the multilayer semiconductor structure has an absorption coefficient of 25 per centimeter and 50% of the thickness of the multilayer semiconductor structure has an absorption coefficient of 75 per centimeter, then the thickness-weighted average absorption coefficient is also 50 per centimeter.

In order to improve the light extraction efficiency and external quantum efficiency of an LED chip and to improve the reflectivity of LED chip to externally incident light, the absorption coefficient (i.e. the thickness-weighted average absorption coefficient) of the multilayer semiconductor structure in the emitting wavelength range of the internally generated light should be less than 20 per centimeter. Preferably the absorption coefficient of the multilayer semiconductor structure in the emitting wavelength range of the internally generated light is less than 10 per centimeter. More preferably, the absorption coefficient of the multilayer semiconductor structure in the emitting wavelength range is less than 5 per centimeter. Most preferably, the absorption coefficient of the multilayer semiconductor structure in the emitting wavelength range is less than 2 per centimeter.

Minimizing the absorption coefficient of the multilayer semiconductor structure in the emitting wavelength range of the internally generated light can be accomplished by improving the deposition processes for the different semiconductor layers in order to reduce impurities or defects and to improve the crystalline structure of the layers.

Thick semiconductor layers can be grown by methods including, but not limited to, CVD, MOCVD, VPE, HVPE and MBE. MOCVD is the most common method for conventional GaN-based LEDs but it has relatively slow deposition rates of approximately 0.1 micron per hour. MOCVD deposited layers also have relatively high optical absorption coefficients due to impurities and defects. HVPE has much faster growth rates and is the preferred method for growing GaN layers that are more than 5 microns thick. HVPE can have growth rates of up to 10 microns per hour or more and can produce GaN-based LED layers that have optical absorption coefficients significantly less than 25 per centimeter.

For example, HVPE can be used to epitaxially grow the first doped layer or the second doped layer or both the first and the second doped layers or the entire multilayer semiconductor structure of the LED. HVPE does not have the carbon impurities that can be present in the MOCVD processes normally used in GaN LED fabrication. Alternatively, if MOCVD is used to deposit the semiconductor layers, a higher deposition temperature can be used to reduce carbon impurities and crystalline defects in the layers. MOCVD may optionally be used to grow active regions that are single- or multiple quantum wells. If the active region of the LED chip is a p-n heterojunction, preferably the entire multilayer semiconductor structure is fabricated by HVPE.

A substrate-free LED chip may have two electrodes on one side of the chip, either the "top" side or the "bottom" side. Alternatively, the substrate-free LED chip may have one electrode on the top side of the chip and one electrode on the bottom side of the chip.

The top and bottom electrodes may be optically transparent, semi-transparent, semi-opaque or opaque. The electrodes may be fabricated from metals, metal alloys, high-temperature-fusible conductive materials, semiconductors or transparent conductive oxides (TCOs). Examples of metals include silver, aluminum, gold, nickel, titanium, chromium, platinum, palladium, rhodium, rhenium, ruthenium and tungsten. Preferred metals are silver and aluminum. An example of a high-temperature-fusible material is a conductive silver paste or ink. Examples of TCOs include indium tin oxide (ITO), zinc oxide (ZnO), indium-doped zinc oxide (IZO) or aluminum-doped zinc oxide (AZO). A preferred TCO is aluminum-doped zinc oxide. Preferably the aluminum-doped zinc oxide is fabricated by metal-organic chemical vapor deposition (MOCVD) and preferably the aluminum-doped zinc oxide electrode is greater than 500 nanometers thick. The electrodes may also be omni-directional reflectors that include a dielectric layer, a metal layer and have electrically conducting pathways through the metal layer.

Both electrodes should be highly reflective to internally generated light to prevent excessive light absorption inside the chip. In addition, making the external surfaces of the electrodes highly reflective will result in an LED chip that has higher reflectivity to externally incident light. Preferably the reflectivity of the electrodes is greater than 90 percent to both internally generated light and externally incident light in the emitting wavelength range. More preferably, the reflectivity of the electrodes is greater than 95 percent in the emitting wavelength range. Most preferably, the reflectivity of the electrodes is greater than 98 percent in the emitting wavelength range.

Examples of substrate-free LED chips for this invention that have at least one thick epitaxial layer and that do not have either a growth substrate or a transfer substrate are illustrated in FIGS. 5 to 12. In the first set of examples illustrated in FIGS. 5 to 8, the LED chips each have both electrodes on the top side of the chip. In the second set of examples illustrated in FIGS. 9 to 10, the LED chips each have both electrodes on the bottom side of the chip. In the third set of examples illustrated in FIGS. 11 to 12, the LED chips each have one electrode on the top side of the chip and one electrode on the bottom side of the chip.

Figure 6A:
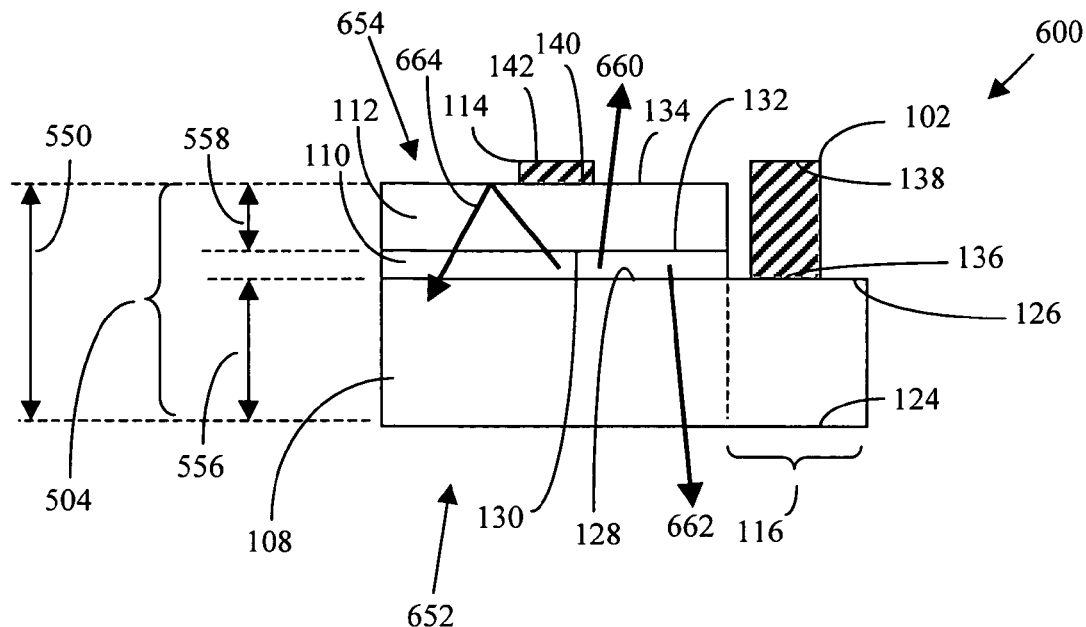
FIGS. 6A and 6B are side cross-sectional views of another substrate-free LED chip that has two top electrodes.
Figure 6B:
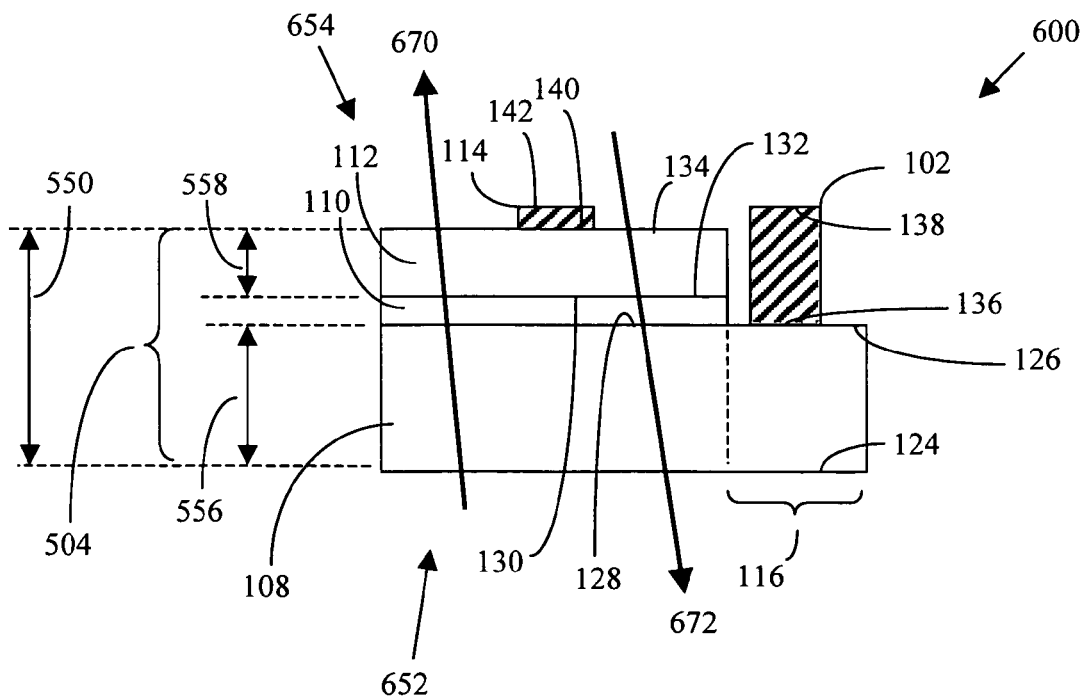
Figure 7:
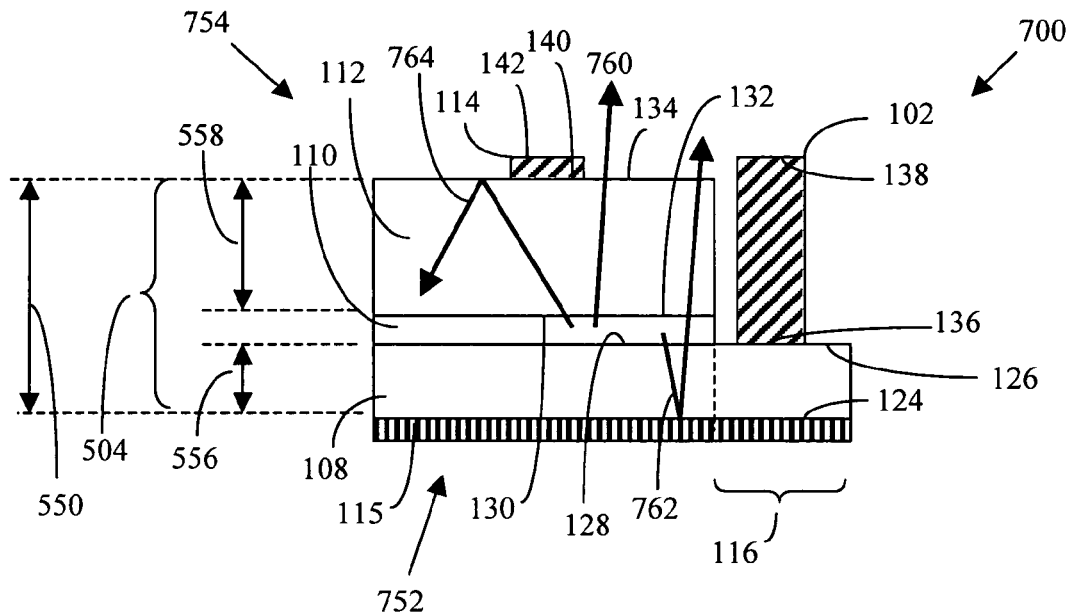
FIG. 7 is a side cross-sectional view of another substrate-free LED chip that has two top electrodes.
Figure 8:
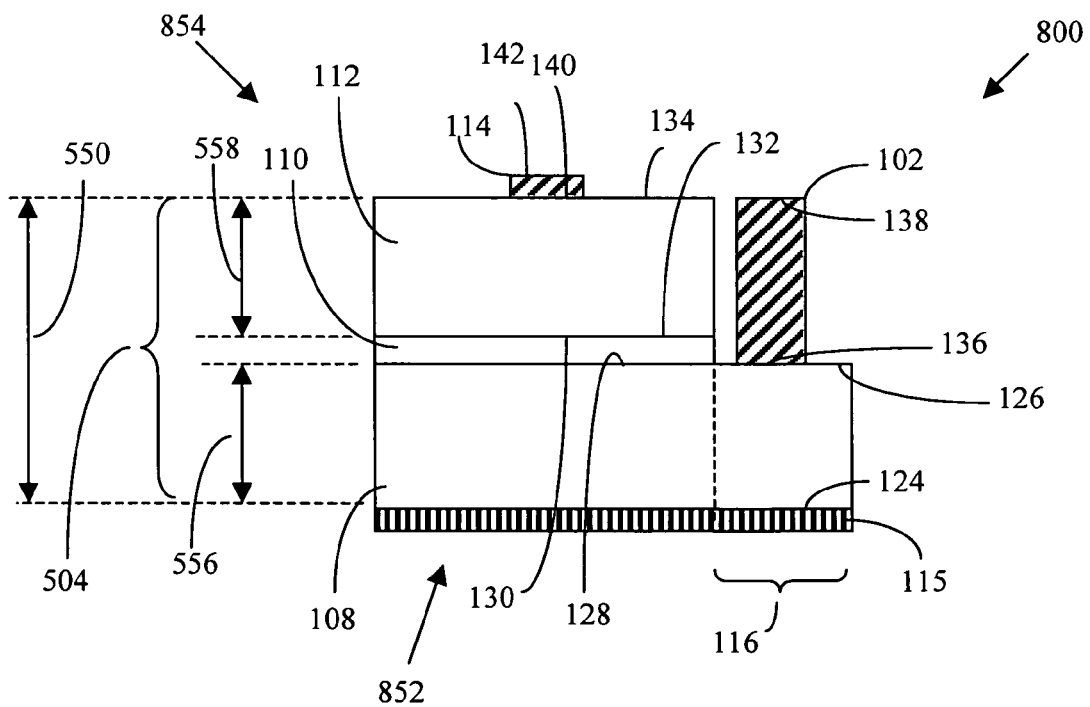
FIG. 8 is a side cross-sectional view of another substrate-free LED chip that has two top electrodes.

FIGS. 5 to 8 illustrate substrate-free LED chips that have both electrodes on the top side. FIGS. 5 to 6 illustrate LED chips having a thick first doped layer. FIG. 7 illustrates an LED chip with a thick second doped layer. FIG. 8 illustrates an LED chip with both a thick first doped layer and a thick second doped layer.

Figure 9:
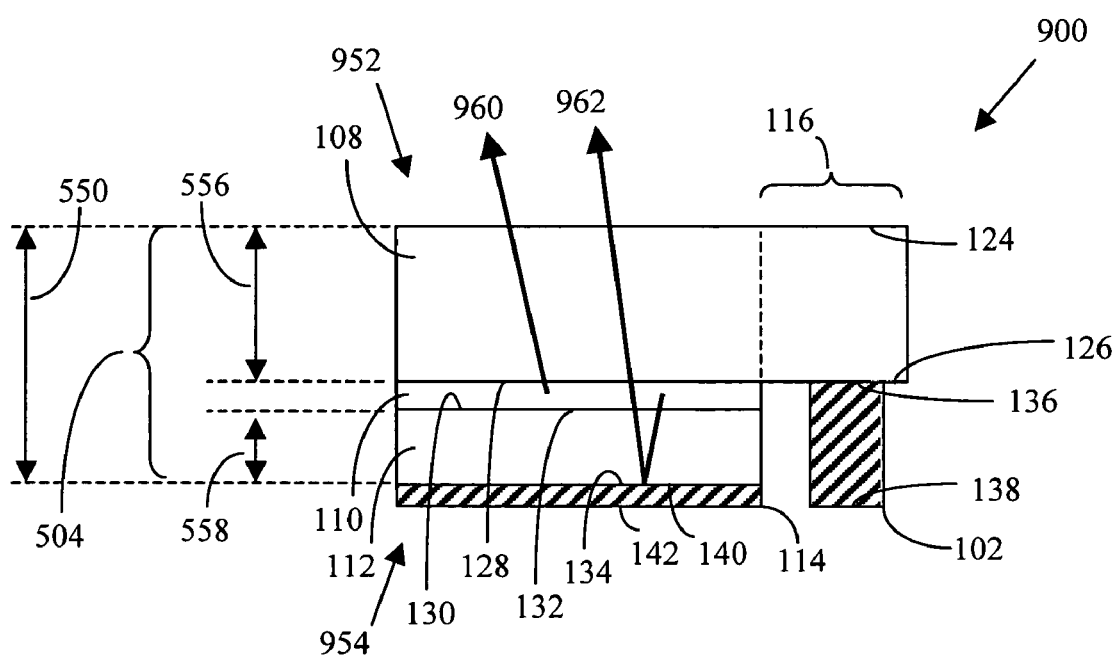
FIG. 9 is a side cross-sectional view of a substrate-free LED chip that has two bottom electrodes.
Figure 10:
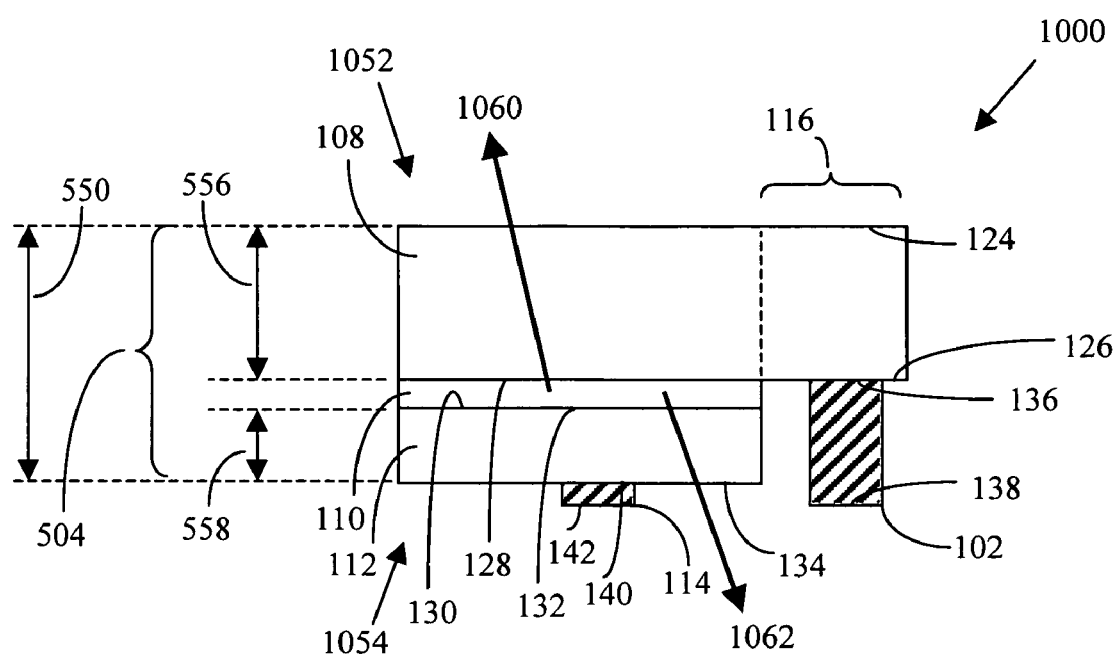
FIG. 10 is a side cross-sectional view of another substrate-free LED chip that has two bottom electrodes.

FIGS. 9 to 10 illustrate substrate-free LED chips that have both electrodes on the bottom side of the chip and that have a thick first doped layer. It will be understood by those skilled in the art that chips that have both electrodes on the bottom side may instead have a thick second doped layer or may have both a thick first doped layer and a thick second doped layer. The latter examples are not illustrated in the figures.

Figure 11A:
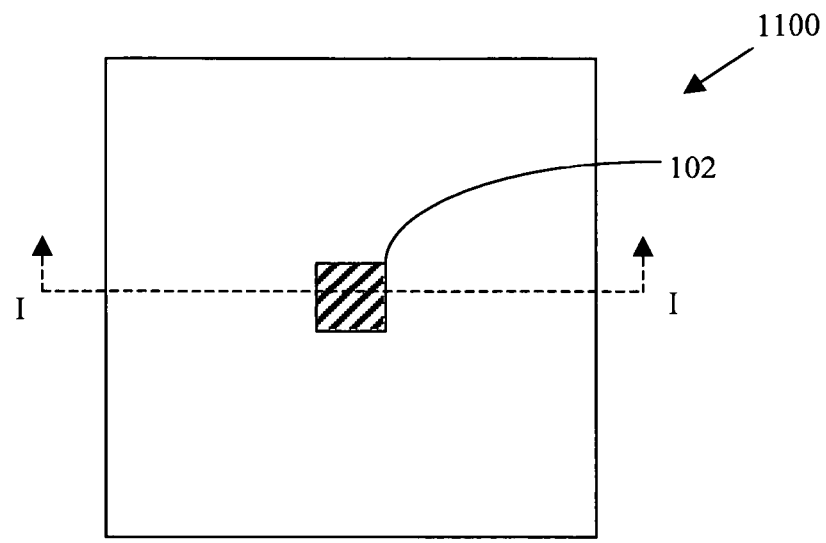
FIGS. 11A and 11B illustrate a substrate-free LED chip that has one top electrode and one bottom electrode.
Figure 11B:
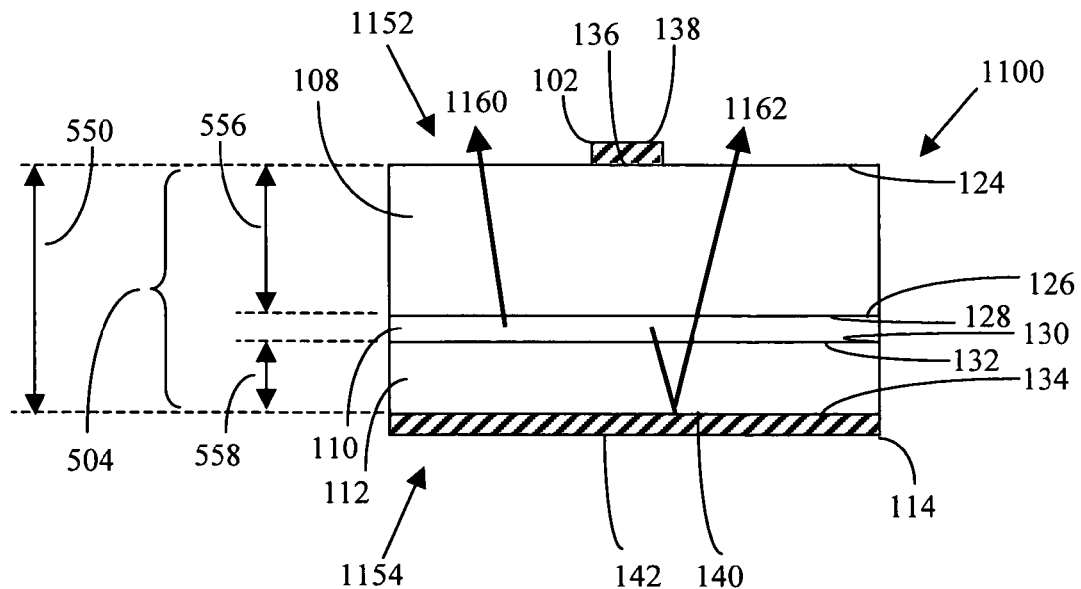

FIGS. 11 to 12 illustrate substrate-free LED chips that have one electrode on the top side of the chip, one electrode on the bottom side of the chip and have a thick first doped layer. It will be understood by those skilled in the art that chips that have one electrode on the top side and one electrode on the bottom side may instead have a thick second doped layer or may have both a thick first doped layer and a thick second doped layer. The latter examples are not illustrated in the figures.

First, examples of substrate-free LED chips that have two electrodes on the top side of the chip are now described. The chips are illustrated in FIGS. 5 to 8. If the bottom electrode or a reflector is opaque and substantially covers the bottom surface of the chip, the substrate-free LED chip will emit light from the top side and not from the bottom side. If the bottom electrode or reflector is opaque and covers only a portion of the bottom side of the chip or if the bottom electrode is transparent or semi-transparent, the chip will emit light from both the top and bottom sides, thereby increasing the extraction efficiency and external quantum efficiency of the chip.

Figure 5A:
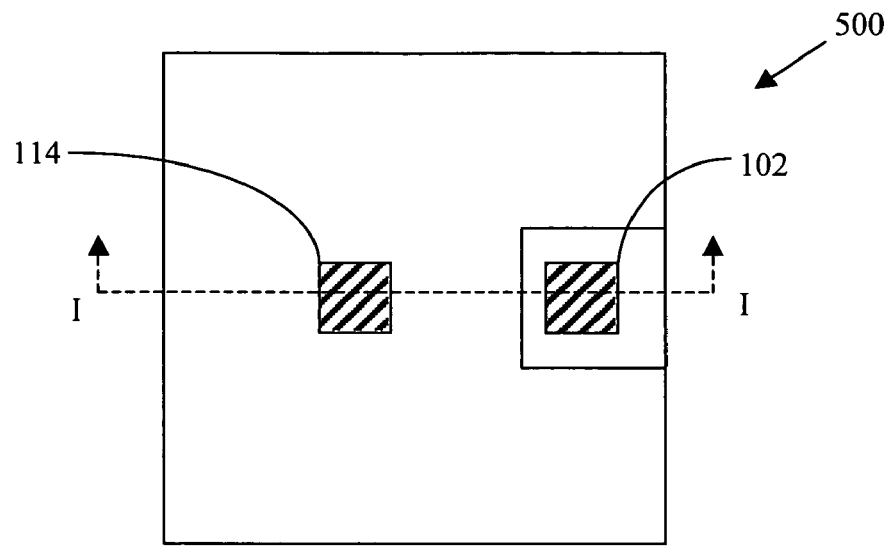
FIGS. 5A, 5B and 5C illustrate a non-conventional substrate-free LED chip that has two top electrodes.
Figure 5B:
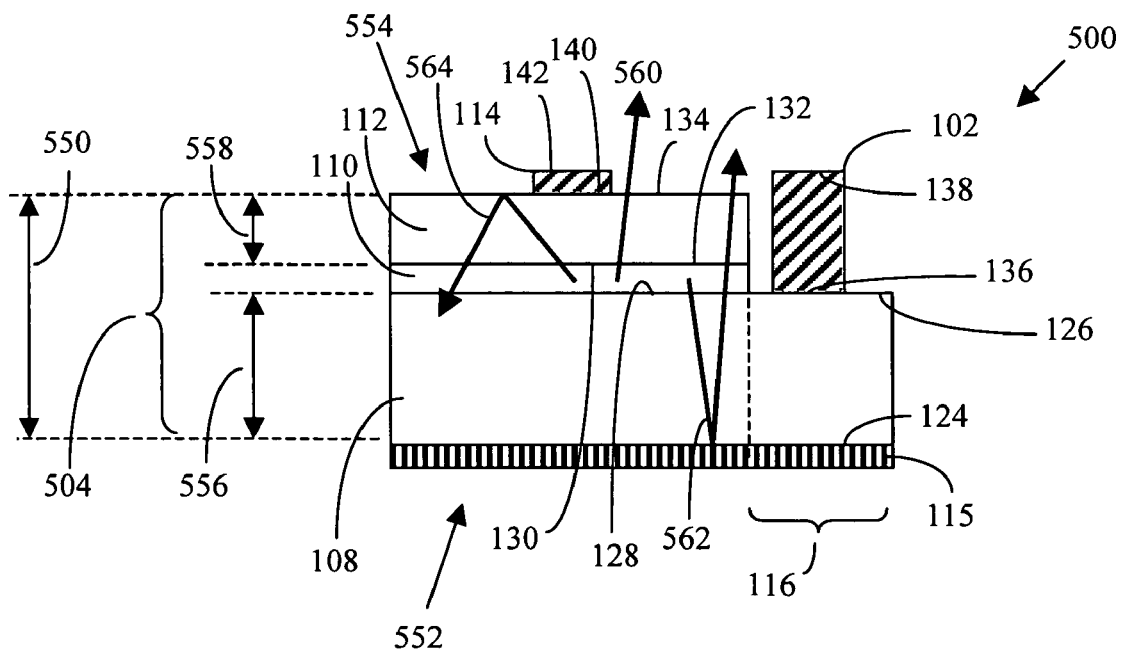
Figure 5C:
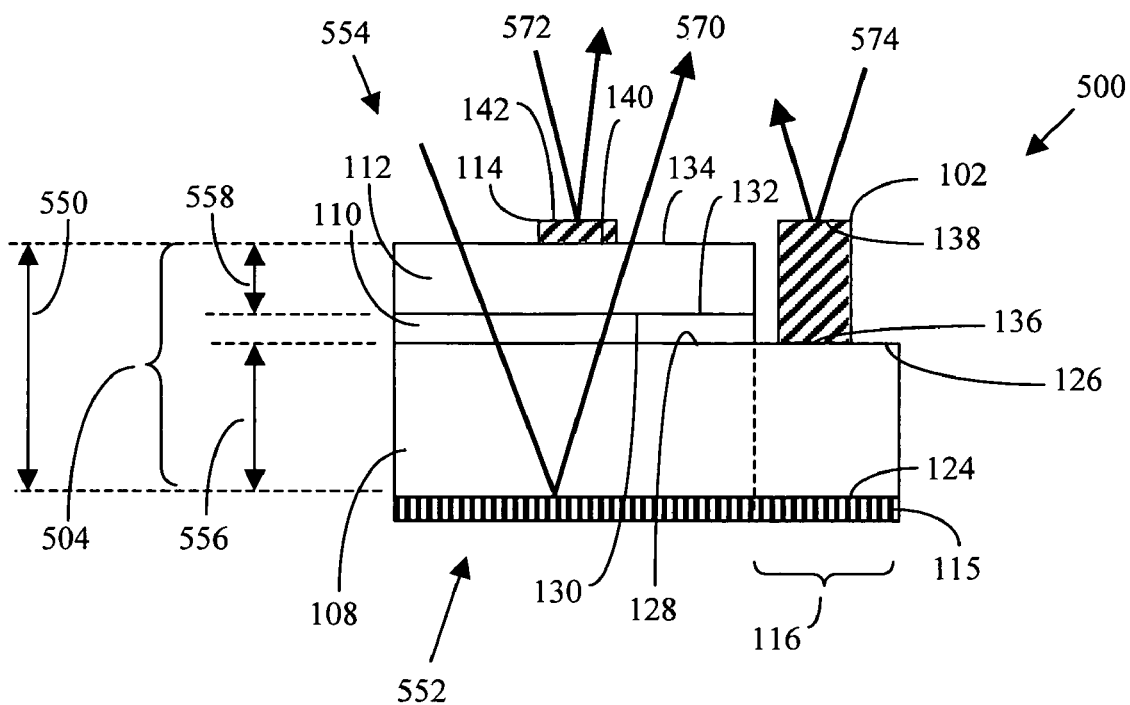

Substrate-free LED chip 500 illustrated in FIGS. 5A, 5B and 5C has both the n-electrode and p-electrode on the "top" surface of the device and has neither a growth substrate nor a transfer substrate. FIG. 5A is a top plan view of the chip. FIGS. 5B and 5C are side cross-sectional views along the I-I plane illustrated in FIG. 5A.

Substrate-free LED chip 500 includes a first electrode 102, a multilayer semiconductor structure 504, a second electrode 114 and a back reflector 115. The multilayer semiconductor structure 504 includes a first doped layer 108, an active region 110 and a second doped layer 112, which is on the opposite side of the active region 110 from the first doped semiconductor layer 108. Consequently, the active region is interposed between the first doped layer and the second doped layer. The active region is in electrical contact with the first doped layer and the second doped layer and the active region emits light in a first wavelength range when a current is applied through the first and second electrodes.

The first electrode 102 is in electrical contact with the first doped layer 108 and the second electrode 114 is in electrical contact with the second doped layer 112. The first electrode 102 and the second electrode 114 may be optically transparent, semi-transparent, semi-opaque or opaque. The electrodes may be fabricated from metals, metal alloys, high-temperature-fusible conductive materials, semiconductors or transparent conductive oxides (TCOs). Examples of metals include silver, aluminum, gold, nickel, titanium, chromium, platinum, palladium, rhodium, rhenium, ruthenium and tungsten. Preferred metals are silver and aluminum. An example of a high-temperature-fusible material is a conductive silver paste or ink. Examples of TCOs include indium tin oxide (ITO), zinc oxide (ZnO), indium-doped zinc oxide (IZO) or aluminum-doped zinc oxide (AZO). A preferred TCO is aluminum-doped zinc oxide. Preferably the aluminum-doped zinc oxide is fabricated by metal-organic chemical vapor deposition (MOCVD) and preferably the aluminum-doped zinc oxide electrode is greater than 500 nanometers thick. The electrodes may also be omni-directional reflectors that include a dielectric layer, a metal layer and have electrically conducting pathways through the metal layer.

The multilayer semiconductor structure 504 of the LED chip 500 can be fabricated from GaN-based semiconductor materials containing GaN, AlN, AlGaN, InN, InGaN and/or AlInGaN. Alternatively, the multilayer semiconductor structure can be fabricated from any appropriate light-emitting semiconductor material.

The active region 110 of the multilayer semiconductor structure 504 is a p-n homojunction, a p-n heterojunction, a single quantum well or a multiple quantum well of the appropriate semiconductor material for the LED.

For purposes of illustration, substrate-free LED chip 500 is assumed to be a GaN-based LED chip. The important fabrication steps for this GaN-based, illustrative example will be briefly summarized.

First a multilayer semiconductor structure 504 is fabricated on a sapphire growth substrate (not shown). The multilayer semiconductor structure includes a first doped layer 108, an active region 110 and a second doped layer 112.

The first doped layer 108 is an n-doped GaN layer, which is epitaxially deposited or otherwise conventionally fabricated on a growth substrate. The first doped layer 108 has a first surface 124 and a second surface 126 opposite the first surface. The first doped layer is at least 10 microns thick. Preferably the first doped layer is at least 15 microns thick. More preferably, the first doped layer is at least 20 microns thick. Most preferably, the first doped layer is at least 25 microns thick. The first doped layer may be deposited by any standard GaN growth technique. Preferably, the first doped layer is deposited by HYPE.

The active region 110 is a GaN-based multiple quantum well structure, which is epitaxially deposited or otherwise conventionally fabricated on the second surface 126 of the first doped layer 108. The active region 110 has a first surface 128 and a second surface 130 opposite the first surface. The first surface 128 of the active region is in electrical contact with the second surface 126 of the first doped layer.

The second doped layer 112 is a p-doped GaN layer, which is epitaxially deposited or otherwise conventionally fabricated on the second surface 130 of the active region 110. The second doped layer has a first surface 132 and a second surface 134 opposite the first surface. The first surface 132 of the second doped layer is in electrical contact with the second surface 130 of the active region.

A portion 116 of the second doped layer 112 and the active region 110 is removed to expose a portion 116 of the second surface 126 of the first doped layer. The first electrode 102 and the second electrode 114 are fabricated from aluminum. An aluminum layer is deposited on the second surface 134 of the second doped layer and the exposed portion 116 of the second surface 126 of the first doped layer. The aluminum layer is patterned by standard photolithographic techniques to form the first electrode 102 and the second electrode 114. First electrode 102 has a first surface 136 and a second surface 138.

The first surface 136 of the first electrode is in electrical contact with the second surface 126 of the first doped layer. Second electrode 114 has a first surface 140 and a second surface 142. First surface 140 of the second electrode is in electrical contact with the second surface 134 of the second doped layer.

The first electrode 102 only partially covers the exposed portion 116 of the second surface 126 of the first doped layer. The second electrode 114 only partially covers the second surface 134 of the second doped layer. The remaining portion of the exposed portion 116 of the second surface 126 of the first doped layer and the second surface 134 of the second doped layer are an output or exit surface for the light emitted by the LED chip 500.

To form a substrate-free LED chip, the growth substrate is removed by any conventional process including laser liftoff, chemical processes and mechanical polishing. Removing the growth substrate exposes first surface 124 of the first doped layer.

To form a back reflector 115, a layer of silver is deposited on the first surface 124 of the first doped layer. Optionally, the back reflector may also be an omni-directional reflector that includes a dielectric layer (not shown) and a metal layer.

In summary, substrate-free LED chip 500 has a first electrode 102, a multilayer semiconductor structure 504 that includes first-doped, active and second-doped layers and a second electrode 114. LED chip 500 has neither a growth substrate nor a transfer substrate. LED chip 500 has a first side 552 and a second side 554. The first side 552 is substantially adjacent to the first doped layer 108. The second side 554 is substantially adjacent to the second doped layer 112. The active region 110 emits internally generated light in a first wavelength range when a current is applied through the first electrode 102 and the second electrode 114. The light is emitted from the second side 554 of the LED.

The total thickness 550 of the multilayer semiconductor structure 504 for LED chip 500 is at least 10 microns. Preferably the total thickness 550 of the multilayer semiconductor structure is 20 microns. More preferably, the total thickness 550 of the multilayer semiconductor structure is 30 microns. As an illustrative example, the thickness of the first doped layer (the n-doped layer) is approximately 20 microns, the thickness of the active region (a multi-quantum well structure) is approximately 0.5 microns and the thickness of the second doped layer (the p-doped layer) is approximately 0.5 microns, resulting in a total thickness of 21 microns. In this example, the first doped layer is grown by HYPE and the remainder of the semiconductor layers is grown by MOCVD.

Example light rays 560, 562 and 564 illustrate internally generated light that is emitted by the active region 110 of the LED. Internally generated light ray 560 is emitted by active region 110 toward output surface 134 of the LED chip. Internally generated light ray 560 is directed at an angle to surface 134 that is less than the critical angle, which allows light ray 560 to exit the LED chip through surface 134.

Internally generated light ray 562 is emitted by active region 110 toward the rear reflector 115 of the LED. Internally generated light ray 562 is reflected by reflector 115 and directed to the output surface 134 at an angle less than the critical angle. Internally generated light ray 562 exits the LED chip through surface 134.

Internally generated light ray 564 is directed to surface 134 at an angle that is greater than the critical angle. Internally generated light ray 564 is reflected by total internal reflection and is redirected toward the rear reflector 115 of the LED chip.

Substantially all of the first side 552 of LED 500 is covered by lower reflector 115. Due to the reflectivity of reflector 115, the reflectivity of surface 138 of first electrode 102 and the reflectivity of surface 142 of second electrode 114, substrate-free LED chip 500 can reflect externally incident light. Externally incident light is light that is directed to the light emitting side of the LED from another light source or light that is emitted by the LED and is reflected back to the light emitting side of the LED as recycled light. For some applications, for example applications utilizing light recycling to increase the effective brightness of the LED, it is important that the LED have high reflectivity to externally incident light. High reflectivity to externally incident light will exist if the reflecting layers of the LED have high reflectivity (e.g. greater than 70%) and if the absorption coefficient of the multilayer semiconductor structure is low (e.g. less than 20 per centimeter). Preferably LED 500 reflects at least 60 percent of externally incident light directed to the light emitting side (second side 554) of the LED. More preferably, LED 500 reflects at least 70 percent of externally incident light. Most preferably, LED 500 reflects at least 80 of externally incident light.

Example light rays 570, 572 and 574 in FIG. 5C illustrate externally incident light that is incident on the light emitting side or second side 554 of LED chip 500 and is reflected by the chip. Externally incident light ray 570 is incident on surface 134 of the LED chip. Externally incident light ray 570 passes through surface 134, passes through the multilayer semiconductor structure 504 a first time, is reflected by reflector 115, passes through the multilayer semiconductor structure 504 a second time and exits LED chip 500 through surface 134. Externally incident light ray 572 is directed to LED chip 500 and is reflected by surface 142 of the second electrode 114. Externally incident light 574 is directed to LED chip 500 and is reflected by surface 138 of the first electrode 102.

In the illustrative example in FIG. 5, the first doped semiconductor layer 108 is an n-doped layer and the second doped semiconductor layer 112 is a p-doped layer. However, the two layers can in principle be reversed. If the first doped semiconductor layer 108 is a p-doped layer, then the second doped semiconductor layer 112 is an n-doped layer. The two doped semiconductor layers 108 and 112 will have opposite n and p conductivity types.

It is well known by those skilled in the art that the multilayer semiconductor structure 504 may include additional layers in order to adjust and improve the operation of the LED chip 500. For example, a current spreading layer may be inserted between surface 136 of the first electrode 102 and surface 126 the first doped layer 108. Such a current spreading layer will have the same conductivity type as the first doped layer and will improve the uniformity of current injection across the entire active region. In addition, a current spreading layer may be inserted between surface 134 of the second doped layer and surface 140 of the second electrode 114. The latter current spreading layer will have the same conductivity type as the second doped layer. As another example, an electron blocking layer or a hole blocking layer may inserted either between surface 126 of the first doped layer 108 and surface 128 of the active region 110 or between surface 130 of the active region 110 and surface 132 of the second doped layer 112. An electron blocking layer reduces the escape of electrons from the active region. A hole blocking layer reduces the transfer of holes through the layer.

The substrate-free LED chips of this invention, including LED chip 500, preferably include light extraction elements (not shown) to aid in extracting internally generated light from the chips. The light extraction elements may be fabricated by any means, including chemical means, mechanical means such as grinding, or optical means such as laser ablation.

Figure 4C:
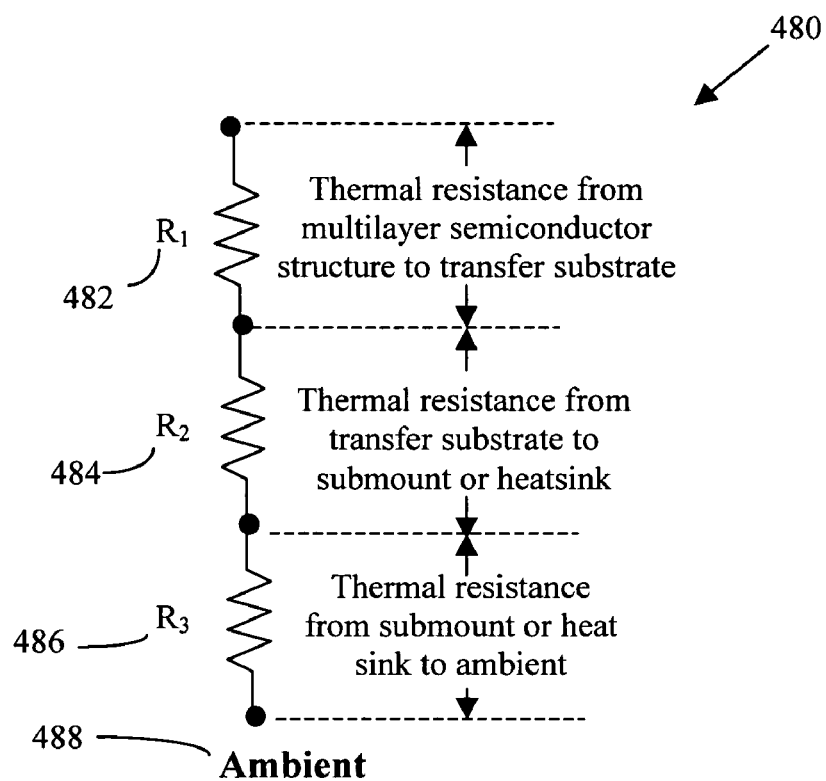
FIG. 4C is a heat flow diagram of the conventional LED chip illustrated in FIGS. 4A and 4B.
Figure 5D:
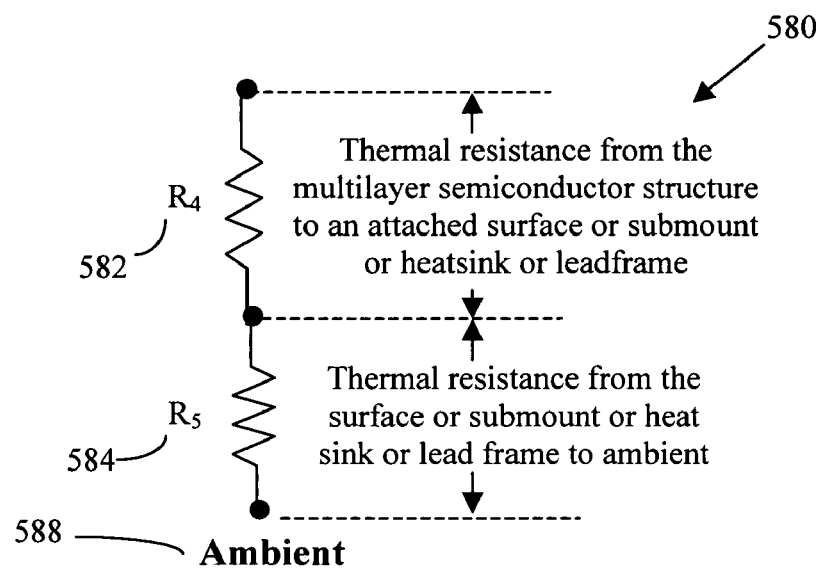
FIG. 5D is a heat flow diagram for a substrate-free LED.

Substrate-free LED chip 500 does not have a growth substrate or a transfer substrate that can retard heat flow from the chip. If LED chip 500 is bonded to a surface, a submount, a heat sink or a leadframe, the thermal resistance for heat transfer is illustrated in FIG. 5D. Heat will flow from the LED chip to the surface, submount, heat sink or leadframe with thermal resistance $R_4$ or 582. Heat will flow from the surface, submount, heat sink or leadframe to ambient with thermal resistance $R_5$ or 584. The total thermal resistance, $R_4$ plus $R_5$ or, equivalently, the sum of the thermal resistances 582 and 584 of the substrate-free LED chip 500 will be less than for an LED chip such as LED chip 400 that includes a transfer substrate. For LED chip 400, the total thermal resistance illustrated in FIG. 4C is $R_1$ plus $R_2$ plus $R_3$ or, equivalently, the sum of the thermal resistances 482, 484 and 486.

FIGS. 6 to 8 illustrate substrate-free LED chips that are variations of LED chip 500 shown in FIG. 5.

Substrate-free LED chip 600 in FIGS. 6A and 6B is nearly identical to LED chip 500 except that LED chip 600 does not have a reflector on the first side 652. Internally generated light emitted by the active region 110 can exit from both the top or second side 654 and the bottom or first side 652. For example, light ray 660 illustrated in FIG. 6A and emitted by the active region exits LED chip 600 through surface 134 on the second side. Light ray 662 exits LED chip 600 through surface 124 on the first side. Light ray 664 undergoes total internal reflection at surface 134.

No portion of the first side 652 of LED 600 is covered by a reflecting layer. Only a portion of the second side 654 of LED 600 is covered by the first electrode and the second electrode. Both sides of the multilayer semiconductor structure are light emitting sides and will emit internally generated light. At least a portion of the first side of the multilayer semiconductor structure and at least a portion of the second side of the multilayer semiconductor structure will also transmit externally incident light. Externally incident light is light that is directed to a light emitting side of the LED from another light source or light that is emitted by an LED and is reflected back to the light emitting side of the LED as recycled light. For some applications, where it is desirable for light from a phosphor or light from another LED to pass through the LED, the LED should transmit a large portion of externally incident light. High transmissivity will exist if the absorption coefficient of the multilayer semiconductor structure is low (e.g. less than 20 per centimeter). Preferably LED 600 transmits at least 60 percent of externally incident light directed to a light emitting side (either the first side 652 or the second side 654) of the LED. More preferably, LED 600 transmits at least 70 percent of externally incident light. Most preferably, LED 600 transmits at least 80 of externally incident light.

FIG. 6B illustrates externally incident light rays 670 and 672 that are transmitted by LED chip 600. Externally incident light ray 670 is incident on surface 124 of the first side 652 of LED 600. Externally incident light ray 670 passes through the multilayer semiconductor structure 504 and exits LED chip 600 through surface 134 on the second side 654. Externally incident light ray 672 is incident on surface 134 of the second side 654 of LED 600. Externally incident light ray 672 passes through the multilayer semiconductor structure 504 and exits LED chip 600 through surface 124 on the first side 652.

In substrate-free LED chip 600, the thick epitaxial layer is the first doped layer 108. Alternatively, the second doped layer may be a thick epitaxial layer.

LED chip 700 in FIG. 7 illustrates a substrate-free LED chip that has a thick second doped layer 112. The second doped layer 112 is a p-doped GaN layer, which is epitaxially deposited or otherwise conventionally fabricated on the active region. The second doped layer 112 has a first surface 132 and a second surface 134 opposite the first surface. The first surface 132 of the second doped layer is in electrical contact with the second surface 130 of the active region. The second doped layer is at least 10 microns thick. Preferably the second doped layer is at least 15 microns thick. More preferably, the second doped layer is at least 20 microns thick. Most preferably, the second doped layer is at least 25 microns thick. The second doped layer may be deposited by any standard GaN growth technique. Preferably, the second doped layer is deposited by HVPE. For The first doped layer 108 and the active region 110 may be deposited by any standard GaN growth technique. In this illustrative example, the first doped layer and the active region are deposited by MOCVD.

Example light rays 760, 762 and 764 illustrate internally generated light that is emitted by the active region 110 of the LED chip 700. Internally generated light ray 760 is emitted by active region 110 toward output surface 134 of the LED chip. Internally generated light ray 760 is directed at an angle to surface 134 that is less than the critical angle, which allows light ray 760 to exit the LED chip through surface 134.

Internally generated light ray 762 is emitted by active region 110 toward the lower reflector 115 of the LED. Internally generated light ray 762 is reflected by reflector 115 and directed to the output surface 134 at an angle less than the critical angle. Internally generated light ray 762 exits the LED chip through surface 134.

Internally generated light ray 764 is directed to surface 134 at an angle that is greater than the critical angle. Internally generated light ray 764 is reflected by total internal reflection and is redirected toward the rear reflector 115 of the LED chip.

FIG. 8 illustrates a side cross-sectional view of a substrate-free LED chip 800 that has both a thick first doped layer and a thick second doped layer. In this illustrative example, the thick first doped layer 108 is an n-doped layer and the thick second doped layer 112 is a p-doped layer. The first doped layer and the second doped layer are each at least 5 microns thick. Preferably the first doped layer and the second doped layer are each at least 10 microns thick. More preferably, the first doped layer and the second doped layer are each at least 15 microns thick. Most preferably, the first doped layer and the second doped layer are each at least 20 microns thick. The first doped layer and the second doped layer may have the same thickness or have different thicknesses. In this illustrative example, the first doped layer is 20 microns thick and the second doped layer is 5 microns thick. The first doped layer and the second doped layer may be deposited by any standard GaN growth technique. In this illustrative example, the first doped layer and the second doped layer are deposited by HYPE. For LED chip 800, the active region 110 may be deposited by any standard GaN growth technique. In this illustrative example, the active region is deposited by MOCVD.

For the remainder of this specification, the substrate-free LED chips will be illustrated as having a thick first doped layer. However, it will be apparent from the above discussion that any of the non-conventional chips illustrated in the following diagrams may instead have a thick second doped layer or may have both a thick first doped layer and a thick second doped layer.

FIGS. 9 and 10 illustrate substrate-free LED chips that have both electrodes on the "bottom" side of the chip. LED chip 900 and LED chip 1000 are flip-chip designs, but neither design includes a growth substrate or a transfer substrate. The thick doped layer in FIGS. 9 and 10 is illustrated to be the first doped layer. However, the thick doped layer could also be the second doped layer or both the first doped layer and the second doped layer.

LED chip 900 in FIG. 9 includes a thick first doped layer 108. In this example design, the first doped layer is on the top or first side 952 of the chip. The first doped layer 108 is an n-doped GaN layer, which is epitaxially deposited or otherwise conventionally fabricated on a growth substrate (not shown). The growth substrate is later removed by a standard technique such as laser liftoff, chemical processing or mechanical polishing, thereby exposing the first surface 124 of the first doped layer. The first doped layer 108 has a first surface 124 and a second surface 126 opposite the first surface. The first doped layer is at least 10 microns thick. Preferably the first doped layer is at least 15 microns thick. More preferably, the first doped layer is at least 20 microns thick. Most preferably, the first doped layer is at least 25 microns thick. The first doped layer may be deposited by any standard GaN growth technique. Preferably, the first doped layer is deposited by HYPE.

The first electrode 102 of LED chip 900 is fabricated on a portion 116 of the second surface 126 of the first doped layer that was previously exposed by an etching process. The second electrode 114 is fabricated on the second surface 134 of the second doped layer. The second electrode substantially covers the second surface 134. Substantially all of the light emitted by LED chip 900 is emitted through the top or first side 952 of the chip. For example, light ray 960 is emitted through surface 124. Light ray 962 is initially directed to the second side 954 but is reflected by surface 140 of the second electrode. Light ray 962 exits LED 900 through the top or first side 952.

FIG. 10 illustrates example substrate-free LED chip 1000. LED chip 1000 is nearly identical to LED chip 900 except that the second electrode 114 of LED chip 1000 covers only a portion of surface 134 of the second doped layer 112. Second electrode 114 is fabricated by depositing a layer of metal on surface 134 of the second doped layer followed by patterning the metal layer by standard photolithographic techniques. Light can exit LED chip 1000 through both the top or first side 1052 and the bottom or second side 1054 of the chip, thereby increasing the extraction efficiency and the external quantum efficiency of the chip. For example, internally generated light ray 1060 exits LED chip 1000 on the top or first side 1052 of the chip. Light ray 1062 exits LED chip 1000 on the bottom or second side 1054.

FIGS. 11 and 12 illustrate substrate-free LED chips that have one electrode on the "top" side of the chip and one electrode on the "bottom" side of the chip. The thick doped layer in FIGS. 11 and 12 is illustrated to be the first doped layer. However, the thick doped layer could also be the second doped layer or both the first doped layer and the second doped layer.

LED chip 1100 in FIG. 11 includes a thick first doped layer 108. In this example design, the first doped layer is on the top or first side 1152 of the chip. The first doped layer 108 is an n-doped GaN layer, which is epitaxially deposited or otherwise conventionally fabricated on a growth substrate (not shown). The growth substrate is later removed by a standard technique such as laser liftoff, chemical processing or mechanical polishing, thereby exposing the first surface 124 of the first doped layer. The first doped layer is at least 10 microns thick. Preferably the first doped layer is at least 15 microns thick. More preferably, the first doped layer is at least 20 microns thick. Most preferably, the first doped layer is at least 25 microns thick. The first doped layer may be deposited by any standard GaN growth technique. Preferably, the first doped layer is deposited by HVPE.

The first electrode 102 and the second electrode 114 may be optically transparent, semi-transparent, semi-opaque or opaque. The electrodes may be fabricated from, for example, metals, metal alloys, high-temperature-fusible conductive materials, semiconductors or transparent conductive oxides (TCOs). Examples of metals include silver, aluminum, gold, nickel, titanium, chromium, platinum, palladium, rhodium, rhenium, ruthenium and tungsten. Preferred metals are silver and aluminum. An example of a high-temperature-fusible material is a conductive silver paste or ink. Examples of transparent conductive oxides include indium tin oxide (ITO), zinc oxide, indium-doped zinc oxide or aluminum-doped zinc oxide. A preferred transparent conductive oxides is aluminum-doped zinc oxide. Preferably the aluminum-doped zinc oxide is fabricated by metal-organic chemical vapor deposition (MOCVD) and preferably the aluminum-doped zinc oxide electrode is greater than 500 nanometers thick. The electrodes may also be omni-directional reflectors that include a dielectric layer, a metal layer and have electrically conducting pathways through the metal layer.

The first electrode 102 of LED chip 1100 is fabricated on the first surface 124 of the first doped layer. The first surface 124 was previously exposed by removing the growth substrate. In this illustrative example, the first electrode is fabricated by depositing a metal layer and patterning the layer using standard photolithographic techniques. The second electrode 114 is fabricated on the second surface 134 of the second doped layer. The second electrode substantially covers the second surface 134. Substantially all of the light emitted by LED chip 1100 is emitted through the top or first side 1152 of the chip. For example, light ray 1160 is emitted through surface 124. Light ray 1162 is initially directed to the second side 1154 but is reflected by surface 140 of the second electrode. Light ray 1162 exits LED 1100 through the top or first side 1152.

Figure 12A:
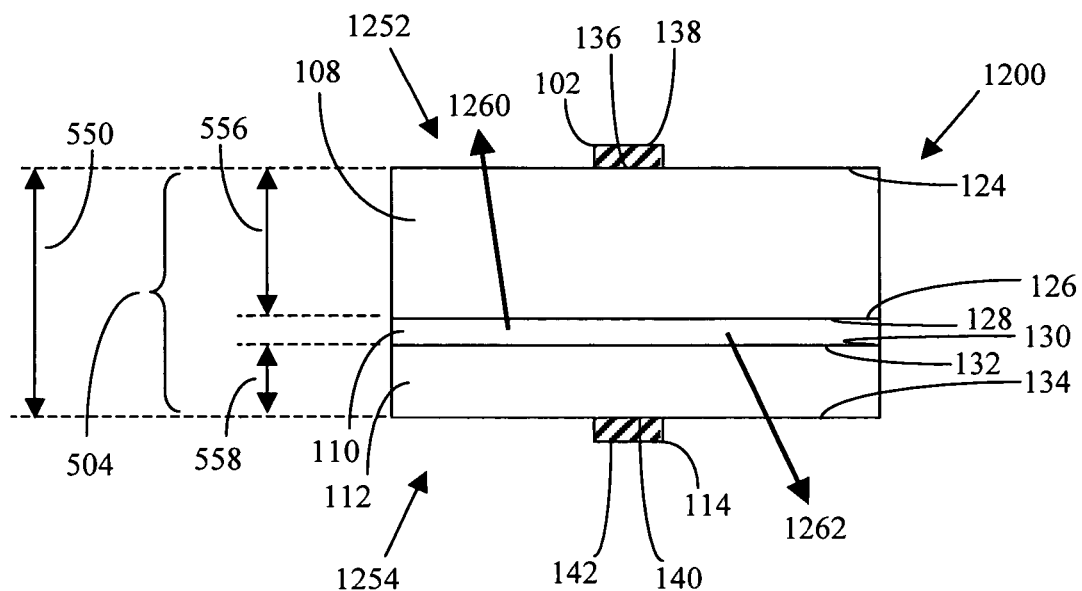
FIG. 12A is a side cross-sectional view of another substrate-free LED chip that has one top electrode and one bottom electrode.

One embodiment of substrate-free LED chip 1200 illustrated in FIG. 12A is nearly identical to LED chip 1100 except that the second electrode 114 for LED chip 1200 covers only a portion of the second surface 134 of the second doped layer 112. Second electrode 114 is fabricated by depositing a layer of metal on surface 134 of the second doped layer followed by patterning the metal layer by standard photolithographic techniques. Light can exit LED chip 1200 through both the top or first side 1252 and the bottom or second side 1254 of the chip, thereby increasing the extraction efficiency and the external quantum efficiency of the chip. For example, internally generated light ray 1260 exits LED chip 1200 on the top or first side 1252 of the chip. Light ray 1262 exits LED chip 1200 on the bottom or second side 1254.

Figure 12B:
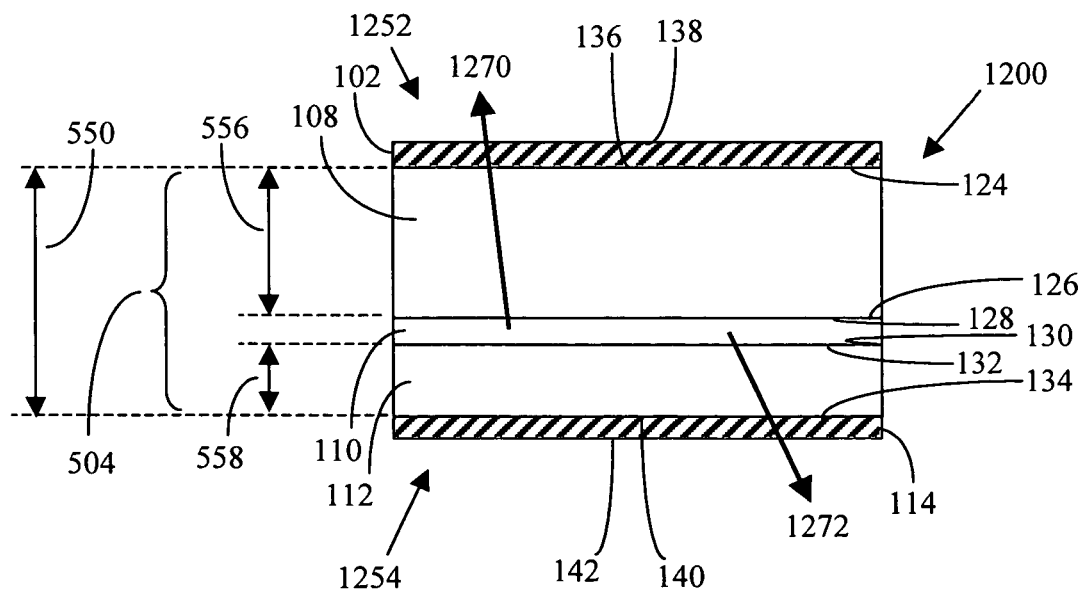
FIG. 12B is a side cross-sectional view of a substrate-free LED chip that has a transparent top electrode and a transparent bottom electrode.

Another embodiment of substrate-free LED chip 1200 is shown in FIG. 12B. In FIG. 12B, both the first electrode 102 and the second electrode 114 are transparent electrodes. Electrode 102 covers substantially all of surface 124 of the first doped layer 108. Electrode 114 covers substantially all of surface 134 of the second doped layer 112. Electrodes 102 and 114 are fabricated from transparent conductive oxides. Examples of transparent conductive oxides include indium-tin-oxide, zinc oxide, indium-doped zinc oxide or aluminum-doped zinc oxide. A preferred transparent conductive oxides is aluminum-doped zinc oxide. Preferably the aluminum-doped zinc oxide is fabricated by metal-organic chemical vapor deposition (MOCVD) and preferably the aluminum-doped zinc oxide electrode is greater than 500 nanometers thick. Light can exit LED chip 1200 in FIG. 12B through both the top or first side 1252 and the bottom or second side 1254 of the chip, thereby increasing the extraction efficiency and the external quantum efficiency of the chip. For example, internally generated light ray 1270 exits LED chip 1200 on the top or first side 1252 of the chip. Light ray 1272 exits LED chip 1200 on the bottom or second side 1254.

In addition to LED chips, embodiments of this invention usually include wavelength conversion chips. Wavelength conversion chips can absorb light of a first wavelength range emitted by the LED chip and convert the light into light of a second wavelength range, different than the first wavelength range. Wavelength conversion chips are very useful for converting ultraviolet or blue LED light into longer wavelengths such as blue (in the case of ultraviolet LEDs), cyan, green, yellow, orange, red or infrared.

Wavelength conversion chips can be fabricated separately from the LED chips and then subsequently bonded onto the light output surfaces of the LED chips. The process for fabricating wavelength conversion chips can be a batch process or a continuous web process. The resulting wavelength conversion chips are substantially planar in order to facilitate bonding to the LEDs. The length and width dimensions of the wavelength conversion chips can be greater than, equal to or smaller than the length and width dimensions of the LED chips onto which the wavelength conversion chip are attached.

Alternatively, a wavelength conversion layer can be fabricated in the form of a large planar wafer. The wavelength conversion wafer can be bonded to a planar wafer of LEDs. Afterwards the bonded wafers can be diced or otherwise cut into light source chips such that each light source chip is a stack of elements that include a wavelength conversion chip bonded to an LED chip. This alternative will be discussed below for FIG. 43.

Figure 13A:
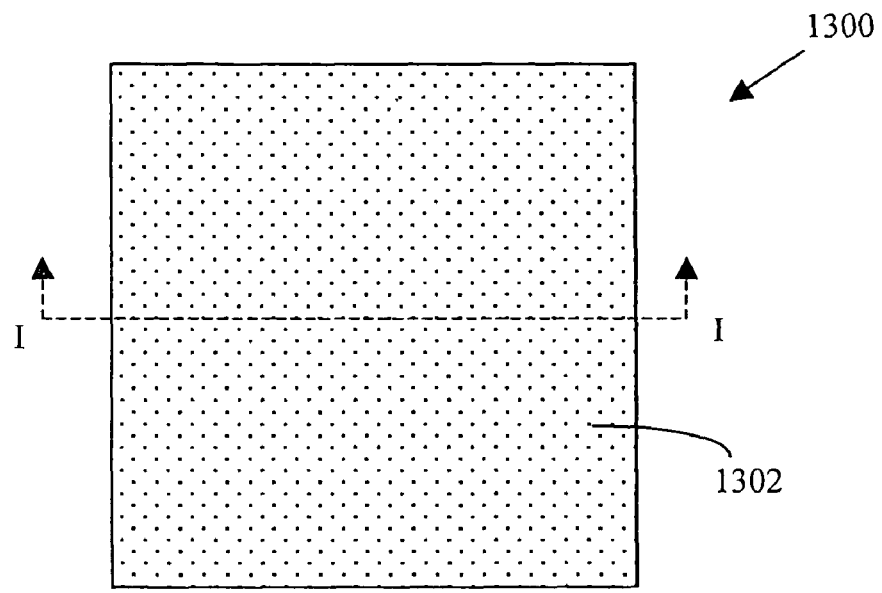
FIGS. 13A and 13B illustrate a wavelength conversion chip.
Figure 13B:
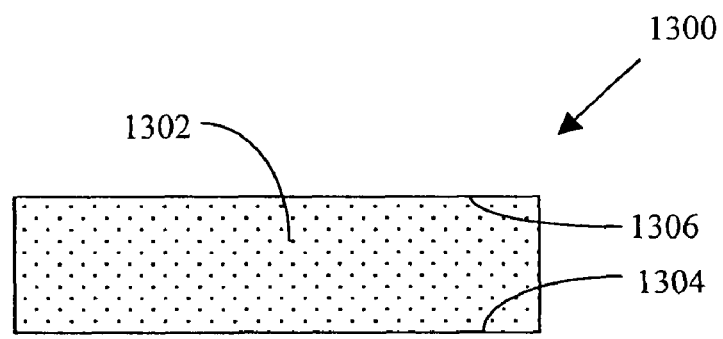

An exemplary wavelength conversion chip is illustrated in FIGS. 13A and 13B. FIG. 13A is a top plan view of wavelength conversion chip 1300. FIG. 13B is a side cross-sectional view along the I-I plane indicated in FIG. 13A. Wavelength conversion chip 1300 includes a wavelength conversion layer 1302, which has a bottom or first surface 1304 and a top or second surface 1306.

A wavelength conversion layer can be formed from wavelength conversion materials. The wavelength conversion materials absorb light in a first wavelength range and emit light in a second wavelength range, where the light of a second wavelength range is different than the light of the first wavelength range and has longer wavelengths than the light of a first wavelength range. The wavelength conversion materials may be, for example, phosphor materials or quantum dot materials. The phosphor materials may be in the form of powders, ceramics, thin film solids or bulk solids. Preferred forms are ceramics and thin solid films. The wavelength conversion layer may also be formed from two or more different wavelength conversion materials. In addition, the wavelength conversion layer may also include optically inert host materials for the phosphor or quantum dot wavelength conversion materials.

Phosphor materials are typically optical inorganic materials doped with ions of lanthanide (rare earth) elements or, alternatively, ions such as chromium, titanium, vanadium, cobalt, manganese or magnesium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide (BeAl$_2$O$_4$), magnesium fluoride (MgF$_2$), indium phosphide (InP), gallium phosphide (GaP), yttrium aluminum garnet (YAG or Y$_3$Al$_5$O$_{12}$), terbium-containing garnet, yttrium-aluminum-lanthanide oxide compounds, yttrium-aluminum-lanthanide-gallium oxide compounds, yttrium oxide (Y$_2$O$_3$), calcium or strontium or barium halophosphates (Ca,Sr,Ba)$_5$(PO$_4$)$_3$(Cl,F), the compound CeMgAl$_{11}$O$_{19}$, lanthanum phosphate (LaPO$_4$), lanthanide pentaborate materials ((lanthanide)(Mg,Zn)B$_5$O$_{10}$), the compound BaMgAl$_{10}$O$_{17}$, the compound SrGa$_2$S$_4$, the compounds (Sr,Mg,Ca,Ba)(Ga,Al,In)$_2$S$_4$, the compound SrS, the compound ZnS, doped zinc oxide (ZnO) and nitridosilicate. There are several exemplary phosphors that can be excited at 250 nm or thereabouts. An exemplary red emitting phosphor is Y$_2$O$_3$:Eu$^{3+}$. An exemplary yellow emitting phosphor is YAG:Ce$^{3+}$. Exemplary green emitting phosphors include CeMgAl$_{11}$O$_{19}$:Tb$^{3+}$, ((lanthanide)PO$_4$:Ce$^{3+}$,Tb$^{3+}$) and GdMgB$_5$O$_{10}$:Ce$^{3+}$,Tb$^{3+}$. Exemplary blue emitting phosphors are BaMgAl$_{10}$O$_{17}$:Eu$^{2+}$ and (Sr,Ba,Ca)$_5$(PO$_4$)$_3$Cl:Eu$^{2+}$. For longer wavelength LED excitation in the 400-450 nm wavelength region or thereabouts, exemplary optical inorganic materials include yttrium aluminum garnet (YAG or Y$_3$Al$_5$O$_{12}$), terbium-containing garnet, yttrium oxide (Y$_2$O$_3$), YVO$_4$, SrGa$_2$S$_4$, (Sr,Mg,Ca,Ba)(Ga,Al,In)$_2$S$_4$, SrS, and nitridosilicate. Exemplary phosphors for LED excitation in the 400-450 nm wavelength region include YAG:Ce$^{3+}$, YAG:Ho$^{3+}$, YAG:Pr$^{3+}$, YAG:Tb$^{3+}$, YAG:Cr$^{3+}$, YAG:Cr$^{4+}$, SrGa$_2$S$_4$:Eu$^{2+}$, SrGa$_2$S$_4$:Ce$^{3+}$, SrS:Eu$^{2+}$ and nitridosilicates doped with Eu$^{2+}$. Other phosphor materials not listed here are also within the scope of this invention.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at a first wavelength and then emit light at a second wavelength, where the second wavelength is longer than the first wavelength. The wavelength of the emitted light depends on the particle size, the particle surface properties, and the inorganic semiconductor material.

The transparent and optically inert host materials are especially useful to process phosphor powders or to spatially separate quantum dots. Host materials include polymer materials and inorganic materials. The polymer materials include, but are not limited to, acrylates, polystyrene, polycarbonate, fluoroacrylates, chlorofluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

A general process for forming wavelength conversion layers and wavelength conversion chips is now described. A wavelength conversion layer is formed by depositing phosphor materials using any one of a variety of techniques. The deposition is usually done on an inert substrate. The techniques include, but are not limited to, chemical vapor deposition (CVD), metal-organic chemical vapor deposition (MOCVD), sputtering, electron beam evaporation, laser deposition, sol-gel deposition, molecular beam epitaxy (MBE), liquid phase epitaxy (LPE), spin coating, slip casting, doctor blading and tape casting. Preferred techniques include slip casting, doctor blading, tape casting, CVD, MOCVD and sputtering. More preferred techniques include slip casting and tape casting. When the wavelength conversion layer is formed from quantum dot materials and inert host materials, deposition techniques include spin coating, slip casting, doctor blading, tape casting, self assembly, lithography, and nanoimprinting:

The thickness of the wavelength conversion layer can range from about 0.1 micron to about 2000 microns or more. Preferred thicknesses range from about 10 microns to about 500 microns.

Once the wavelength conversion layer is formed, it is optionally thermally annealed or radiation annealed in order to increase the wavelength conversion efficiency of the layer or, in the case of a phosphor powder, to sinter the powder to form a ceramic layer. This step is especially important for thin film phosphors, since as-deposited thin film phosphors may have low wavelength conversion efficiency if the deposited layer is not properly annealed. The annealing step can be any heat treatment or any radiation treatment of the wavelength conversion material in the wavelength conversion layer that anneals the phosphor. Heating the wavelength conversion material in the wavelength conversion layer to, for example, 600 degrees Celsius for one hour can result in thermal annealing of the wavelength conversion material. Appropriate annealing temperatures and times may vary for different wavelength conversion materials. Example radiation annealing treatments include subjecting the wavelength conversion material in the wavelength conversion layer to infrared, visible or ultraviolet light or subjecting the wavelength conversion material in the wavelength conversion layer to electron beam, atomic beam or ion beam bombardment. The radiation sources may be pulsed or continuous. The light sources may be incoherent or coherent (e.g. laser) sources.

If the wavelength conversion material is a phosphor powder mixed with an organic binder, the annealing step may be done in two or more parts. For example, a low temperature (less than 300 degrees Celsius) anneal can be done to remove the organic binder material. Following the removal of the organic material, a high temperature (greater than 500 degrees Celcius) anneal can then be done to sinter the phosphor powder into a ceramic solid.

The annealing step can occur after the deposition of the wavelength conversion layer on a substrate and before segmentation of the layer. However, the annealing step may also be done later in the process sequence, including after the wavelength conversion layer is removed from any substrate that is used to form the layer. Doing the annealing step after the wavelength conversion layer is removed from the substrate is necessary if the substrate cannot withstand high temperature or high radiation processing. The annealing step may be done in air, in an inert atmosphere such as nitrogen or argon or in a partial vacuum.

At this point in the process, the wavelength conversion material is in the form of an extended layer or wafer of material. The wavelength conversion wafer can be bonded in one piece to a wafer of LEDs or the wavelength conversion wafer may be segmented into wavelength conversion chips that later will be bonded to individual LED chips.

If one wishes to form wavelength conversion chips, the next process step is to segment the wavelength conversion layer into a plurality of wavelength conversion chips. Grooves or streets are formed through the wavelength conversion layer. The streets are fabricated in two directions to form a plurality of wavelength conversion chips that can be square, rectangular or any other planar geometric shape. The streets can be formed by techniques that include, but are not limited to, laser scribing, mechanical scribing or optical lithography accompanied by wet chemical etching, sputter etching or ion beam etching.

Wavelength conversion chip 1300 in FIGS. 13A and 13B is a simple wavelength conversion chip than includes a wavelength conversion layer 1302. The wavelength conversion layer has a first surface 1304 and a second surface 1306. Other versions of wavelength conversion chips are possible that include additional features such as light extraction elements, dichroic layers that reflect some wavelengths of light and transmit other wavelengths of light as well as electrical interconnection means that facilitate the formation of electrical connections to LEDs. Examples of some extra features are illustrated in the following figures. A single wavelength conversion chip may include one such feature or more than one added feature.

Figure 14A:
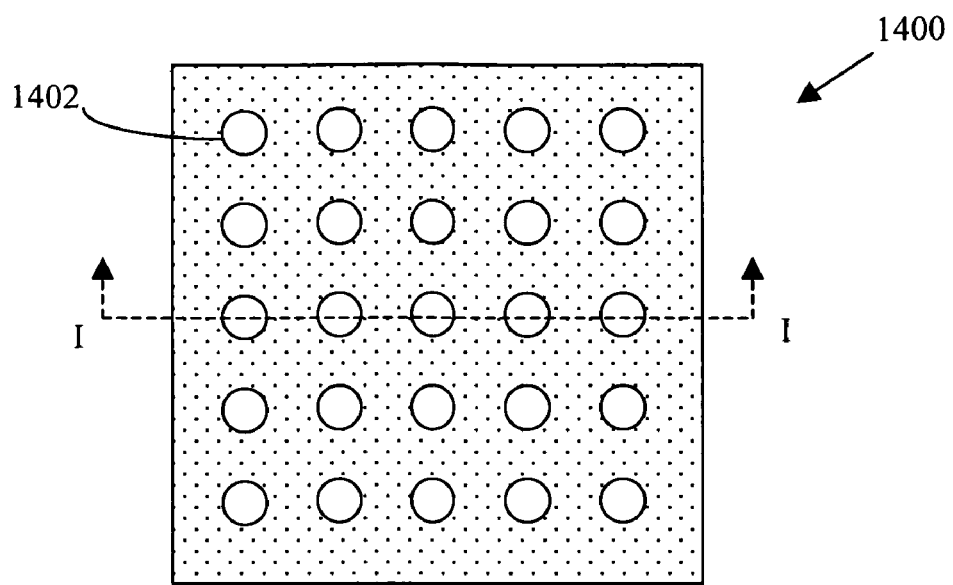
FIGS. 14A and 14B illustrate a wavelength conversion chip that includes light extraction elements.
Figure 14B:
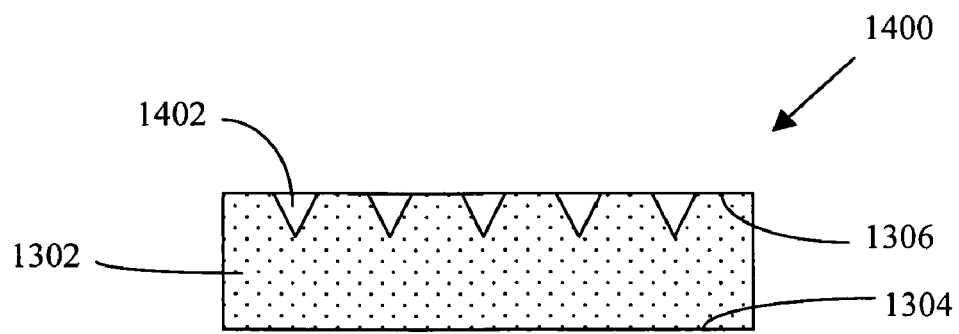

FIGS. 14A and 14B illustrate an example wavelength conversion chip 1400 that includes light extraction elements 1402 fabricated on the second surface 1306 of the wavelength conversion layer 1302. Optionally, light extraction elements could also be fabricated on the first surface. Light extraction elements are designed to improve the extraction of wavelength converted light from the wavelength conversion chip. If a chip does not have light extraction elements, more of the wavelength converted light may remain inside the chip due to total internal reflection of the emitted light from the inside surfaces of the chip. The extraction elements can be depressions, holes, bumps, pillars, grooves or ridges, either placed randomly or in regular arrays. The extraction elements can have any shape including, but not limited to, holes or pyramids with circular, oval or polygonal cross-sections, curves with arbitrary shapes such as hemispheres. The extraction elements could also be regular arrays of holes or pillars in the form of a photonic crystal. A photonic crystal can result in light emission from the wavelength conversion chip that has a restricted angular output. In FIGS. 14A and 14B, the example extraction elements are holes with a conical shape and a circular cross-section.

Figure 15A:
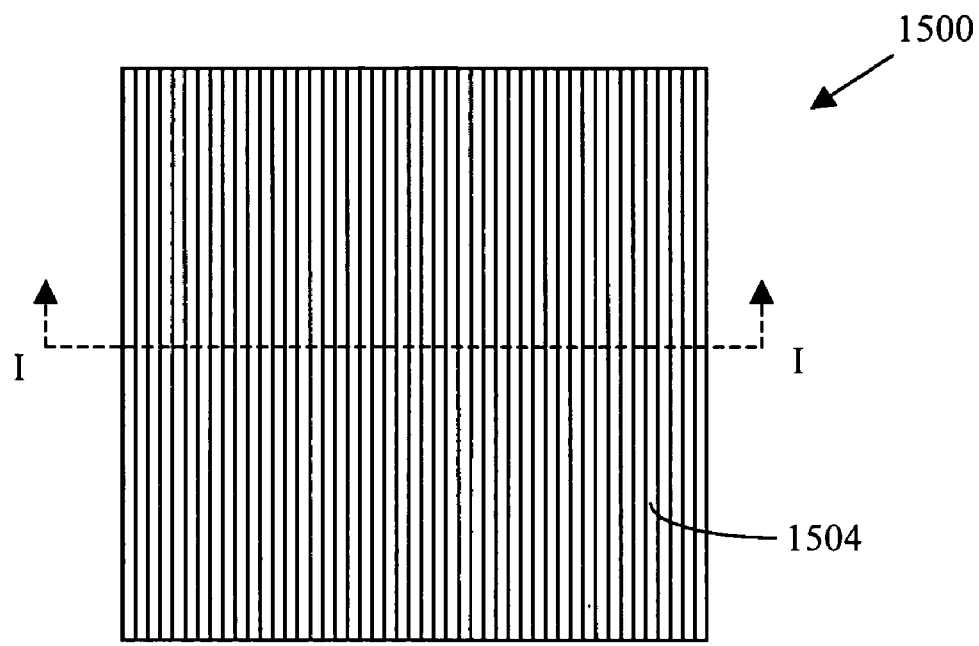
FIGS. 15A and 15B illustrate a wavelength conversion chip that includes two dichroic layers.
Figure 15B:
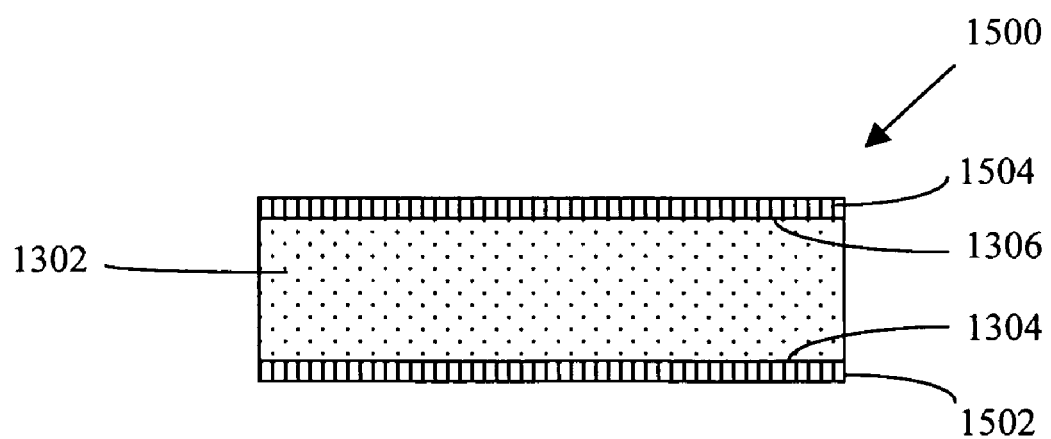

FIGS. 15A and 15B illustrate an example wavelength conversion chip 1500 that includes optional dichroic layers 1502 and 1504. A dichroic layer is a layer that transmits light of one wavelength range and reflects light of another wavelength range. Assume, for example, that the wavelength conversion chip 1500 (in particular, the side of the wavelength conversion chip that has the dichroic layer 1502) is attached to the output surface of an LED chip that emits internally generated blue light and that the wavelength conversion chip converts the blue light into green light. Then it would be desirable to design the dichroic layer 1502 so that it transmits the blue light from the LED chip but reflects the green light to prevent the green light from entering the LED chip. Likewise, the dichroic layer 1504 can be designed to transmit the green light generated by the wavelength conversion chip and reflect any blue light back into the wavelength conversion chip where it has another opportunity to be converted.

Other desirable features for the wavelength conversion chip include the incorporation of interconnection means to facilitate the making of electrical connections to an LED chip. Examples of interconnection means are shown in FIGS. 16-22.

Figure 16A:
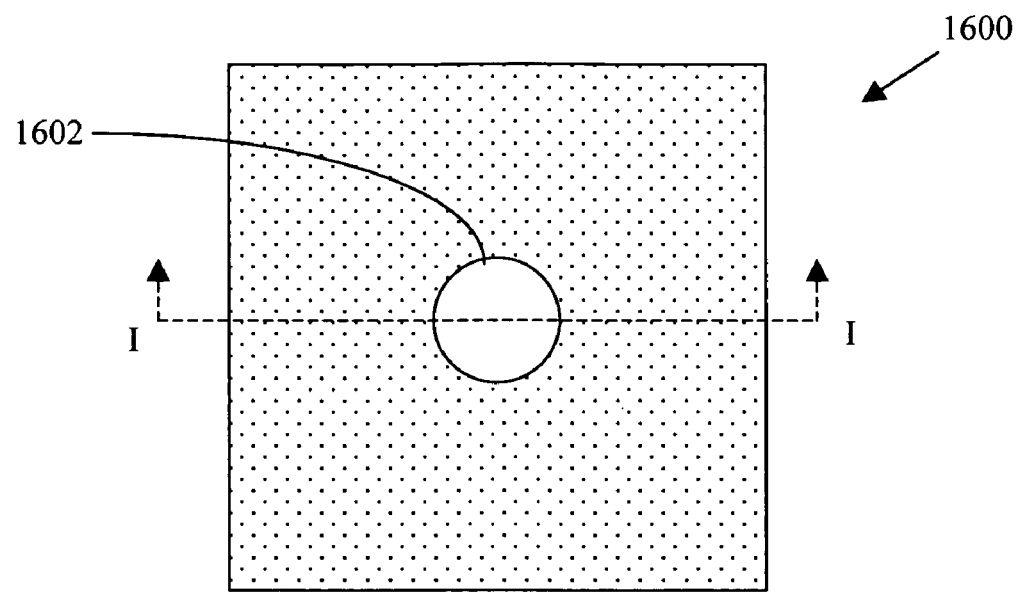
FIGS. 16A and 16B illustrate a wavelength conversion chip that includes an electrical interconnection means. The electrical interconnection means is a via that passes through the chip.
Figure 16B:
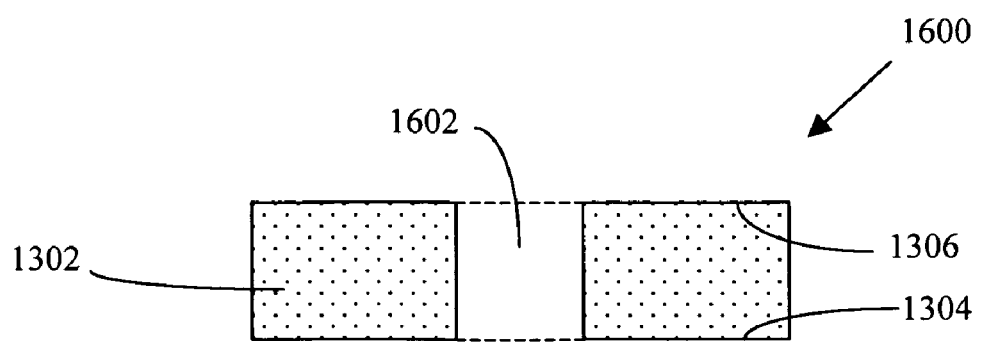

The wavelength conversion chip 1600 illustrated in FIGS. 16A and 16B includes an interconnection means. FIG. 16A is a top plan view of wavelength conversion chip 1600. FIG. 16B is a side cross-sectional view along the I-I plane illustrated in FIG. 16A. The interconnection means in this example is via 1602 that extends through the wavelength conversion layer 1302 from surface 1304 to surface 1306. Via 1602 is illustrated to be located in the center of the chip, but the via can be placed anywhere in the chip, including along an edge. A via along an edge of the chip may be only partially surrounded by the wavelength conversion layer. The via can be unfilled or the via can be partially or fully filled with a material that is electrically conducting. In this example, via 1602 is empty.

Figure 17A:
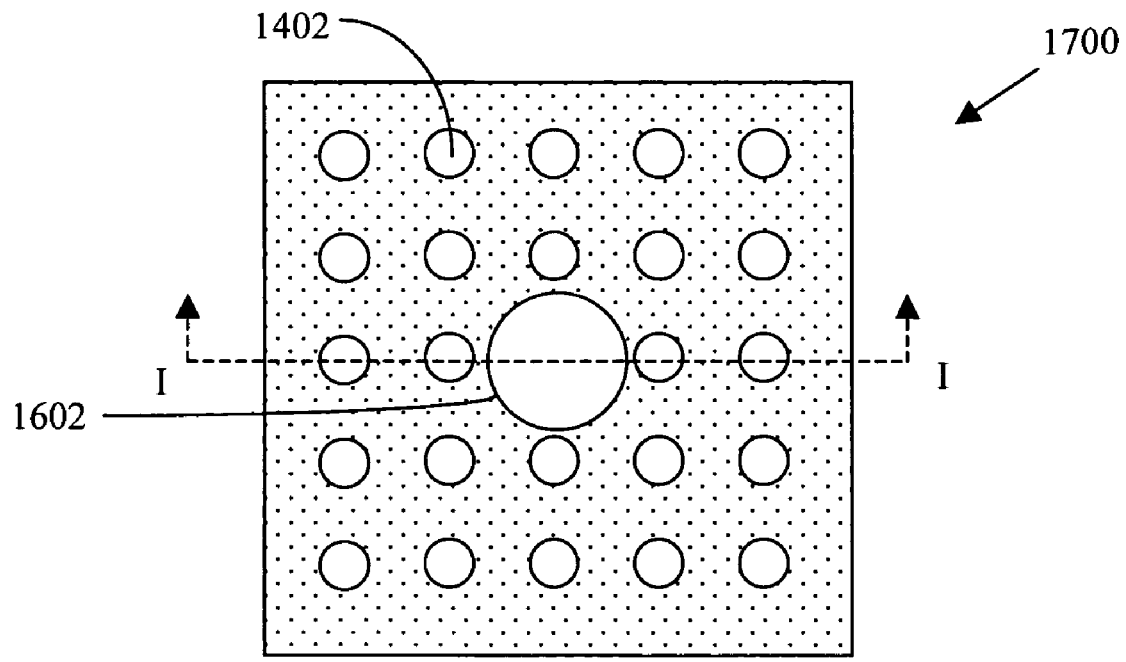
FIGS. 17A and 17B illustrate a wavelength conversion chip that includes an electrical interconnection means and light extraction elements. The electrical interconnection means is a via that passes through the chip.
Figure 17B:
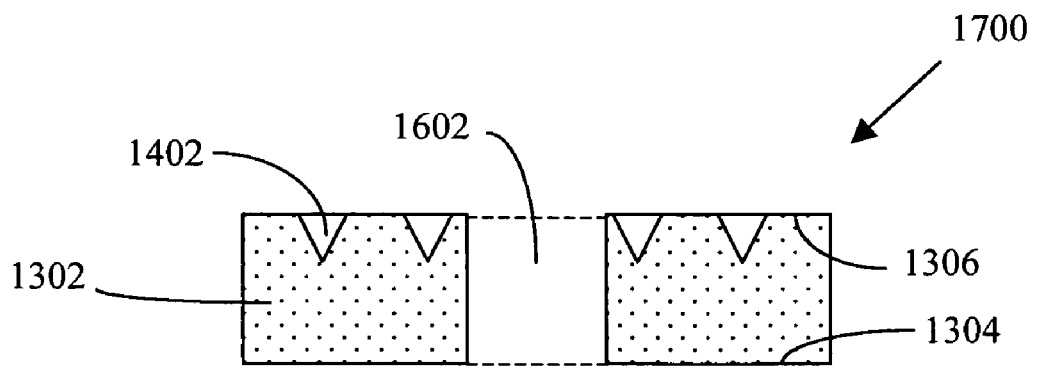

The wavelength conversion chip 1700 illustrated in FIGS. 17A and 17B includes both an interconnection means and light extraction elements. FIG. 17A is a top plan view of wavelength conversion chip 1700. FIG. 17B is a side cross-sectional view along the I-I plane illustrated in FIG. 17A. Wavelength conversion chip 1700 includes both a via 1602 and light extraction elements 1402. The interconnection means in this example is a via that extends through the wavelength conversion layer 1302 from surface 1304 to surface 1306. The via is illustrated to be located in the center of the chip, but the via can be placed anywhere in the chip, including along an edge. The via can be unfilled or the via can be partially or fully filled with a feedthrough that is electically conducting. In this example, the via is empty. The light extraction means 1402 can have any shape. In this example, the light extraction means are conical holes with circular cross-sections that are fabricated into surface 1306 of the wavelength conversion layer 1302.

Figure 18A:
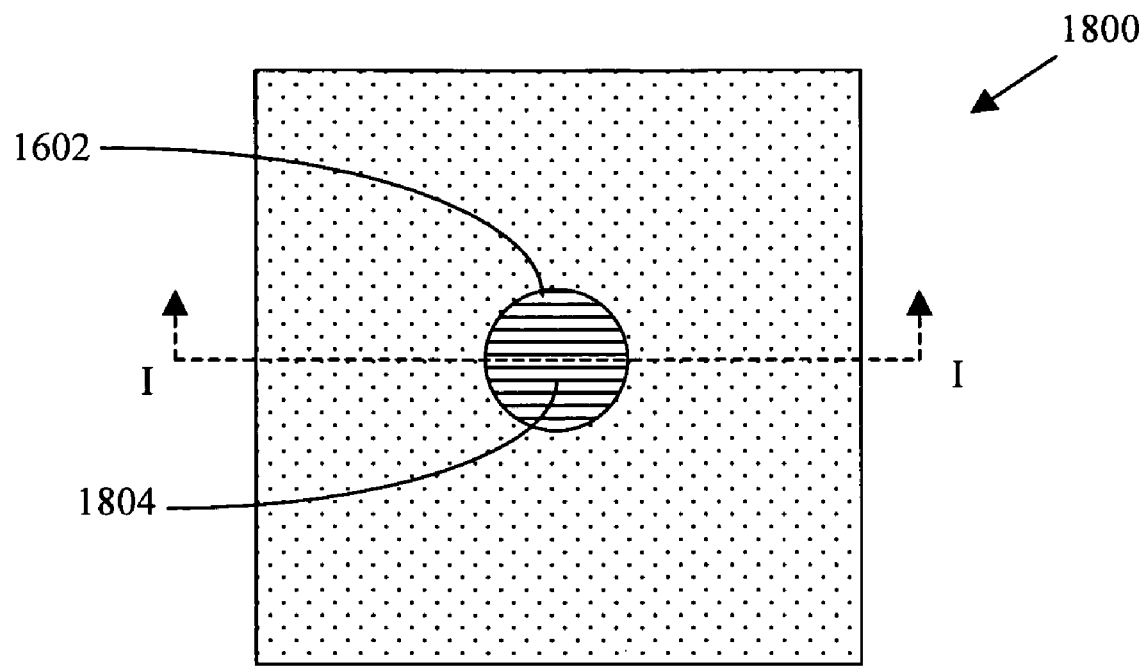
FIGS. 18A and 18B illustrate another wavelength conversion chip that includes an electrical interconnection means. The electrical interconnection means is a via that that is filled with an electrically conducting feedthrough.
Figure 18B:
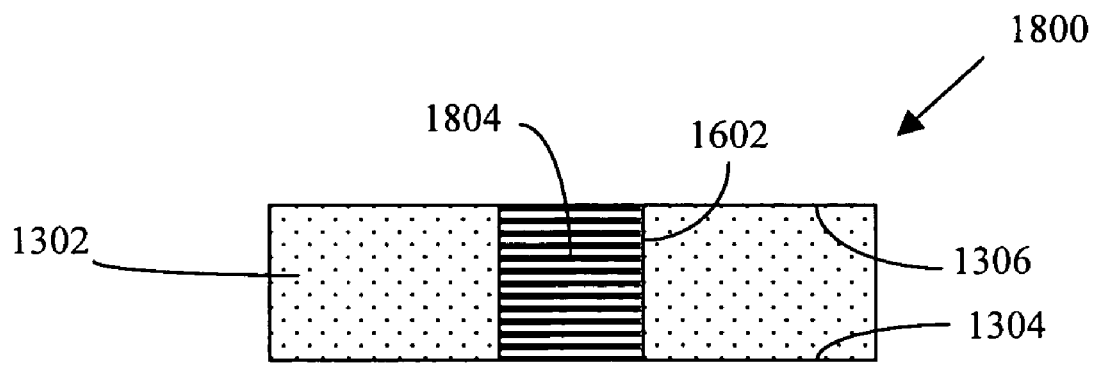

The wavelength conversion chip 1800 illustrated in FIGS. 18A and 18B includes an interconnection means. FIG. 18A is a top plan view of wavelength conversion chip 1800. FIG. 18B is a side cross-sectional view along the I-I plane illustrated in FIG. 18A. The interconnection means in this example is via 1602 that extends through the wavelength conversion layer 1302 from surface 1304 to surface 1306. The via is illustrated to be located in the center of the chip, but the via can be placed anywhere in the chip, including along an edge. In this example, via 1602 is completely filled with an electrical feedthough 1804. The feedthrough can be a metal, for example copper, aluminum, gold or a solder, or the feedthrough can be fabricated from an electrically conductive epoxy. In a partially filled via (not shown), the feedthrough can be a solder bump or stud bump that extends through the via to allow for easier electrical attachment to an electrode of an LED (not shown).

Figure 19A:
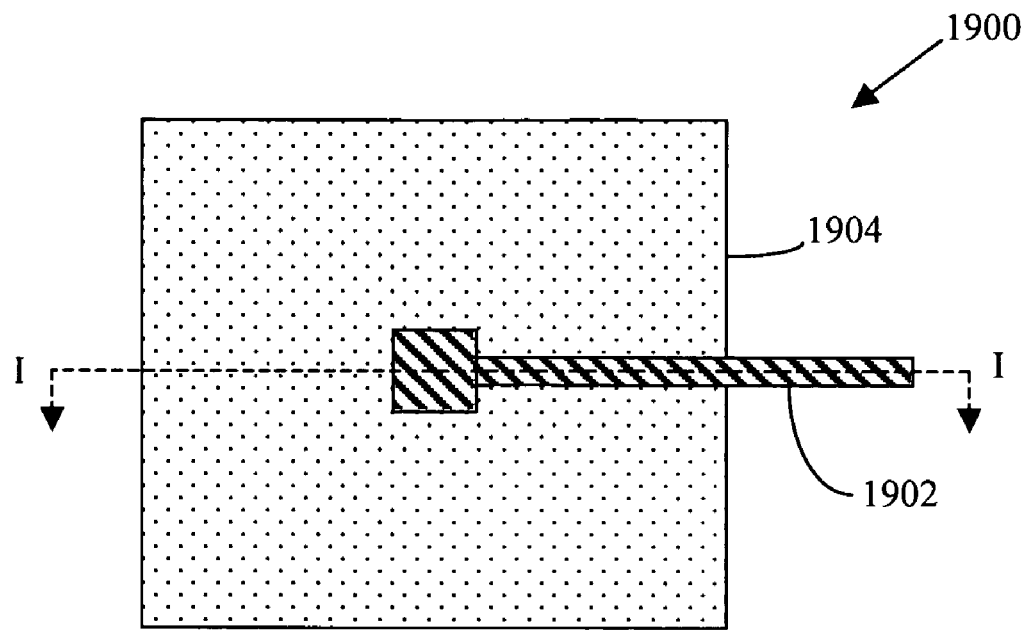
FIGS. 19A and 19B illustrate another wavelength conversion chip that includes an electrical interconnection means. The electrical interconnection means is an electrical conductor embedded into one surface of the wavelength conversion chip.
Figure 19B:
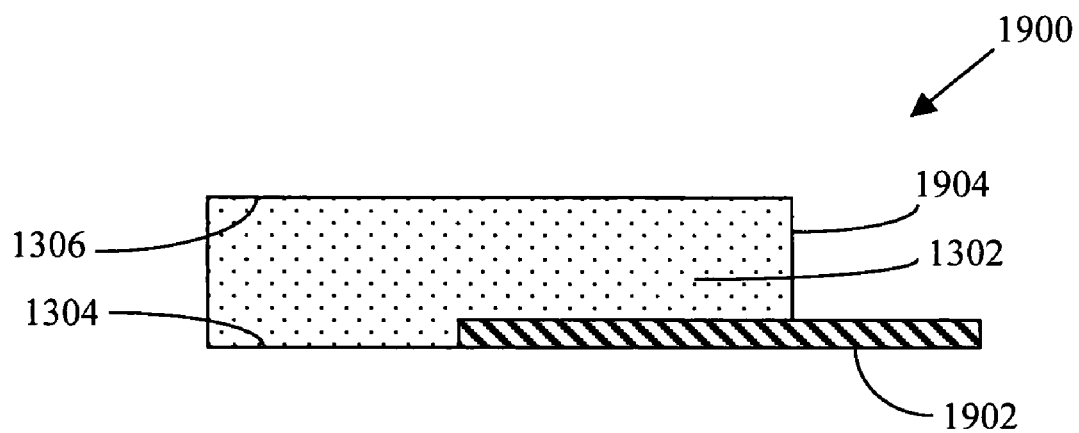

The wavelength conversion chip 1900 illustrated in FIGS. 19A and 19B includes an interconnection means. FIG. 19A is a bottom plan view of wavelength conversion chip 1900. FIG. 19B is a side cross-sectional view along the I-I plane illustrated in FIG. 19A. The interconnection means in this example is an embedded metal interconnection 1902. The interconnection 1902 can extend past the edge 1904 of the wavelength conversion chip to allow for making easy external electrical connections to the interconnection 1902. An embedded interconnection can be fabricated by cutting or etching a groove into the wavelength conversion chip and press fitting a wire or other metal structure into the groove. The cutting or etching process may be done by any standard means including mechanical cutting or laser etching. The embedding process may be done before or after the wavelength conversion layer is annealed.

Figure 20A:
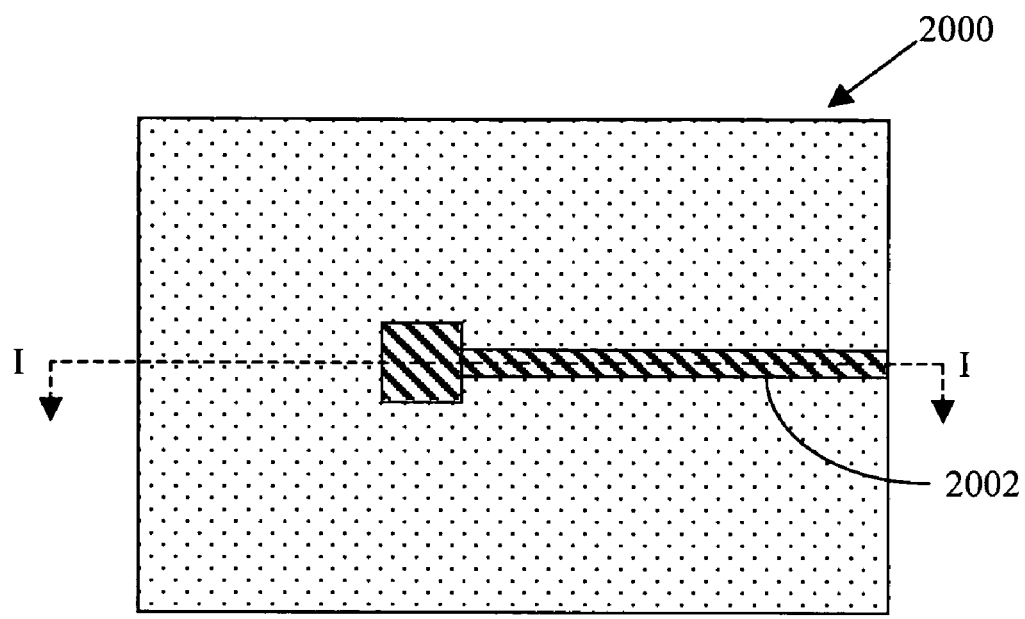
FIGS. 20A and 20B illustrate another wavelength conversion chip that includes an electrical interconnection means. The electrical interconnection means is an electrical conductor that is fabricated onto one surface of the wavelength conversion chip.
Figure 20B:
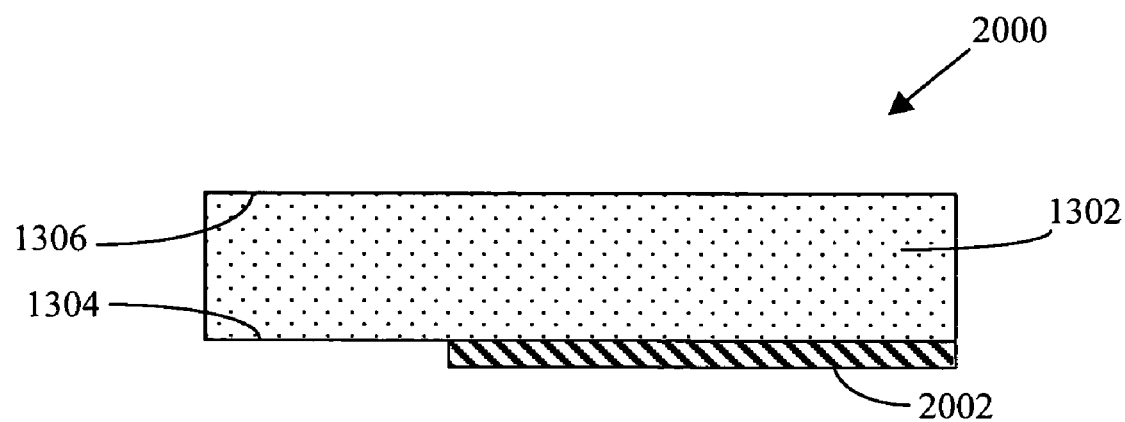

The wavelength conversion chip 2000 illustrated in FIGS. 20A and 20B includes an interconnection means. FIG. 20A is a bottom plan view of wavelength conversion chip 2000. FIG. 20B is a side cross-sectional view along the I-I plane illustrated in FIG. 20A. The interconnection means in this example is an electrical interconnection 2002 formed on the bottom surface 1304 of the wavelength conversion layer. The interconnection 2002 can be fabricated by depositing a metal layer on the surface 1304 and patterning the layer by any standard photolithographic technique. The interconnection 2002 may also be fabricated by depositing a metal-containing liquid or metal-containing epoxy on surface 1304 in the required pattern using inkjet printing, screen printing or other pattern deposition method. The material is then optionally baked or cured to form a solid conducting structure.

The wavelength conversion chip electrodes may be optically transparent, semi-transparent, semi-opaque or opaque. The electrodes may be fabricated from metals, metal alloys, high-temperature-fusible conductive materials, semiconductors or transparent conductive oxides. An example of a high-temperature-fusible material is a conductive silver paste or ink. Examples of transparent conductive oxides include indium tin oxide, zinc oxide, indium-doped zinc oxide and aluminum-doped zinc oxide. A preferred transparent conductive oxide is aluminum-doped zinc oxide. Preferably the aluminum-doped zinc oxide is fabricated by metal-organic chemical vapor deposition and preferably the aluminum-doped zinc oxide electrode is greater than 500 nanometers thick.

Figure 20C:
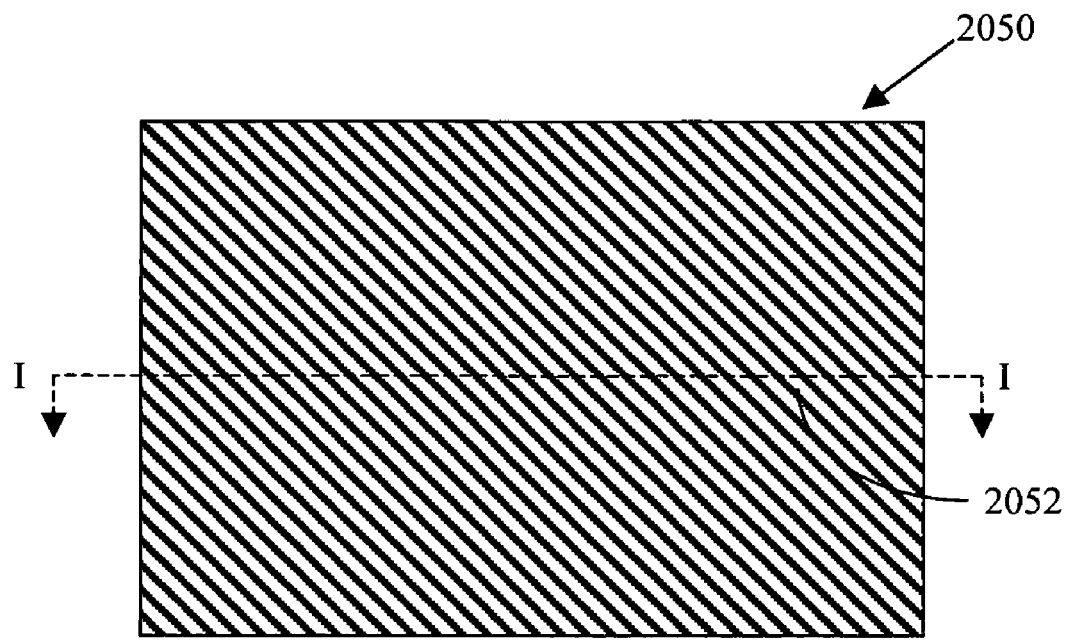
FIGS. 20C and 20D illustrate another wavelength conversion chip that includes an electrical interconnection means. The electrical interconnection means is an optically transparent electrical conductor that is fabricated onto one surface of the wavelength conversion chip.
Figure 20D:
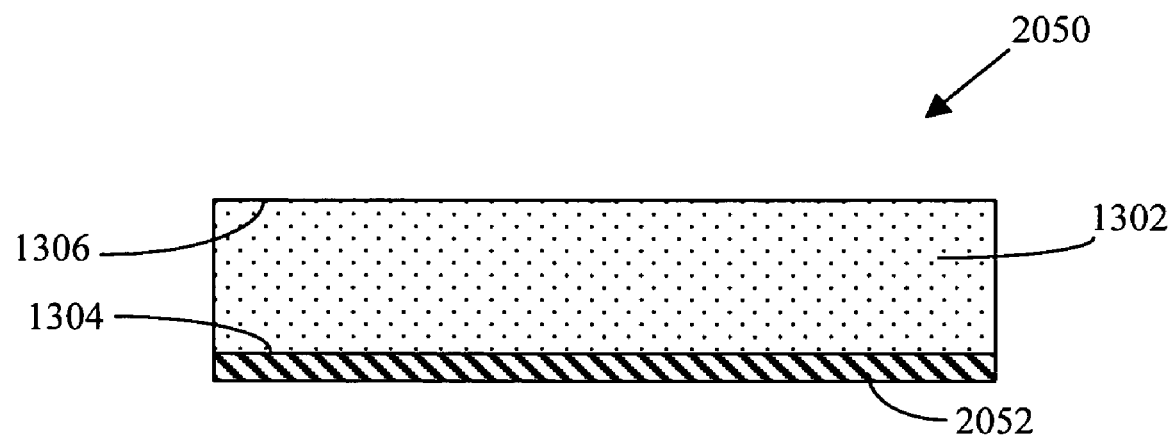

Wavelength conversion chip 2050 is illustrated in FIGS. 20C and 20D. FIG. 20C is a bottom plan view of wavelength conversion chip 2050. FIG. 20D is a side cross-sectional view along the I-I plane illustrated in FIG. 20C. The interconnection means in this example is an optically transparent electrical interconnection 2052 formed on the bottom surface 1304 of the wavelength conversion layer. Electrical interconnection 2052 is fabricated from a transparent conductive oxide. Examples of transparent conductive oxides include indium-tin-oxide, zinc oxide, indium-doped zinc oxide or aluminum-doped zinc oxide. A preferred transparent conductive oxides is aluminum-doped zinc oxide. Preferably the aluminum-doped zinc oxide is fabricated by metal-organic chemical vapor deposition (MOCVD) and preferably the aluminum-doped zinc oxide electrode is greater than 500 nanometers thick.

Figure 21A:
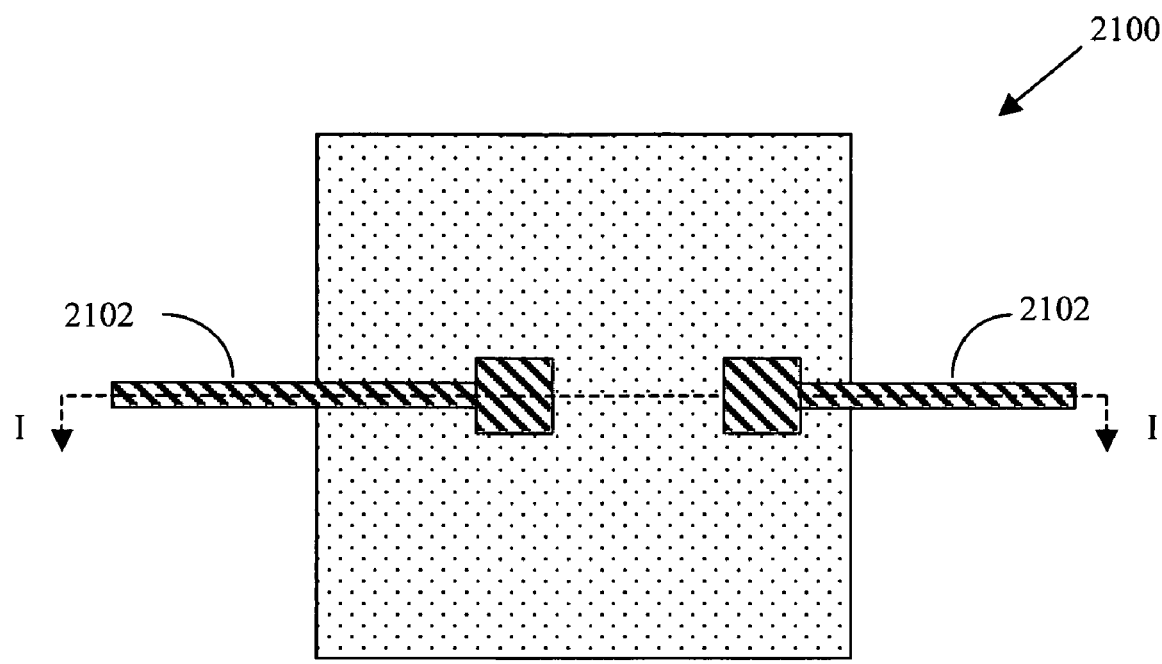
FIGS. 21A and 21B illustrate another wavelength conversion chip that includes two electrical conductors embedded into one surface of the wavelength conversion chip.
Figure 21B:
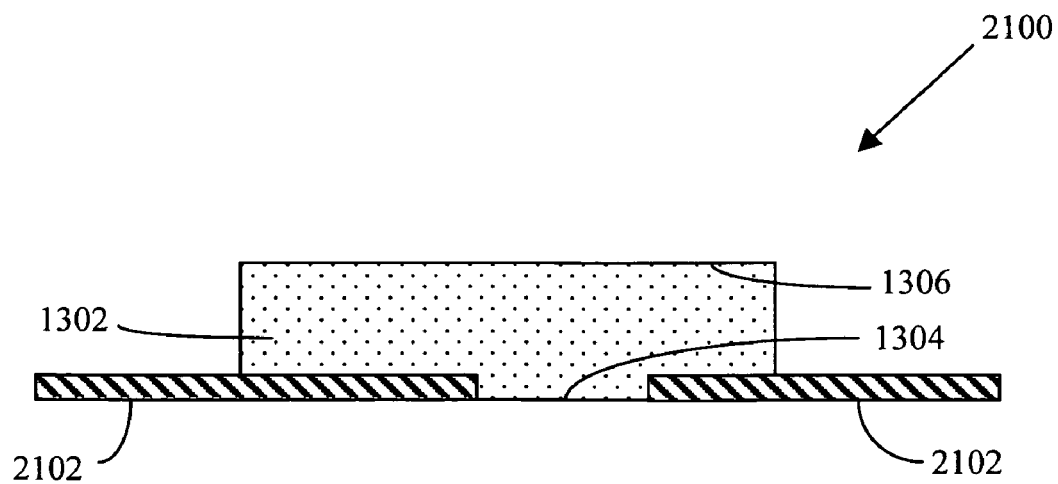

The wavelength conversion chip 2100 illustrated in FIGS. 21A and 21B includes an interconnection means. FIG. 21A is a bottom plan view of wavelength conversion chip 2100. FIG. 21B is a side cross-sectional view along the I-I plane illustrated in FIG. 21A. Wavelength conversion chip 2100 is similar to wavelength conversion chip 1900 except that wavelength conversion chip 2100 includes two interconnections 2102 that are embedded into surface 1304 of wavelength conversion layer 1302.

Figure 22A:
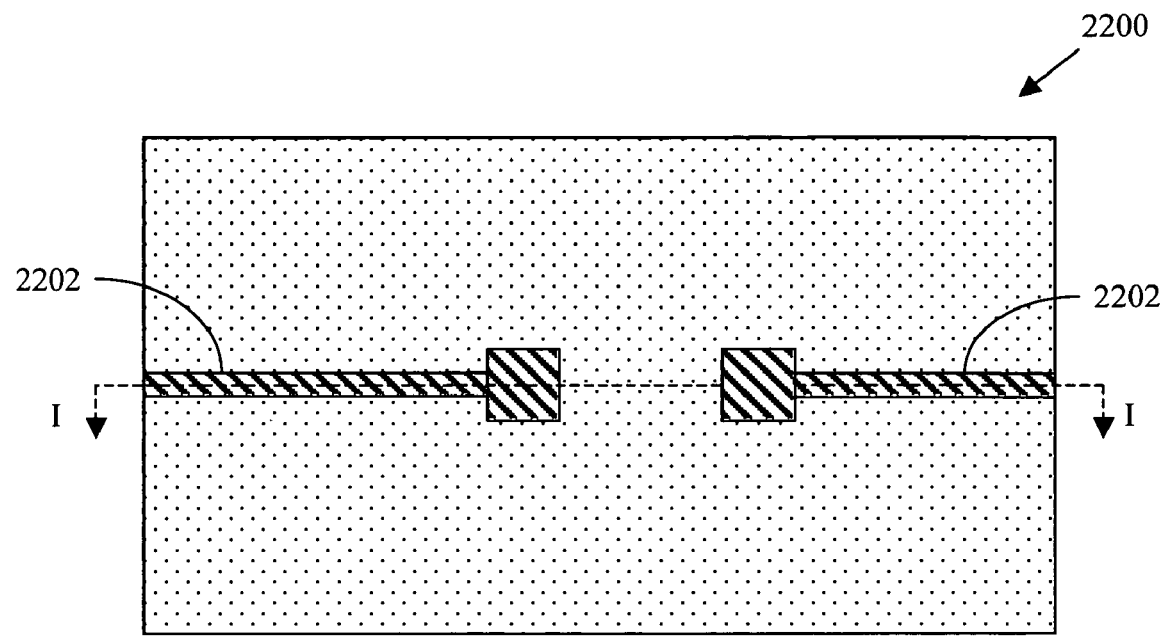
FIGS. 22A and 22B illustrate another wavelength conversion chip that includes two electrical conductors fabricated onto one surface of the wavelength conversion chip.
Figure 22B:
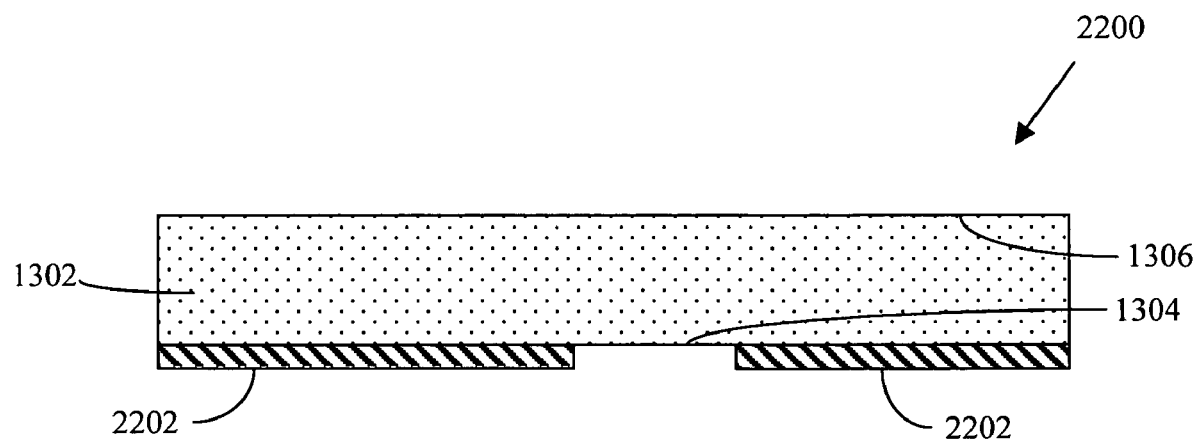

The wavelength conversion chip 2200 illustrated in FIGS. 22A and 22B includes an interconnection means. FIG. 22A is a bottom plan view of wavelength conversion chip 2200. FIG. 22B is a side cross-sectional view along the I-I plane illustrated in FIG. 22A. Wavelength conversion chip 2200 is similar to wavelength conversion chip 2000 except that wavelength conversion chip 2200 includes two interconnections 2202 that are fabricated onto surface 1304 of wavelength conversion layer 1302.

The building blocks for this invention have been described above. The building blocks are LED chips (either conventional or non-conventional substrate-free) and wavelength conversion chips.

One embodiment of this invention is a solid-state light source that includes at least one stack of elements. The elements of the stack include a conventional inorganic LED chip and at least one wavelength conversion chip, where the wavelength conversion chip incorporates an electrical interconnection means. The conventional LED chip is defined in this specification as an LED chip that includes either a growth substrate or a transfer substrate and that has a multilayer semiconductor structure that is less than 5 microns thick.

Examples of conventional LED chips are illustrated above in FIGS. 1 to 4. Examples of wavelength conversion chips are illustrated above in FIGS. 13 to 22. Examples of this embodiment that utilize conventional LED chips are illustrated below in FIGS. 23 to 27. The examples in FIGS. 23 to 27 illustrate only one stack. However, it is clear that solid-state light sources can be constructed from a plurality of such stacks. A plurality of stacks can be connected in series, parallel or anti-parallel.

Figure 23:
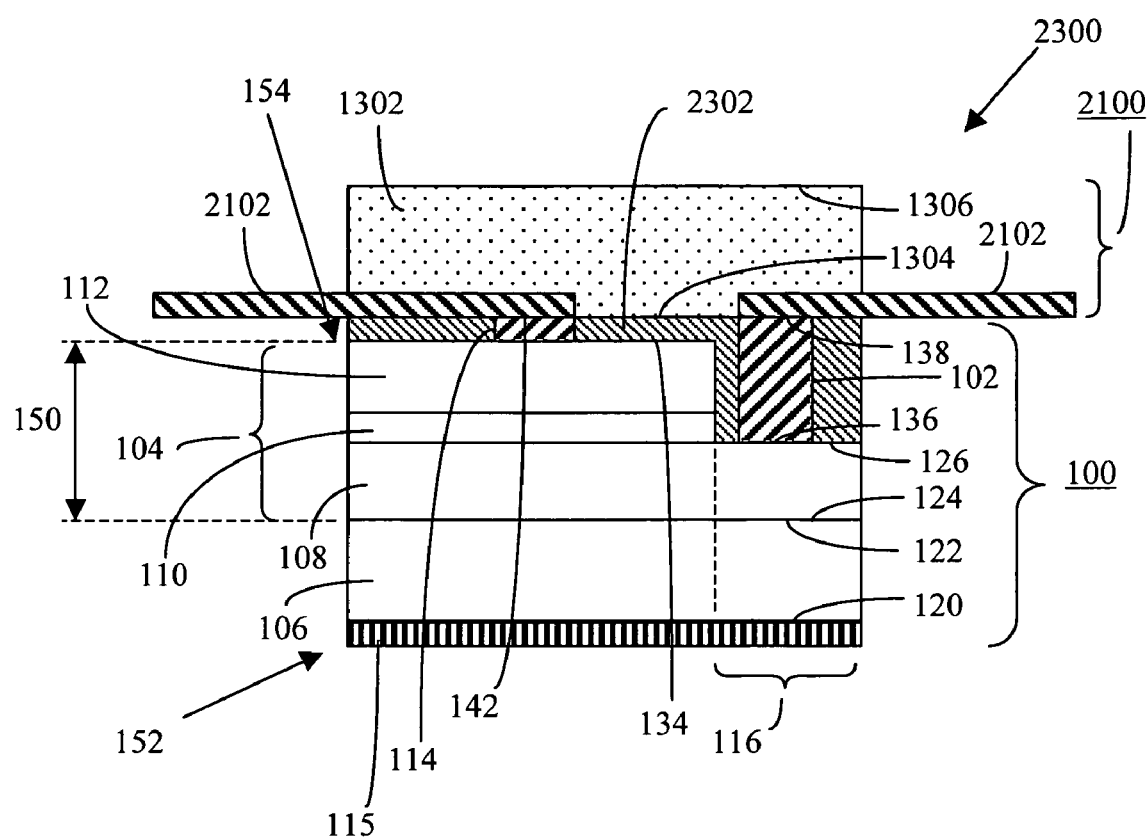
FIG. 23 is a side cross-sectional view of an embodiment of this invention that is a stack of two elements bonded together. The elements are a conventional LED chip that includes a growth substrate and a wavelength conversion chip that includes two electrodes.

Example solid-state light source 2300 in FIG. 23 is a stack of two elements bonded together. One element is conventional LED chip 100 that includes a growth substrate 106 and that has a multilayer semiconductor structure 104 that is grown by, for example, MOCVD. The thickness 150 of the multilayer semiconductor structure less than 5 microns. LED chip 100 is a GaN-based LED that has both the first electrode 102 and the second electrode 114 on the top or second side 154 of the chip. The second element of the stack is wavelength conversion chip 2100 that is bonded to the light emitting side or second side of LED chip 100. Wavelength conversion chip 2100 has two electrodes 2102 that are embedded in surface 1304 of the wavelength conversion layer 1302. The two electrodes of the LED chip are joined to the respective two electrodes of the wavelength conversion chip by, for example, soldering, conducting epoxy or other appropriate means. The wavelength conversion layer 1302 of the chip consists of, for example, cerium-doped YAG or YAG:Ce$^{3+}$ in the form of a ceramic layer.

The bond between the LED chip 100 and the wavelength conversion chip 2100 is formed by a transparent bonding layer 2302. Example bonding materials for bonding layer 2302 include ceramic adhesives, sol-gel compositions, low melting point glasses and transparent polymers. Preferred bonding materials include ceramic adhesives made by Aremco Products, Inc. The ceramic adhesives may be filled with alumina or silica powders or the ceramic adhesives may be unfilled.

The LED chip 100 in solid-state light source 2300 emits, for example, blue light. Wavelength conversion chip 2100 converts a portion of the blue light to, for example, yellow light.

Figure 24:
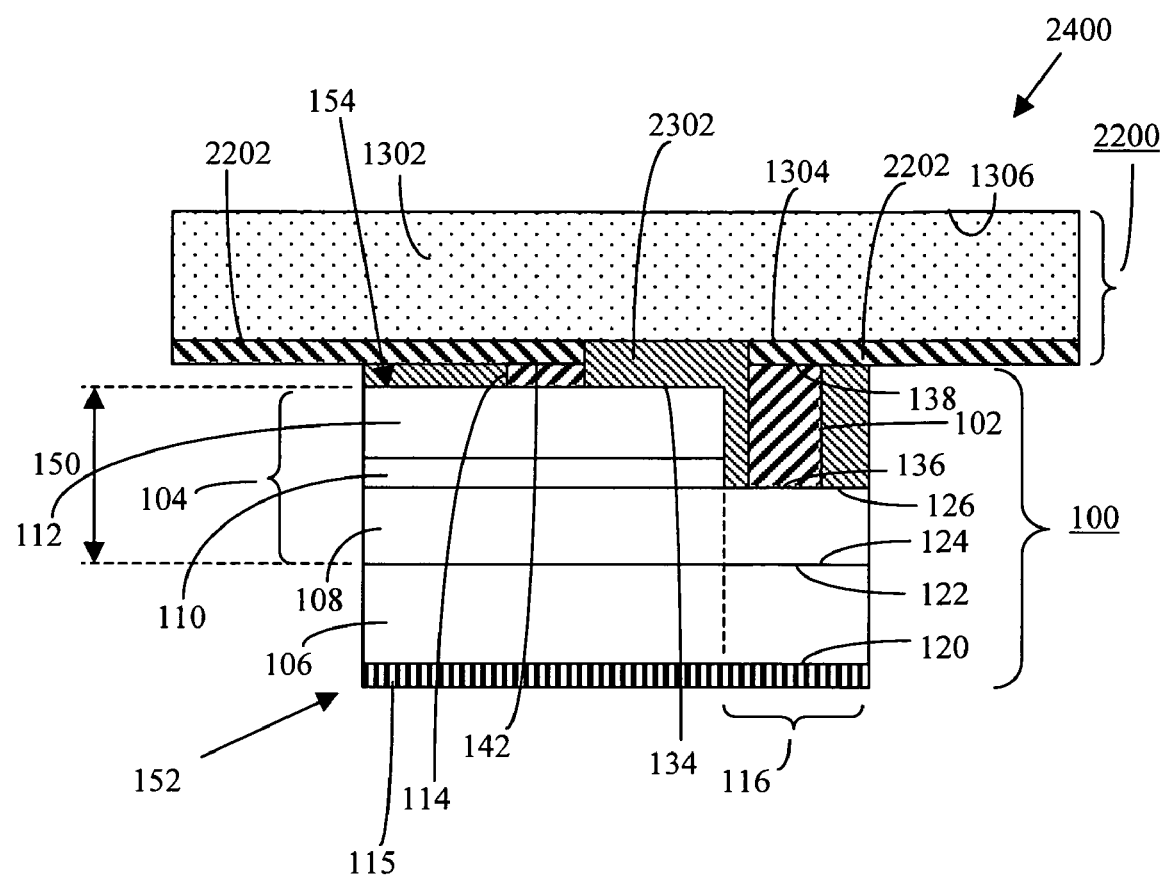
FIG. 24 is a side cross-sectional view of another embodiment of this invention that is a stack of two elements bonded together. The elements are a conventional LED chip that includes a growth substrate and a wavelength conversion chip that includes two electrodes.

Example solid-state light source 2400 in FIG. 24 is a stack of two elements bonded together. One element is conventional LED chip 100 that includes a growth substrate 106 and that has a multilayer semiconductor structure 104 that is grown by, for example, MOCVD. The thickness 150 of the multilayer semiconductor structure is less than 5 microns. LED chip 100 is a GaN-based LED that has both first electrode 102 and second electrode 114 on the top or second side 154 of the chip. The second element of the stack is wavelength conversion chip 2200 that is bonded to the light emitting side or second side of LED chip 100. Wavelength conversion chip 2200 has two electrodes 2202 that are fabricated onto surface 1304 of the wavelength conversion layer 1302. The two electrodes of the LED chip are joined to the respective two electrodes of the wavelength conversion chip by soldering, conducting epoxy or other appropriate means. The wavelength conversion layer 1302 of the chip consists of, for example, cerium-doped YAG or YAG:Ce$^{3+}$ in the form of a ceramic layer. The bond between the LED chip 100 and the wavelength conversion chip 2200 is formed by a transparent bonding layer 2302. The LED chip 100 in solid-state light source 2400 emits, for example, blue light. Wavelength conversion chip 2200 converts a portion of the blue light to, for example, yellow light.

Figure 25:
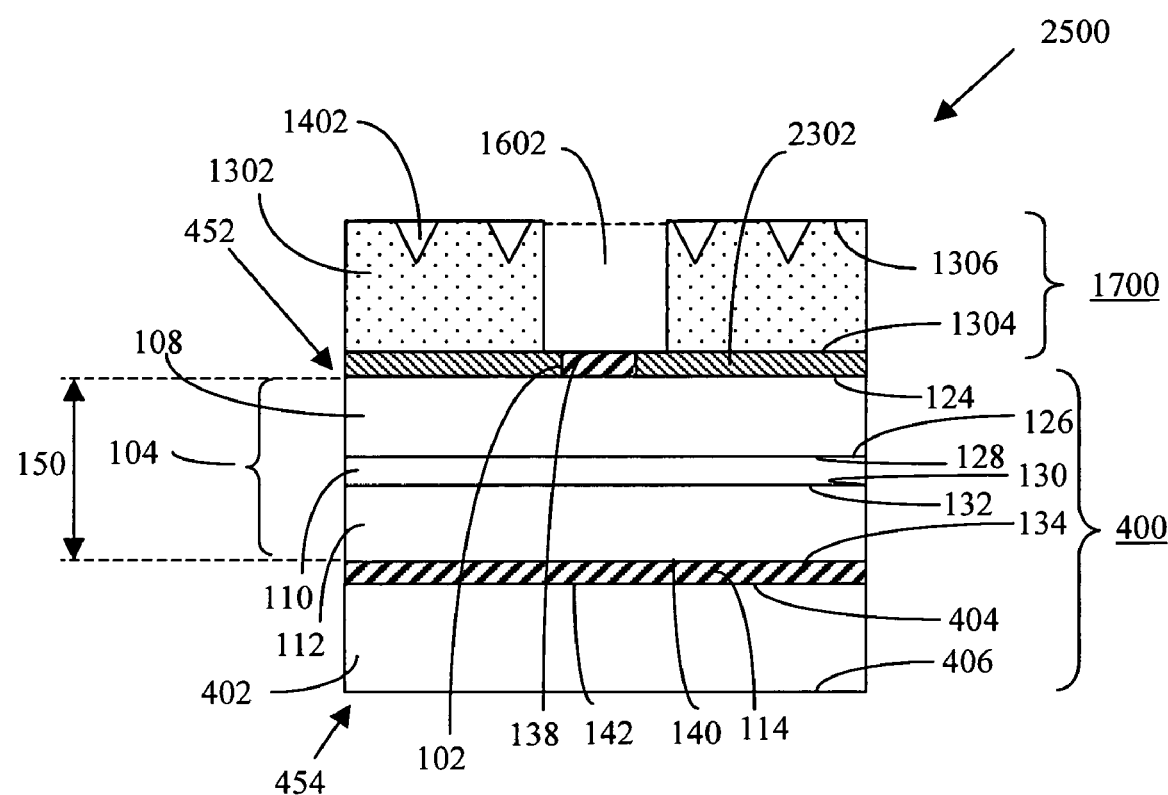
FIG. 25 is a side cross-sectional view of another embodiment of this invention that is a stack of two elements bonded together. The elements are a conventional LED chip that includes a transfer substrate and a wavelength conversion chip that includes a via and light extraction elements.

FIG. 25 illustrates solid-state light source 2500. Solid state light source 2500 is a stack of two elements bonded together.

One element is conventional LED chip 400 that includes a transfer substrate 402 and that has a multilayer semiconductor structure 104 that is grown by, for example, MOCVD. The thickness 150 of the multilayer semiconductor structure less than 5 microns. LED chip 400 is a GaN-based LED that has one electrode, the first electrode 102, on the top or first side 452 of the chip. The second element of the stack is wavelength conversion chip 1700 that is bonded to the light emitting side or first side of LED chip 400. Wavelength conversion chip 1700 has an electrical interconnection means, which is a via 1602 that passes through the wavelength conversion layer 1302. The via facilitates forming an electrical connection to electrode 102 by wire bonding or other means. The wavelength conversion layer 1302 of the chip consists of, for example, cerium-doped YAG or YAG:Ce$^{3+}$ in the form of a ceramic layer. The bond between the LED chip 400 and the wavelength conversion chip 1700 is formed by a transparent bonding layer 2302. The LED chip 400 in solid-state light source 2500 emits, for example, blue light. Wavelength conversion chip 1700 converts a portion of the blue light to, for example, yellow light.

Figure 26:
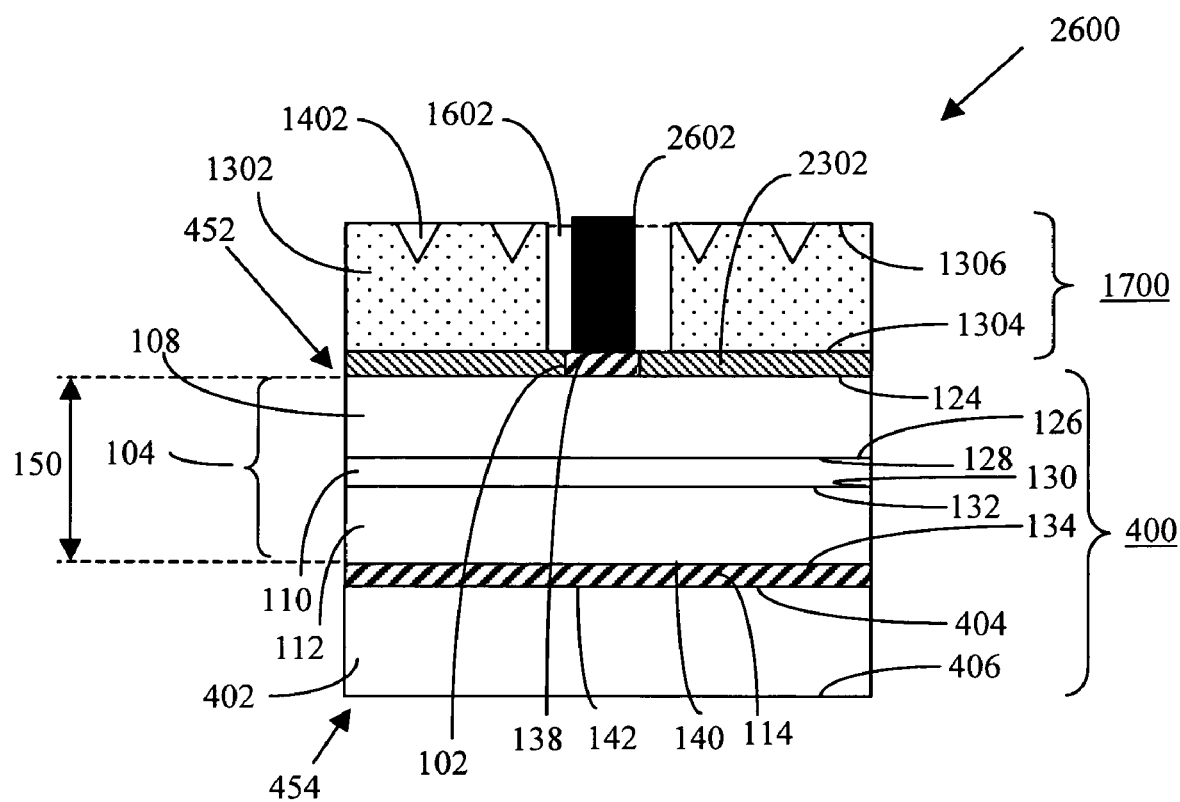
FIG. 26 is a side cross-sectional view of another embodiment of this invention that is a stack of two elements bonded together. The elements are a conventional LED chip that includes a transfer substrate and a wavelength conversion chip that includes light extraction elements and a via partially filled with an electrical conductor.

Example solid-state light source 2600 in FIG. 26 is a stack of two elements bonded together. One element is conventional LED chip 400 that includes a transfer substrate 402 and that has a multilayer semiconductor structure 104 that is grown by, for example, MOCVD. The thickness 150 of the multilayer semiconductor structure less than 5 microns. LED chip 400 is a GaN-based LED that has one electrode, the first electrode 102, on the top or first side 452 of the chip. The second element of the stack is wavelength conversion chip 1700 that is bonded to the light emitting side or first side 452 of LED chip 400. Wavelength conversion chip 1700 has an electrical interconnection means, which includes a via 1602 that passes through the wavelength conversion layer 1302. The electrical interconnection means also includes a solder bump 2602 that extends through the via and is attached to electrode 102 of the LED chip. The via and solder bump facilitate forming an electrical connection to electrode 102. The wavelength conversion layer 1302 of the chip consists of, for example, cerium-doped YAG or YAG:Ce$^{3+}$ in the form of a ceramic layer. The bond between the LED chip 400 and the wavelength conversion chip 1700 is formed by a transparent bonding layer 2302. The LED chip 400 in solid-state light source 2600 emits, for example, blue light. Wavelength conversion chip 1700 converts a portion of the blue light to, for example, yellow light.

Figure 27:
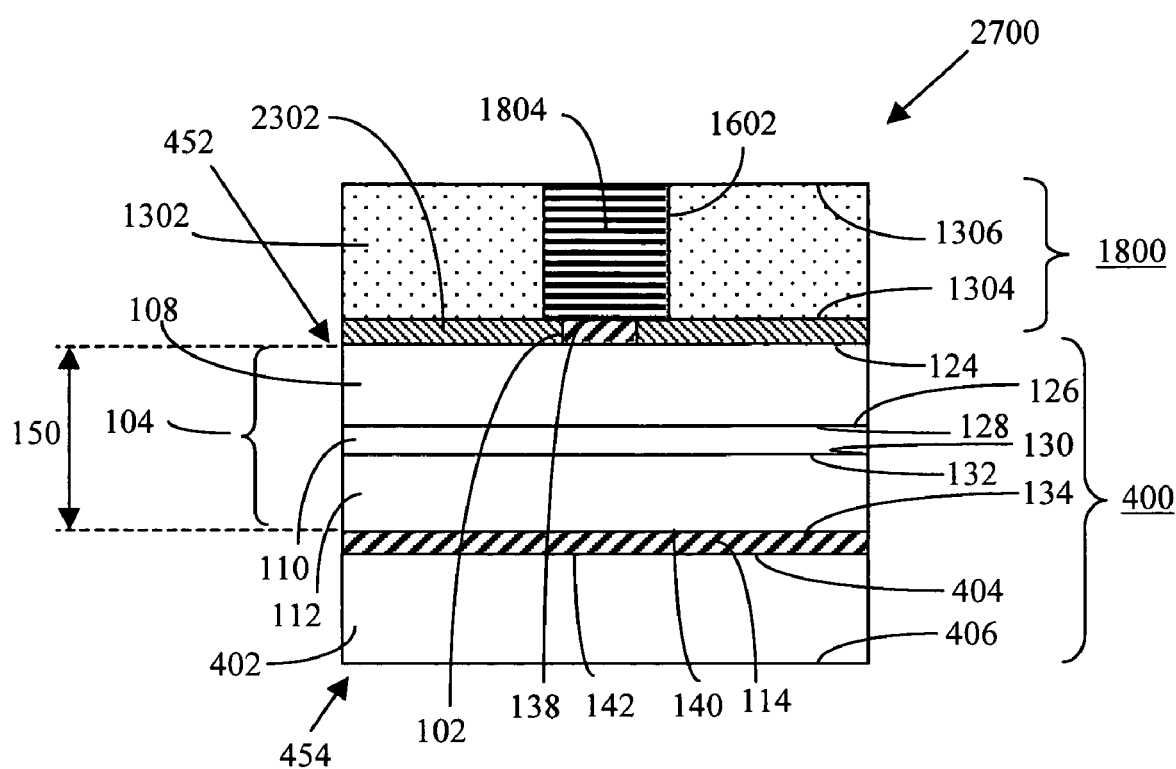
FIG. 27 is a side cross-sectional view of another embodiment of this invention that is a stack of two elements bonded together. The elements are a conventional LED chip that includes a transfer substrate and a wavelength conversion chip that includes a via filled with an electrical feedthrough.

Example solid-state light source 2700 in FIG. 27 is a stack of two elements bonded together. One element is conventional LED chip 400 that includes a transfer substrate 402 and that has a multilayer semiconductor structure 104 that is grown by, for example, MOCVD. The thickness 150 of the multilayer semiconductor structure less than 5 microns. LED chip 400 is a GaN-based LED that has one electrode 102 on the top or first side 452 of the chip. The second element of the stack is wavelength conversion chip 1800 that is bonded to the light emitting side or first side 452 of LED chip 400. Wavelength conversion chip 1800 has an electrical interconnection means, which includes via 1602 that passes through the wavelength conversion layer 1302. The electrical interconnection means also includes an electrical feedthrough 1804 that extends through via 1602 and is attached to electrode 102 of the LED chip. The feedthrough can be a metal, for example copper, aluminum, gold or a solder, or the feedthrough can be fabricated from an electrically conductive epoxy. The via and electrical feedthrough facilitate forming an electrical connection to electrode 102. The wavelength conversion layer 1302 of the chip consists of, for example, cerium-doped YAG or YAG:Ce$^{3+}$ in the form of a ceramic layer. The bond between the LED chip 400 and the wavelength conversion chip 1800 is formed by a transparent bonding layer 2302. The LED chip 400 in solid-state light source 2700 emits, for example, blue light. Wavelength conversion chip 1800 converts a portion of the blue light to, for example, yellow light.

Another embodiment of this invention is a solid-state light source that is comprised of at least one stack of elements. The elements include at least one non-conventional substrate-free LED chip and a wavelength conversion chip. The wavelength conversion chip may optionally include an electrical interconnection means. The substrate-free LED chip is defined in this specification as an LED chip that includes neither a growth substrate nor a transfer substrate. In addition, a substrate-free LED chip has at least one thick semiconductor layer (either the first doped layer or the second doped layer or both the first and second doped layers) that is at least 10 microns thick, preferably at least 15 microns thick, more preferably at least 20 microns thick and most preferably at least 25 microns thick. The multilayer semiconductor structure of the substrate-free LED is at least 10 microns thick, preferably at least 20 microns thick, more preferably at least 30 microns thick. The thick layer or layers can be grown by any standard technique, but preferably the one or more thick semiconductor layers are grown by HYPE. Examples of this embodiment that include just one stack of elements are illustrated in FIGS. 28-32.

Figure 28:
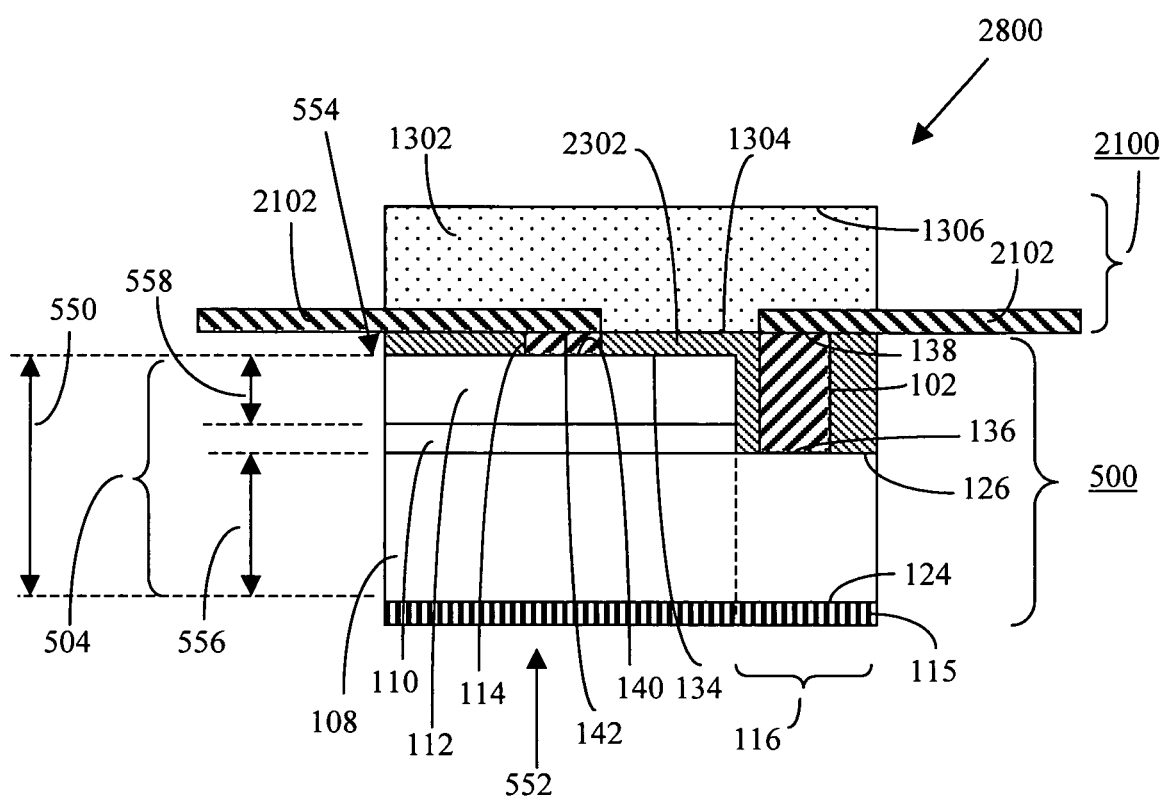
FIG. 28 is a side cross-sectional view of another embodiment of this invention that is a stack of two elements bonded together. The first element is a non-conventional LED substrate-free LED chip that has neither a transfer substrate nor a growth substrate and includes a thick doped layer. The second element is a wavelength conversion chip that includes two electrodes embedded into one surface of the chip.
Figure 29:
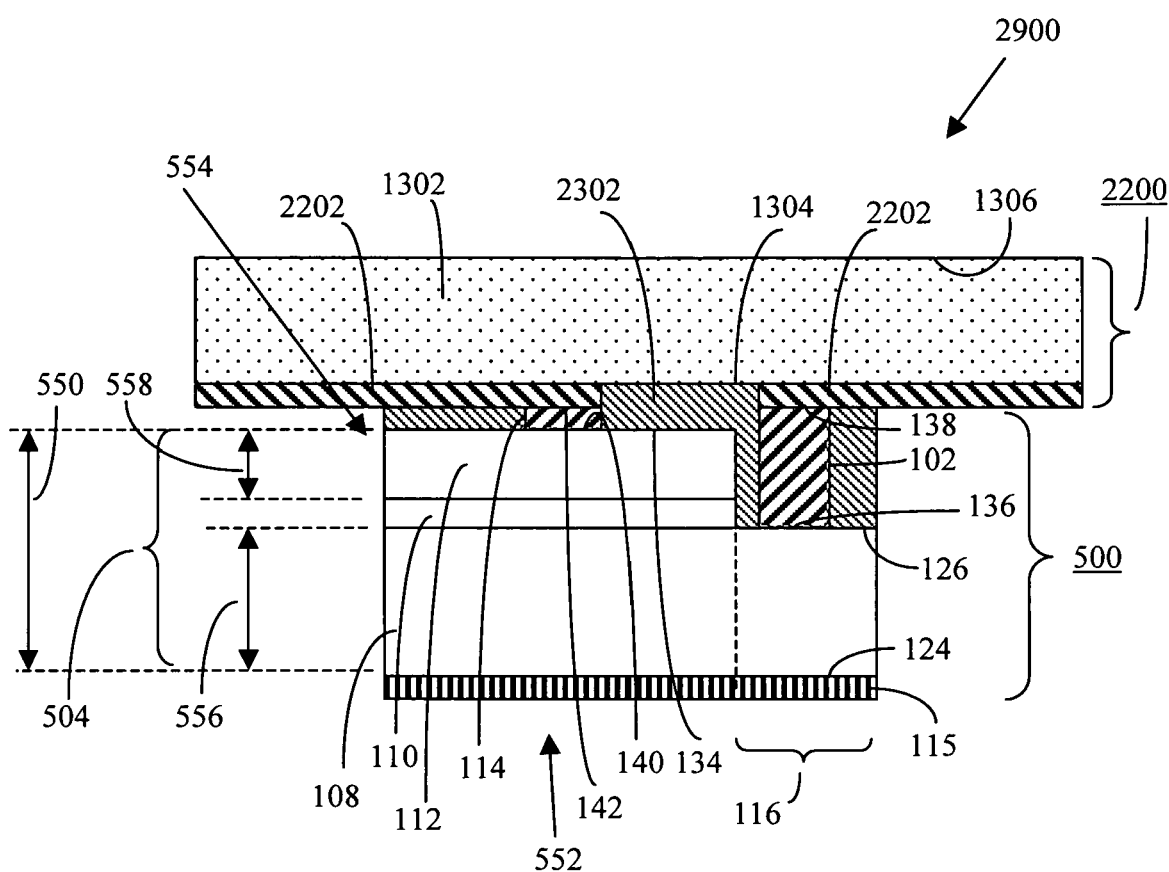
FIG. 29 is a side cross-sectional view of another embodiment of this invention that is a stack of two elements bonded together. The first element is a substrate-free LED chip that has neither a transfer substrate nor a growth substrate and includes a thick doped layer. The second element is a wavelength conversion chip that includes two electrodes fabricated onto one surface of the chip.

First, the examples in FIGS. 28 and 29 include one stack of elements where the substrate-free LED chips have two electrodes on the top side.

Example solid-state light source 2800 in FIG. 28 is a stack of two elements bonded together. One element is a substrate-free LED chip 500 that does not include a growth substrate or a transfer substrate. LED chip 500 has a first doped layer 108 that is at least 10 microns thick and that is adjacent to the bottom or first side 552 of the chip. The thick first doped layer is grown, for example, by HYPE. LED chip 500 is a GaN-based LED that has both the first electrode 102 and the second electrode 114 on the top or second side 554 of the chip. The second element of the stack is wavelength conversion chip 2100 that is bonded to the light emitting side or second side 554 of LED chip 500. Wavelength conversion chip 2100 has an electrical interconnection means, which includes two electrodes 2102 embedded in surface 1304 of the wavelength conversion layer 1302. The wavelength conversion layer 1302 of the chip consists of, for example, cerium-doped YAG or YAG:Ce$^{3+}$ in the form of a ceramic layer. The bond between the LED chip 500 and the wavelength conversion chip 2100 is formed by a transparent bonding layer 2302. The LED chip 500 in solid-state light source 2800 emits, for example, blue light. Wavelength conversion chip 2100 converts a portion of the blue light to, for example, yellow light.

Example solid-state light source 2900 in FIG. 29 is a stack of two elements bonded together. One element is a substrate-free LED chip 500 that does not include a growth substrate or a transfer substrate. LED chip 500 has a first doped layer 108 that is at least 10 microns thick and that is adjacent to the bottom or first side 552 of the chip. The thick first doped layer is grown, for example, by HYPE. LED chip 500 is a GaN-based LED that has both the first electrode 102 and the second electrode 114 on the top or second side 554 of the chip. The second element of the stack is wavelength conversion chip 2200 that is bonded to the light emitting side or second side 554 of LED chip 500. Wavelength conversion chip 2200 has an electrical interconnection means, which includes two electrodes 2202 fabricated onto surface 1304 of the wavelength conversion layer 1302. The wavelength conversion layer 1302 of the chip consists of, for example, cerium-doped YAG or YAG:Ce$^{3+}$ in the form of a ceramic layer. The bond between the LED chip 500 and the wavelength conversion chip 2200 is formed by a transparent bonding layer 2302. The LED chip 500 in solid-state light source 2900 emits, for example, blue light. Wavelength conversion chip 2200 converts a portion of the blue light to, for example, yellow light.

Figure 30:
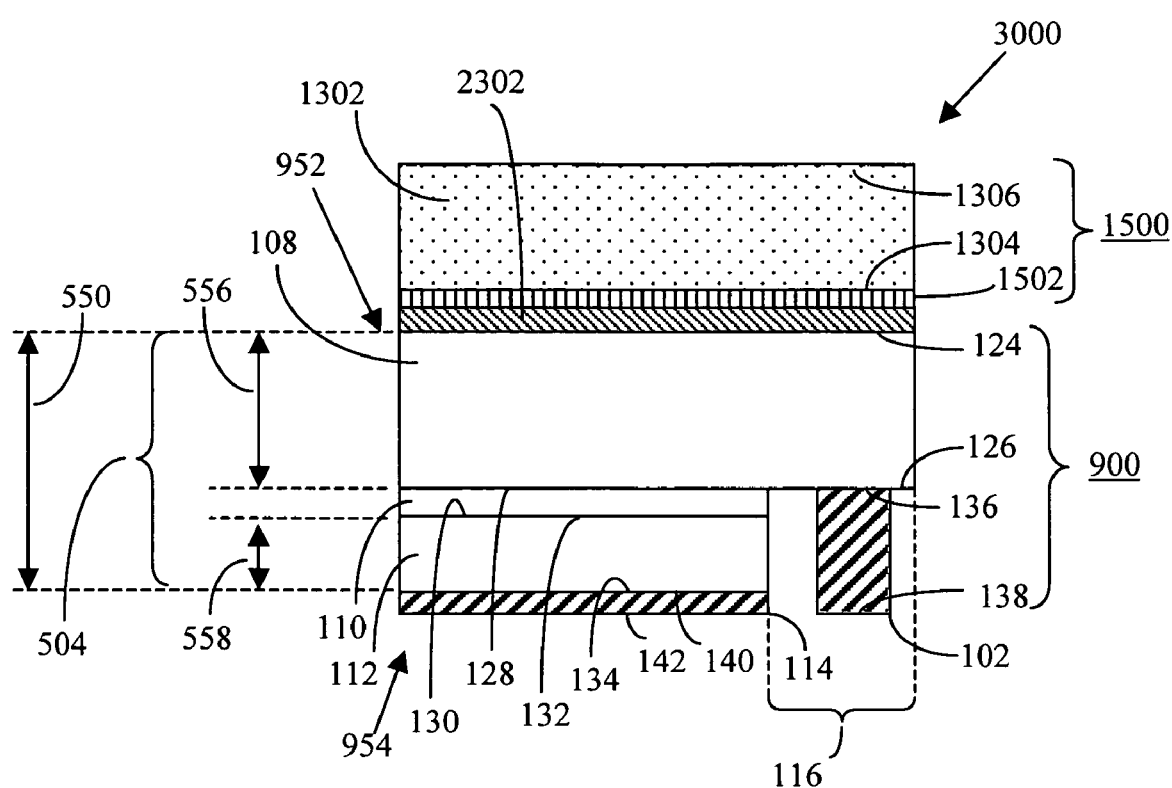
FIG. 30 is a side cross-sectional view of another embodiment of this invention that is a stack of two elements bonded together. The first element is a substrate-free LED chip that has neither a transfer substrate nor a growth substrate and includes a thick doped layer. The second element is a wavelength conversion chip that includes a dichroic layer.
Figure 31:
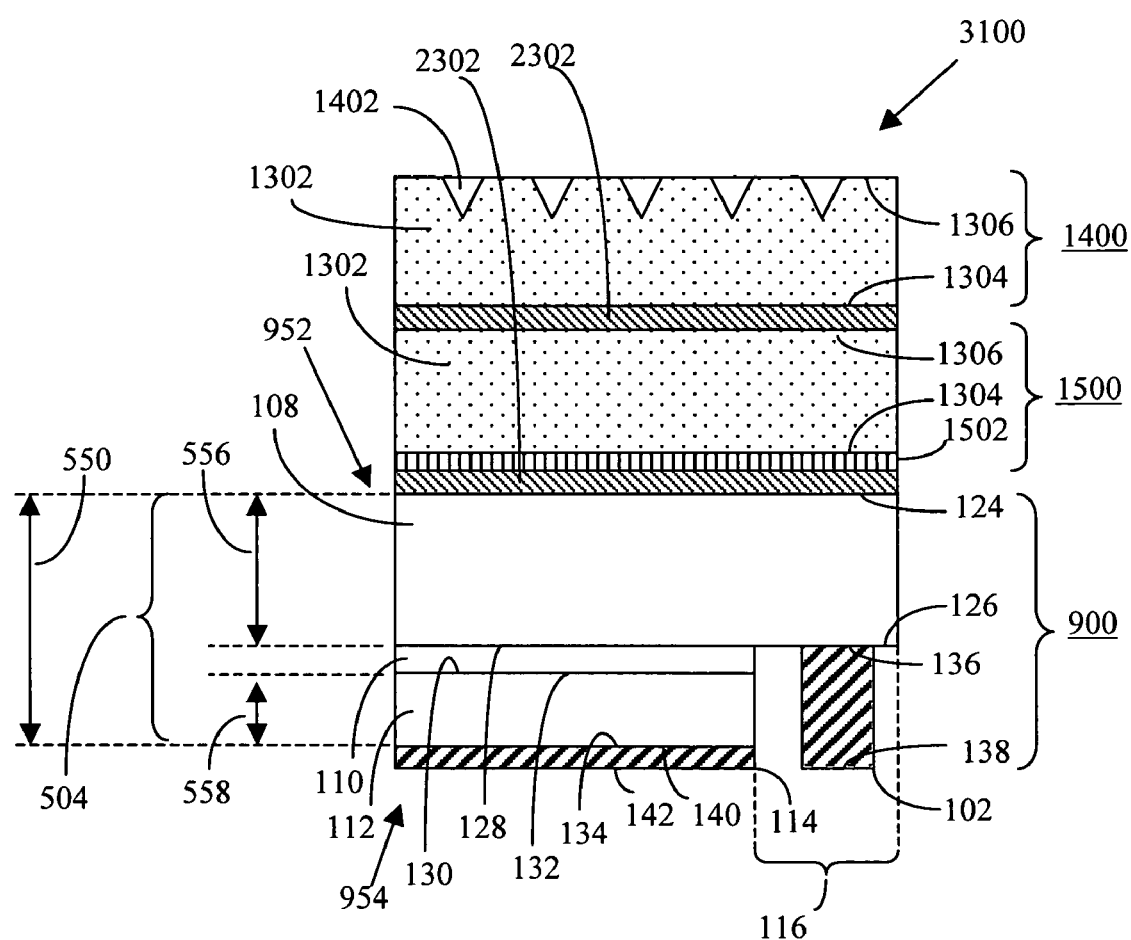
FIG. 31 is a side cross-sectional view of another embodiment of this invention that is a stack of three elements bonded together. The first element is a substrate-free LED chip that has neither a transfer substrate nor a growth substrate and includes a thick doped layer. The second element is a wavelength conversion chip that includes a dichroic layer. The third element is a wavelength conversion chip that includes light extraction elements.

Next, the examples in FIGS. 30 and 31 include one stack of elements where the substrate-free LED chips have two electrodes on the bottom side.

Example solid-state light source 3000 in FIG. 30 is a stack of two elements bonded together. One element is a substrate-free LED chip 900 that does not include a growth substrate or a transfer substrate. LED chip 900 has a first doped layer 108 that is at least 10 microns thick and that is adjacent to the top or first side 952 of the chip. The thick first doped layer is grown, for example, by HYPE. LED chip 900 is a GaN-based LED that has both the first electrode 102 and the second electrode 114 on the bottom or second side 954 of the chip. The second element of the stack is wavelength conversion chip 1500 that is bonded to the light emitting side or first side 954 of LED chip 900. Wavelength conversion chip 1500 does not have an electrical interconnection means. Wavelength conversion chip 1500 does include an optional dichroic layer 1502. A dichroic layer is a layer that transmits light of one wavelength range and reflects light of another wavelength range. If, for example, LED 900 emits blue light and the wavelength conversion chip 1500 converts a portion of the blue light into yellow light, then the dichroic layer 1502 is designed to transmit the blue light emitted by the LED chip and reflect the yellow converted light emitted by the wavelength conversion chip. The wavelength conversion layer 1302 of the wavelength conversion chip consists of, for example, cerium-doped YAG or YAG:Ce$^{3+}$ in the form of a ceramic layer. The bond between the LED chip 900 and the wavelength conversion chip 1500 is formed by a transparent bonding layer 2302. The LED chip 900 in solid-state light source 3000 emits, for example, blue light. Wavelength conversion chip 1500 converts a portion of the blue light to, for example, yellow light.

Solid-state light source 3100 in FIG. 31 is similar to solid-state light source 3000 in FIG. 30 except that solid-state light source 3100 includes a third element in the stack. Example solid-state light source 3100 in FIG. 31 is a stack of three elements bonded together. One element is a substrate-free LED chip 900 that does not include a growth substrate or a transfer substrate. LED chip 900 has a first doped layer 108 that is at least 10 microns thick and that is adjacent to the top or first side 952 of the chip. The thick first doped layer is grown, for example, by HYPE. LED chip 900 is a GaN-based LED that has both first electrode 102 and second electrode 114 on the bottom or second side 954 of the chip. The second element of the stack is wavelength conversion chip 1500 that is bonded to the light emitting side or first side 954 of LED chip 900. Wavelength conversion chip 1500 does not have an electrical interconnection means. Wavelength conversion chip 1500 does include an optional dichroic layer 1502. If, for example, LED 900 emits blue light and the wavelength conversion chip 1500 converts a portion of the blue light into yellow light, then the dichroic layer 1502 is designed to transmit the blue light emitted by the LED chip and reflect the yellow converted light emitted by the wavelength conversion chip. The wavelength conversion layer 1302 of the wavelength conversion chip 1500 consists of, for example, cerium-doped YAG or YAG:Ce$^{3+}$ in the form of a ceramic layer. The bond between the LED chip 900 and the wavelength conversion chip 1500 is formed by a transparent bonding layer 2302.

The third element in the stack is wavelength conversion chip 1400 that is bonded to the top surface 1306 of wavelength conversion chip 1500 by a second bonding layer 2302. The wavelength conversion chip 1400 includes light extraction elements 1402 to improve light extraction from wavelength conversion chip 1400 and solid-state light source 3100. The wavelength conversion layer 1302 of wavelength conversion chip 1400 consists of, for example, a red light emitting phosphor in the form of a ceramic layer. The LED chip 900 in solid-state light source 3100 emits, for example, blue light of a first wavelength range. Wavelength conversion chip 1500 converts a first portion of the blue light to, for example, yellow light of a second wavelength range. However, some of the blue light passes through the wavelength conversion chip 1500. Wavelength conversion chip 1400 converts a second portion of the blue light to, for example, red light of a third wavelength range.

The following examples in FIGS. 32 to 41 include one at least one stack of elements where the substrate-free LED chips have one electrode on the top side and one electrode on the bottom side.

Figure 32:
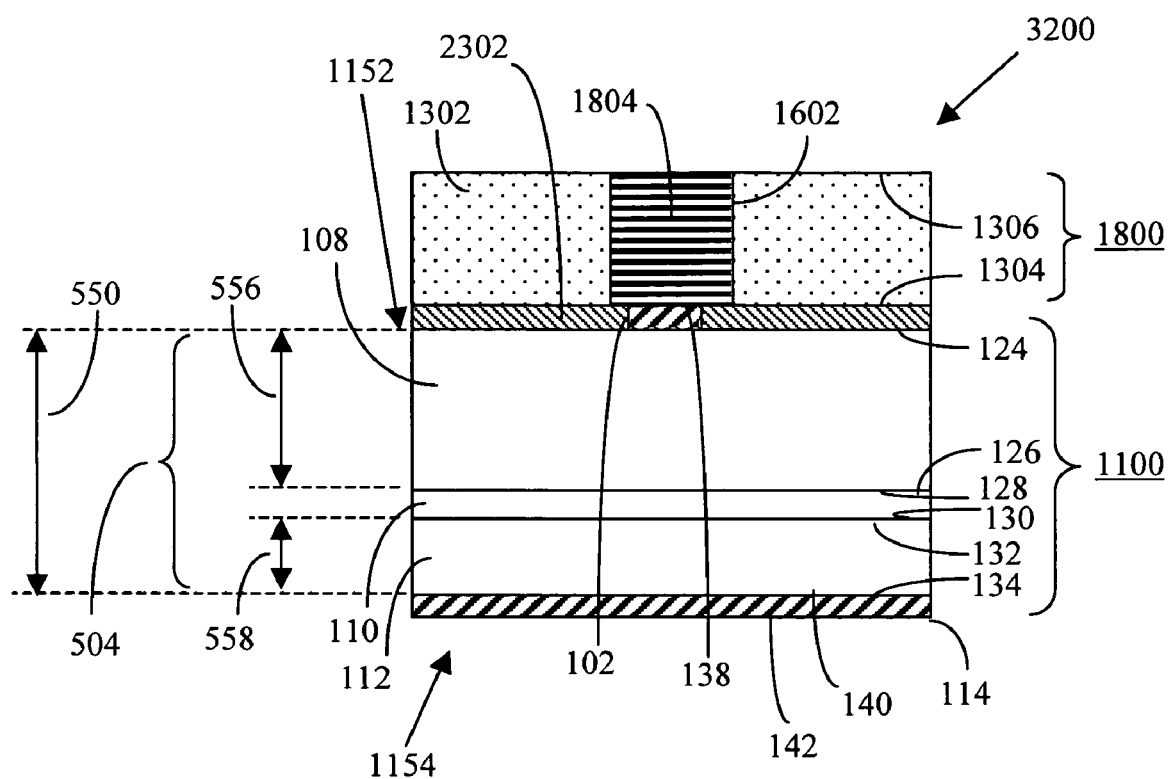
FIG. 32 is a side cross-sectional view of another embodiment of this invention that is a stack of two elements bonded together. The first element is a substrate-free LED chip that has neither a transfer substrate nor a growth substrate and includes a thick doped layer. The second element is a wavelength conversion chip that includes a via that is filled with an electrically conducting feedthrough.

Example solid-state light source 3200 in FIG. 32 is a stack of two elements bonded together. One element is a substrate-free LED chip 1100 that does not include a growth substrate or a transfer substrate. LED chip 1100 has a first doped layer 108 that is at least 10 microns thick and that is adjacent to the top or first side 1152 of the chip. The thick first doped layer is grown, for example, by HYPE. LED chip 1100 is a GaN-based LED that has first electrode 102 on the top or first side 1152 of the chip and the second electrode 114 on the bottom or second side 1154 of the chip. The bottom electrode reflects light and substantially covers the bottom surface of the LED. The second element of the stack is wavelength conversion chip 1800 that is bonded to the light emitting side or first side 1154 of LED chip 1100. Wavelength conversion chip 1800 has via 1602 that is filled with a feedthrough 1804. The feedthrough is attached to the first electrode 102 by soldering or other standard electrical bonding technique and facilitates the formation of electrical connections through the wavelength conversion chip to the first electrode 102. The wavelength conversion layer 1302 of the wavelength conversion chip consists of, for example, cerium-doped YAG or YAG:Ce$^{3+}$ in the form of a ceramic layer. The bond between the LED chip 1100 and the wavelength conversion chip 1800 is formed by a transparent bonding layer 2302. The LED chip 1100 in solid-state light source 3200 emits, for example, blue light. Wavelength conversion chip 1800 converts a portion of the blue light to, for example, yellow light.

FIGS. 33A, 33B, 34A and 34B illustrate examples of solid-state light sources that include a plurality of stacks, where the elements in each stack include an LED chip and at least one wavelength conversion chip. The particular examples in FIGS. 33A, 33B, 34A and 34B include four stacks of elements. Each stack is a solid-state light source 3200 that is shown in FIG. 32 and that includes one LED chip and one wavelength conversion chip bonded together.

Figure 33A:
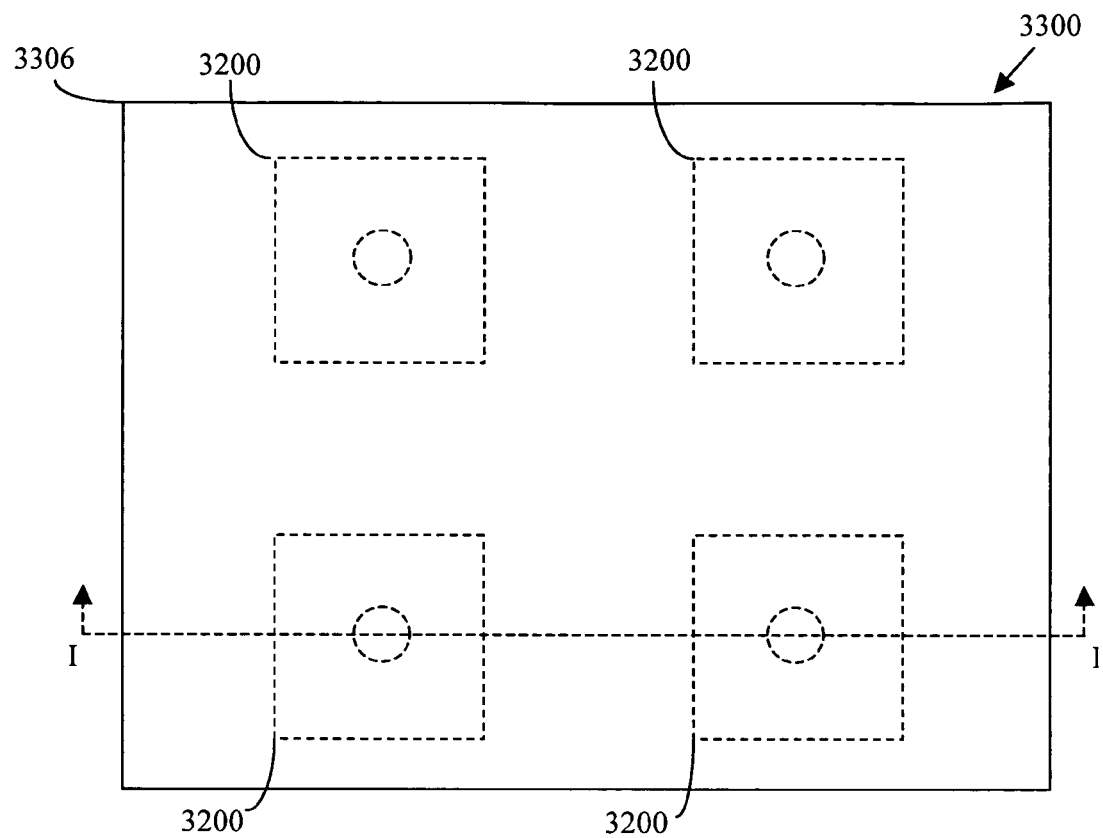
FIGS. 33A and 33B illustrate another embodiment of this invention that includes an array of four stacks of elements sandwiched between a substrate and a superstrate. The substrate has a light-reflecting, electrically conducting layer and the superstrate has a transparent, electrically-conducting layer.
Figure 33B:
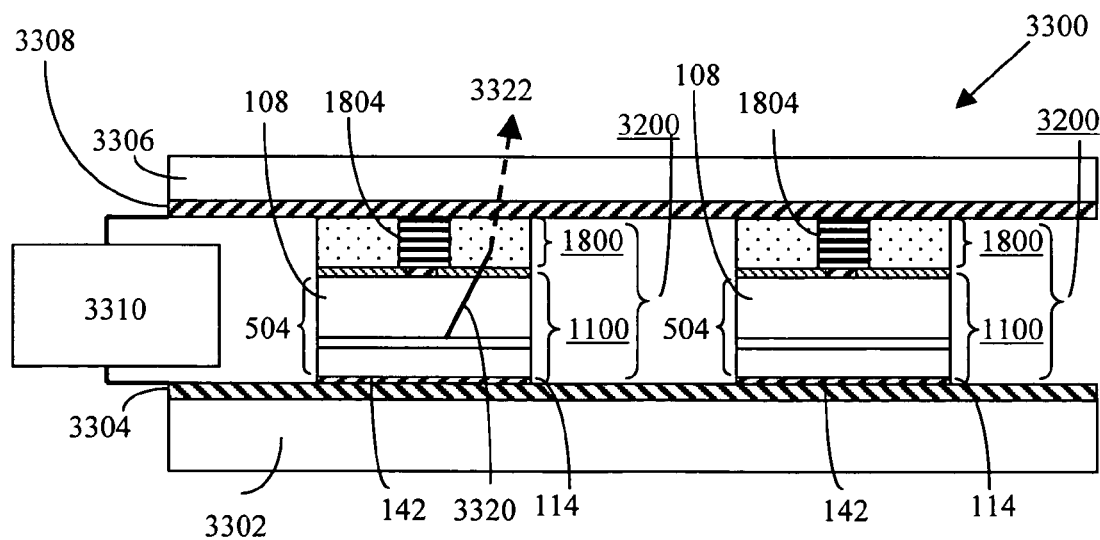

FIGS. 33A and 33B illustrate solid-state light source 3300 that includes an array of four spatially-separated, solid-state light sources 3200 positioned between a substrate 3302 and an optically transparent superstrate 3306. FIG. 33A is a top plan view. FIG. 33B is a side cross-sectional view along the I-I plane illustrated in FIG. 33A. Substrate 3302 includes a reflecting layer 3304 on the top surface of the substrate. The reflecting layer is also an electrical conductor that is attached to the second electrodes 114 of the solid-state light sources and is connected to a DC current source 3310. The reflecting layer can be, for example, a metal such as silver or aluminum.

The optically transparent superstrate includes a transparent electrically conducting layer 3308 on the bottom surface of the superstrate. The electrically conducting layer connects the solid-state light sources to the direct current (DC) current source. The electrically conducting layer can be a transparent conducting oxide (TCO) such as, for example, indium-tin oxide, indium-doped zinc oxide or aluminum-doped zinc oxide. When a DC current is applied to the reflecting layer 3304 and the transparent electrically conducting layer 3308, the solid-state light sources emit light. For example, one of the LED chips 1100 emits internally generated light ray light ray 3320 of a first wavelength range. Light ray 3320 is converted by wavelength conversion chip 1800 into light ray 3322 of a second wavelength range.

Figure 34A:
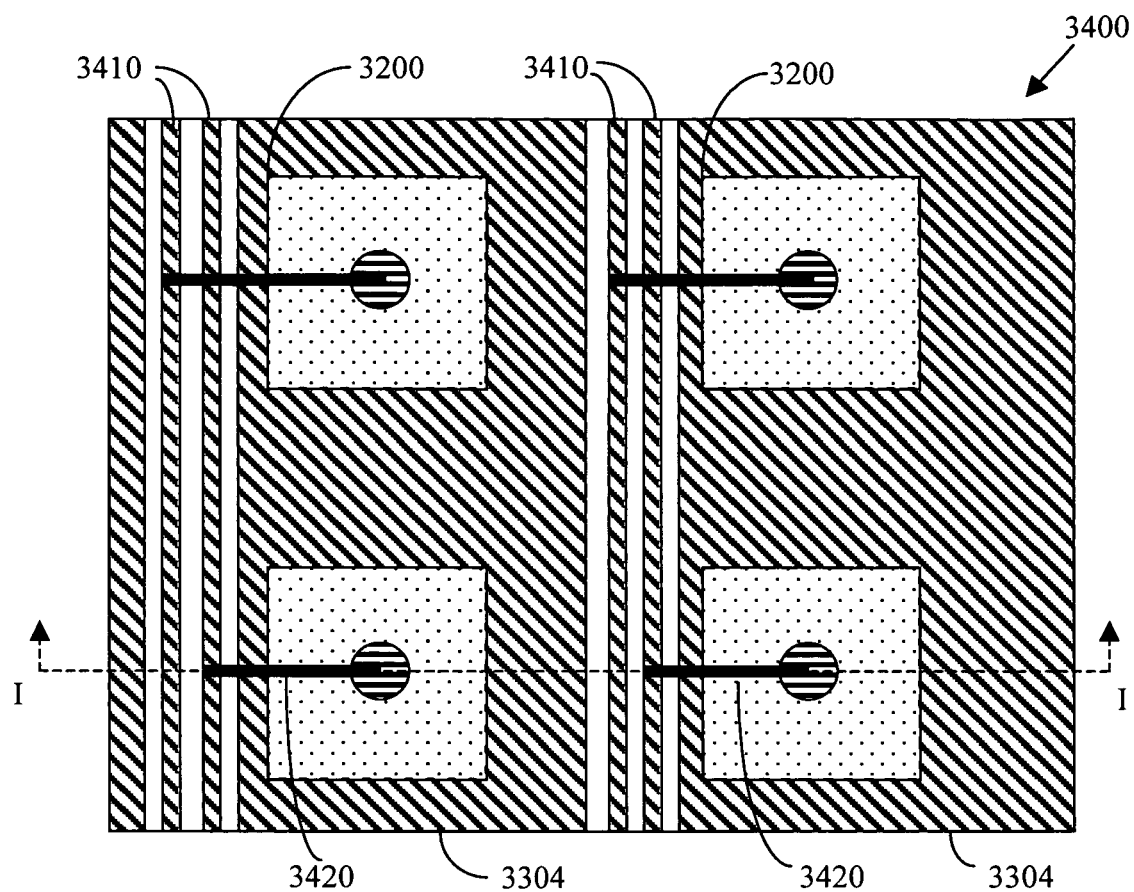
FIGS. 34A and 34B illustrate another embodiment of this invention that includes an array of four stacks of elements attached to a substrate. The substrate has a light-reflecting, electrically conducting layer that is patterned into several electrically conducting pathways.
Figure 34B:
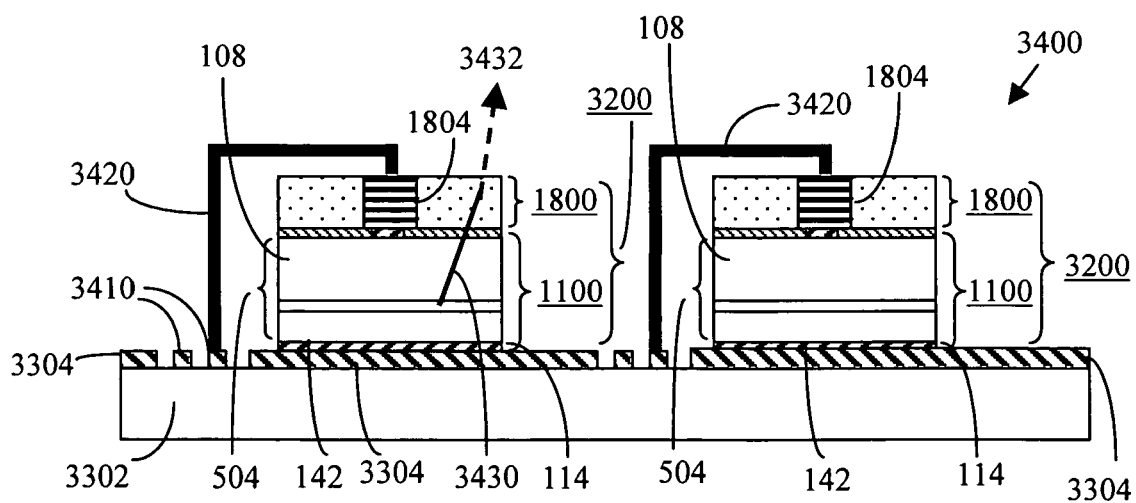

FIGS. 34A and 34B illustrate solid-state light source 3400 that includes an array of four spatially-separated, solid-state light sources 3200 positioned on a substrate 3302. FIG. 34A is a top plan view. FIG. 34B is a side cross-sectional view along the I-I plane illustrated in FIG. 34A. Substrate 3302 includes a reflecting layer 3304 on the top surface of the substrate. The reflecting layer is also an electrical conductor and can be, for example, a metal such as silver or aluminum. The reflecting layer is patterned into several sections by standard photolithographic processes. Portions of the reflecting layer 3304 are attached to the bottom second electrodes 114 of the solid-state light sources. Other narrow strips 3410 of the patterned reflecting layer 3304 are attached to the top electrodes of the solid-state light sources 3200 by electrical connectors or wires 3420. In this illustrative example, each top electrode is attached to a separate strip 3410 of the reflective layer 3304, allowing each light source to be controlled individually. When properly connected to a DC current source, each solid-state light emits light. For example, one of the light sources 3200 emits internally generated light ray light ray 3430 of a first wavelength range. Light ray 3430 is converted by a wavelength conversion chip 1800 into light ray 3432 of a second wavelength range. Since the light sources 3200 can be controlled individually, solid-state light source 3400 can be utilized as a display, where each light source 3200 is a pixel or picture element of the display.

Another embodiment of this invention is a solid-state light source that includes at least one stack of elements. The elements include a substrate-free LED chip and at least two wavelength conversion chips. The LED chip has a first side and an opposing second side. The first wavelength conversion chip is bonded to the first side of the LED chip. The second wavelength conversion chip is bonded to the second side of the LED chip so that the stack of elements includes an LED chip interposed between the two wavelength conversion chips. Each wavelength conversion chip may optionally include an electrical interconnection means. The substrate-free LED chip is defined in this specification as an LED chip that includes neither a growth substrate nor a transfer substrate. In addition, a substrate-free LED chip has at least one thick semiconductor layer (either the first doped layer or the second doped layer or both the first and second doped layers) that is at least 10 microns thick, preferably at least 15 microns thick, more preferably at least 20 microns thick and most preferably at least 25 microns thick. The multilayer semiconductor structure of the substrate-free LED is at least 10 microns thick, preferably at least 20 microns thick and more preferably at least 30 microns thick. The thick layer or layers can be grown by any standard technique, but preferably the one or more thick semiconductor layers are grown by HYPE.

Examples of solid-state light sources are illustrated in FIGS. 35-41 that include at least one stack of elements, where the stacks include an LED chip bonded between two wavelength conversion chips. Light is emitted from both the top and the bottom sides of the light sources.

Figure 35A:
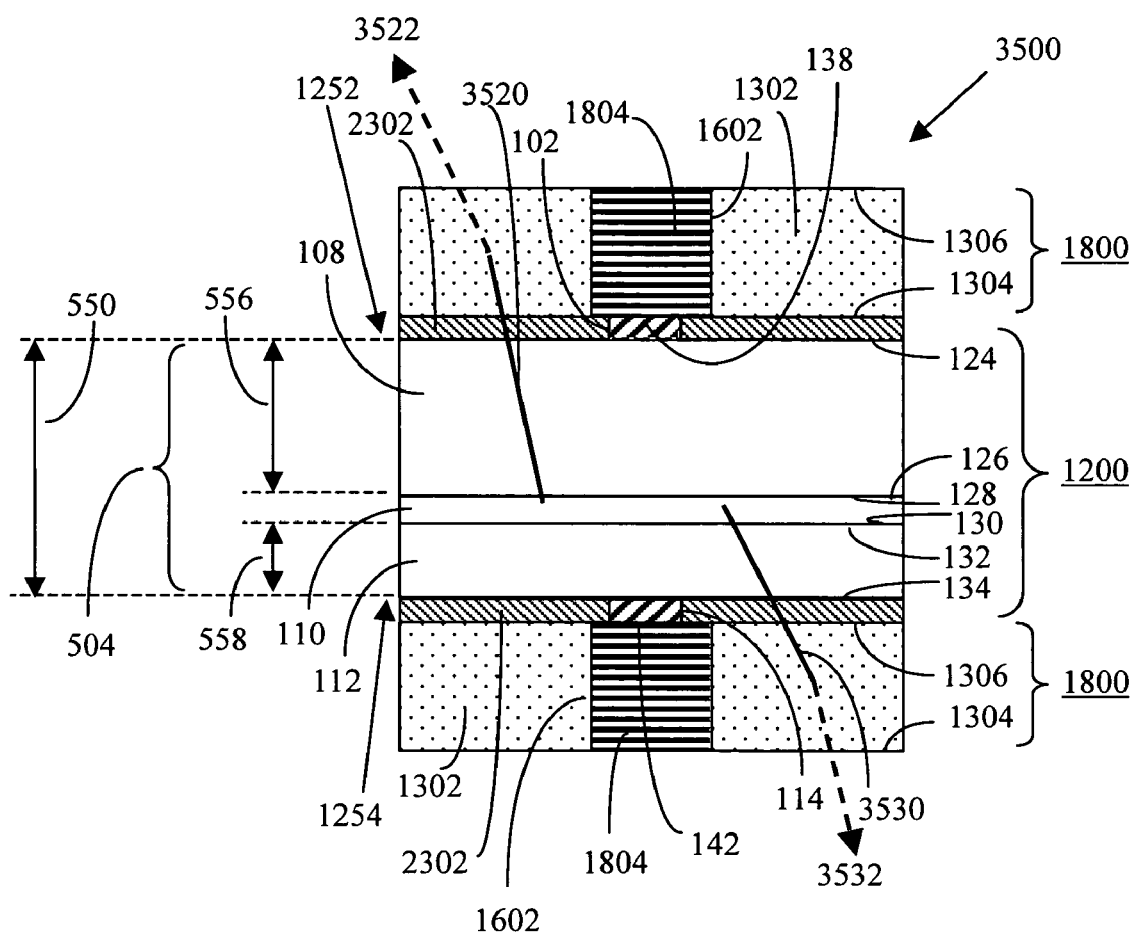
FIG. 35A is a side cross-sectional view of an embodiment of this invention that is a stack of three elements bonded together. The three elements include a non-conventional substrate-free LED chip bonded between two wavelength conversion chips. The LED emits light in all directions.

Solid-state light source 3500 illustrated in a side cross-sectional view in FIG. 35A is a stack of three elements, one LED chip 1200 and two wavelength conversion chips 1800. LED chip 1200 and wavelength conversion chip 1800 are described above. Wavelength conversion chips 1800 include vias 1602 that are filled with electrical feedthroughs 1804. A first wavelength conversion chip 1800 is bonded to the first side 1252 of LED chip 1200. The bond between the LED chip 1200 and the first wavelength conversion chip 1800 is formed by a transparent bonding layer 2302. A second wavelength conversion chip 1800 is bonded to the second side 1254 of LED chip 1200 by a second transparent bonding layer 2302. The wavelength conversion chips are shown as having the same area as the LED chip. However, the area of the wavelength conversion chip can also be greater or less than the area of the LED chip. Light is emitted from both the top side and the bottom side of solid-state light source 3500. Example light rays illustrate light exiting from the light source. Internally generated light ray 3520 of a first wavelength range is emitted by the active region 110 toward surface 124. Internally generated light ray 3520 enters the upper wavelength conversion chip 1800 and is converted into light ray 3522 of a second wavelength range. Light ray 3522 exits the top surface of the solid-state light source. Internally generated light ray 3530 of a first wavelength range is emitted by the active region 110 toward surface 134. Internally generated light ray 3530 enters the bottom wavelength conversion chip 1800 and is converted into light ray 3532 of a second wavelength range. Light ray 3532 exits the bottom surface of the solid-state light source.

Figure 35B:
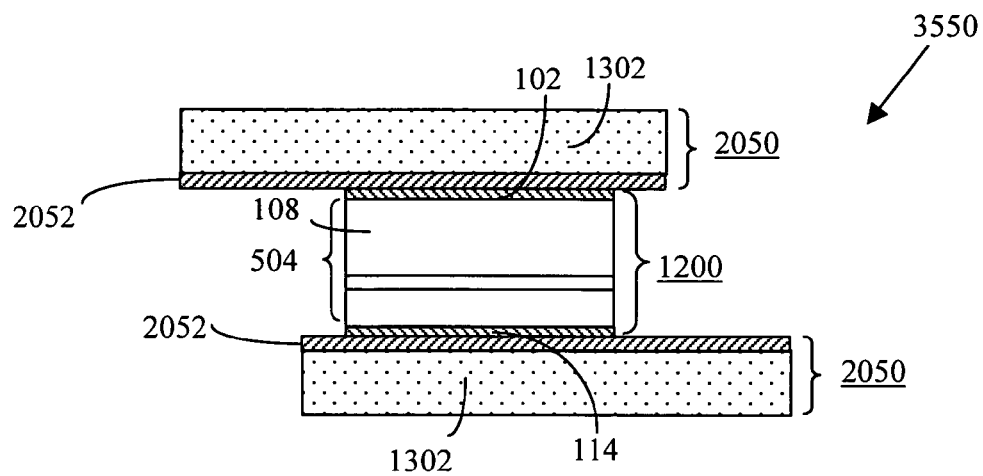
FIG. 35B is a side cross-sectional view of an embodiment of this invention that is a stack of three elements bonded together. The three elements include a substrate-free LED chip bonded between two wavelength conversion chips. The substrate-free LED chip has top and bottom transparent electrodes. Both wavelength conversion chips have transparent electrodes and are larger in area than the substrate-free LED chip.
Figure 35C:
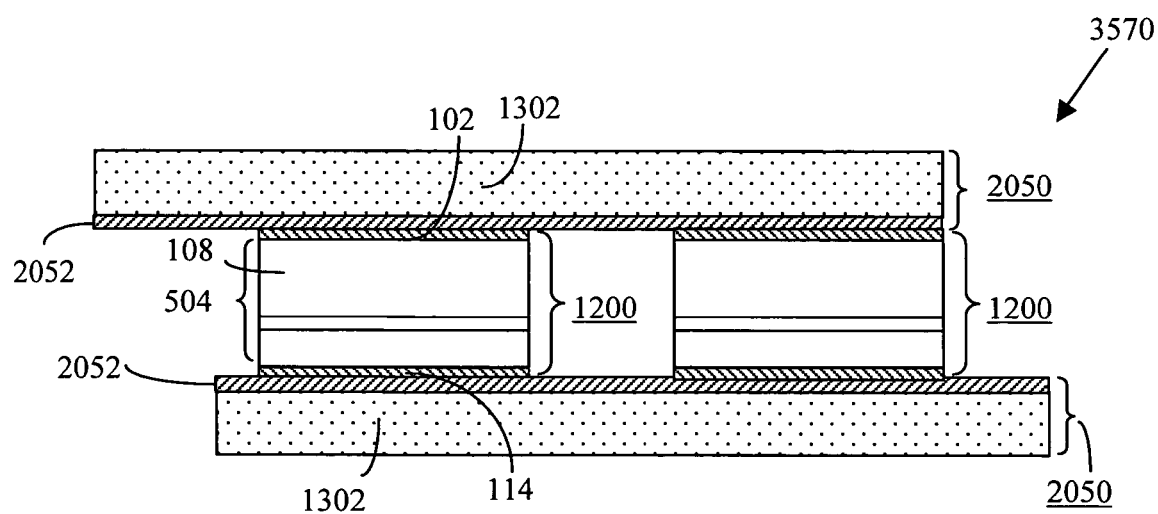
FIG. 35C is a side cross-sectional view of an embodiment of this invention that is a stack of elements bonded together. The elements include two substrate-free LED chips bonded between two wavelength conversion chips. The substrate-free LED chips have top and bottom transparent electrodes. Both wavelength conversion chips have transparent electrodes and are larger in area than the substrate-free LED chip.

Examples of solid-state light sources that have transparent electrodes are illustrated in FIGS. 35B and 35C. Solid-state light source 3550 is illustrated in a side cross-sectional view in FIG. 35B. Solid-state light source 3550 is a stack of three elements where one LED chip 1200 is bonded between two wavelength conversion chips 2050. LED chip 1200 and wavelength conversion chips 2050 are described above. In this example, LED chip 1200 has transparent electrodes 102 and 114. Each wavelength conversion chip 2050 has a transparent electrode 2052. The transparent electrodes provide the electrical interconnections to the LED chip. The transparent electrodes can be fabricated from transparent conductive oxides. For example, the transparent conductive oxide electrodes can be fabricated from aluminum-doped zinc oxide. In this example, the area of each wavelength conversion chips is larger than the area of the LED chip. Light is emitted from both the top side and the bottom side of solid-state light source 3550.

Solid-state light sources may also be constructed with two or more LEDs bonded between two wavelength conversion chips. Solid-state light source 3570 having two LED chips is illustrated in a side cross-sectional view in FIG. 35C. Solid-state light source 3570 is a stack of four elements, two LED chips 1200 and two wavelength conversion chips 2050. LED chips 1200 and wavelength conversion chips 2050 are described above. Each LED chip 1200 has transparent electrodes 102 and 114. Each wavelength conversion chip 2050 has a transparent electrode 2052. The transparent electrodes provide the electrical interconnections to the LED chips. The transparent electrodes can be fabricated from transparent conductive oxides. For example, the transparent conductive oxide electrodes can be fabricated form aluminum-doped zinc oxide. In this example, the area of each wavelength conversion chip is larger than the area of the two LED chips. Light is emitted from both the top side and the bottom side of solid-state light source 3550.

Arrays of solid-state light sources that include stacks of elements can be electrically connected in series, parallel or anti-parallel configurations. Anti-parallel configurations are desirable if the current source is an alternating current (AC) source. Arrays of three or more solid-state light sources can also be connected in combinations of series, parallel or anti-parallel configurations. For example, with an array of four light sources, a first pair of sources can be connected in series, a second pair can also be connected in series and the two pairs can be connected in parallel.

Figure 36:
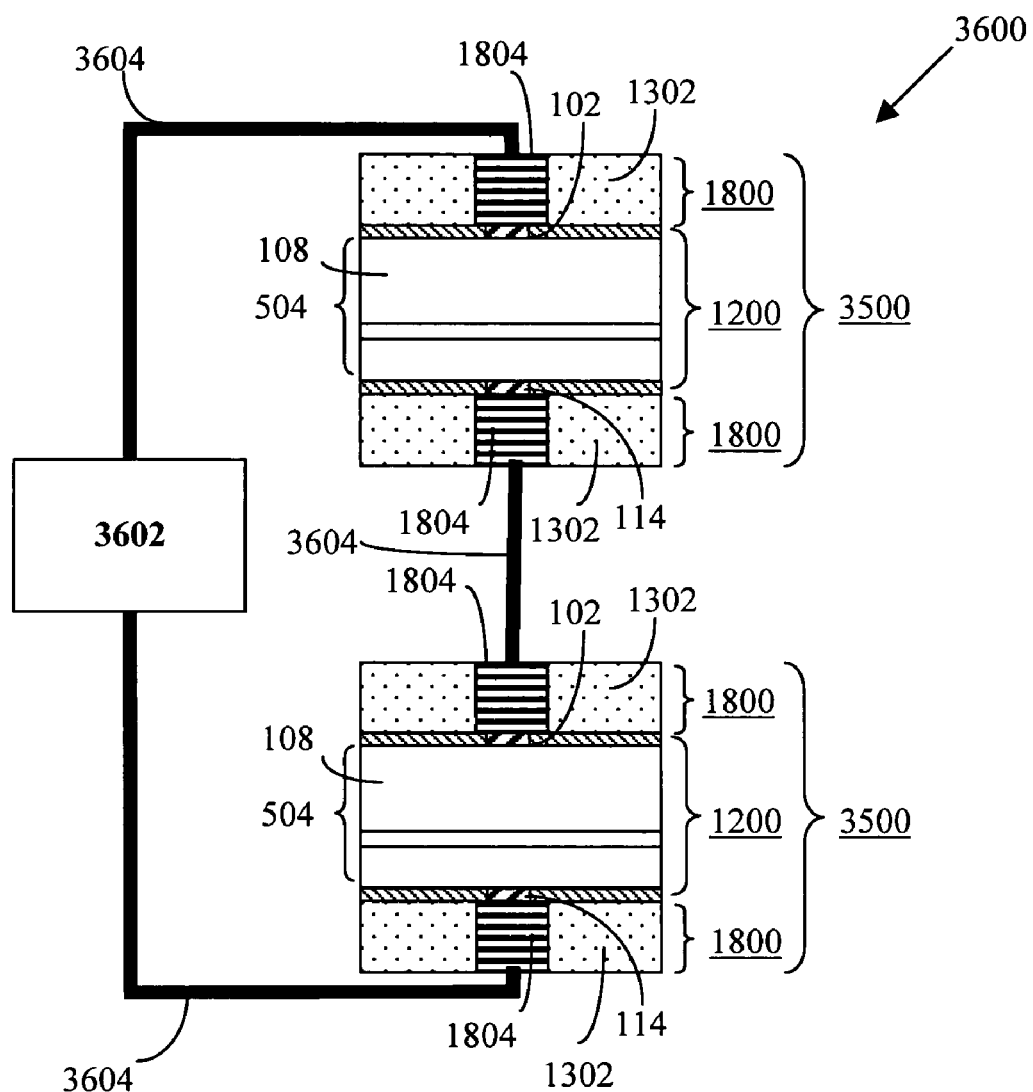
FIG. 36 is a side cross-sectional view of an embodiment of this invention that includes two solid-state light sources that are electrically connected in series. The two solid-state light sources each include a stack of three elements, a substrate-free LED chip and two wavelength conversion chips.

FIG. 36 is a side cross-sectional view of solid-state light source 3600 that illustrates a linear array of two solid-state light sources 3500 connected in series to a DC current source 3602 by electrical connections or wires 3604. Light sources 3500 have been described above.

Figure 37:
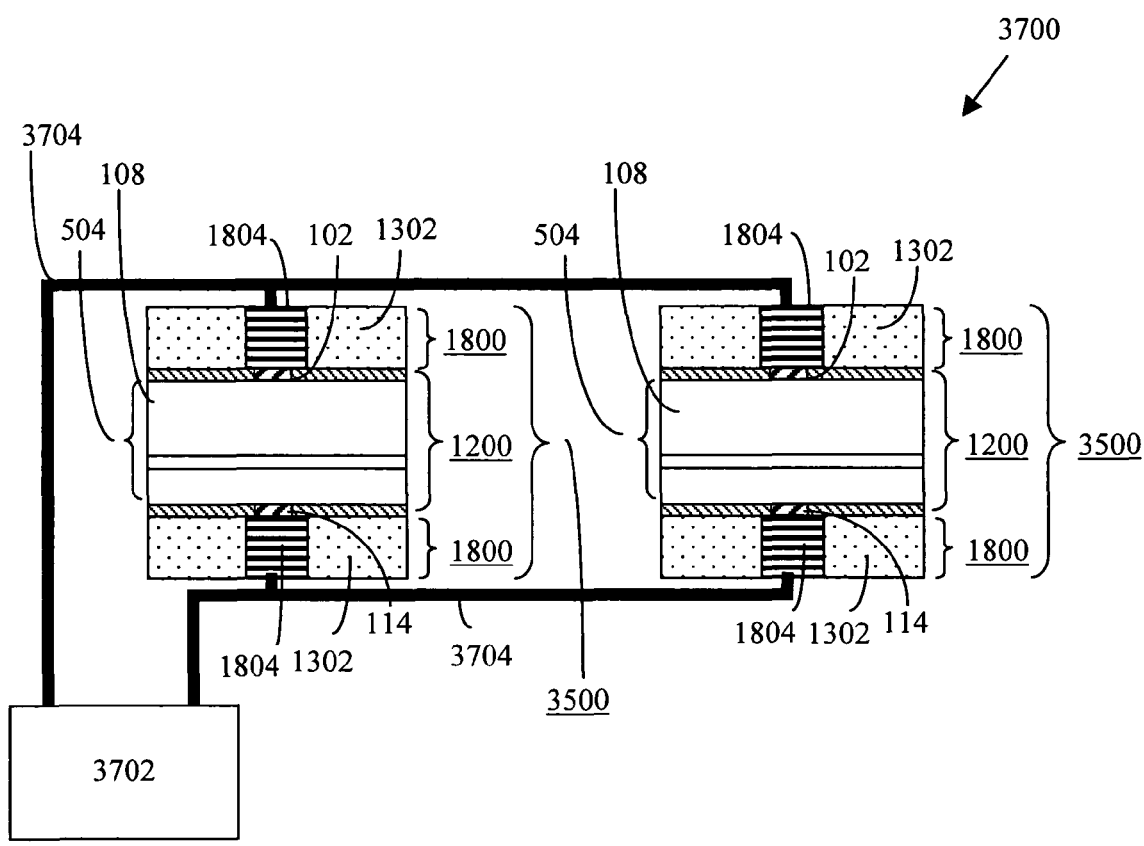
FIG. 37 is a side cross-sectional view of an embodiment of this invention that includes two solid-state light sources that are electrically connected in parallel. The two solid-state light sources each include a stack of three elements, a substrate-free LED chip and two wavelength conversion chips.

FIG. 37 is a side cross-sectional view of solid-state light source 3700 that illustrates a linear array of two solid-state light sources 3500 connected in parallel to a DC current source 3702 by electrical connections or wires 3704.

Figure 38:
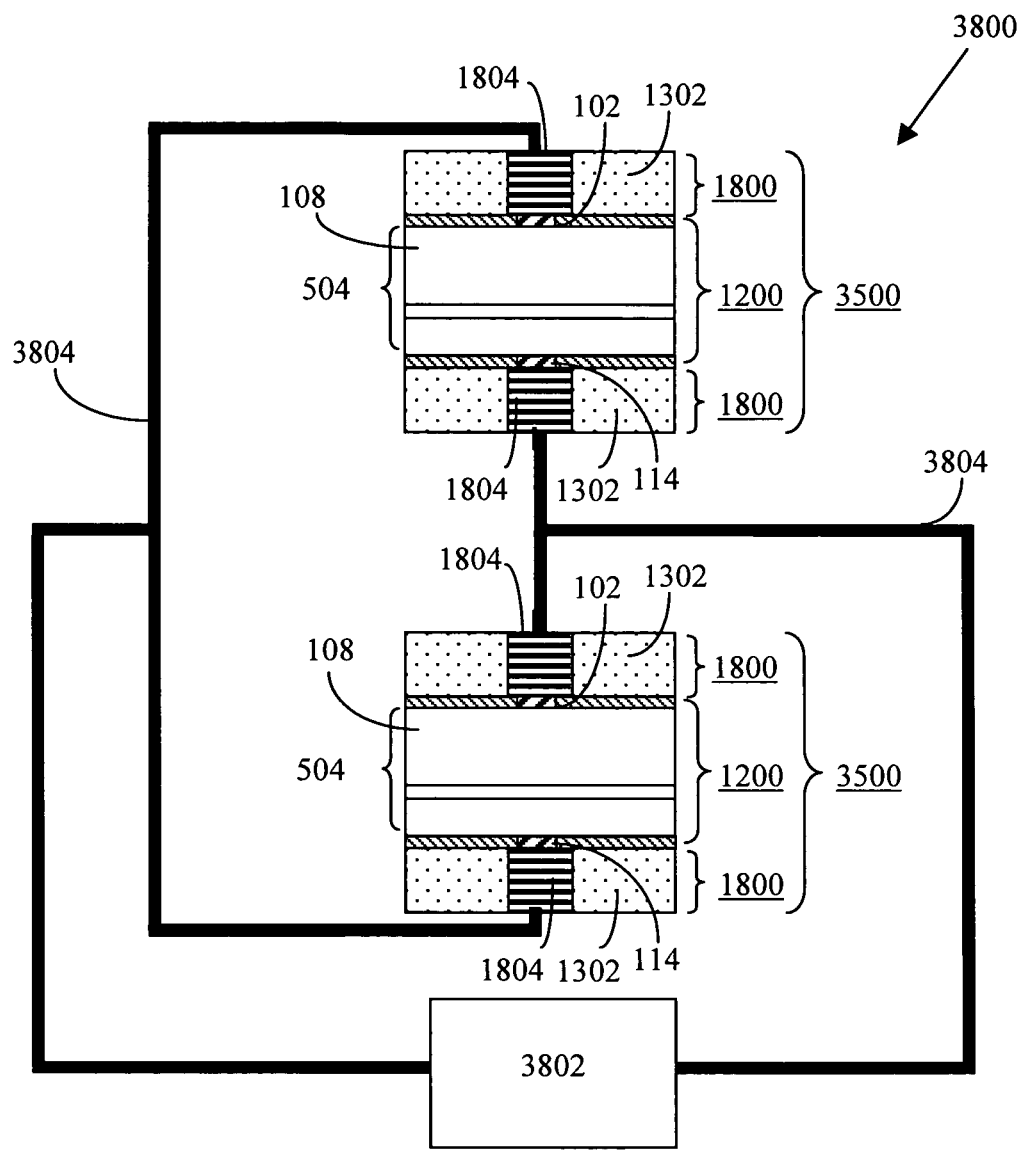
FIG. 38 is a side cross-sectional view of an embodiment of this invention that includes two solid-state light sources that are electrically connected in an anti-parallel configuration to an alternating current source. The two solid-state light sources each include a stack of three elements, a substrate-free LED chip and two wavelength conversion chips.

FIG. 38 is a side cross-sectional view of solid-state light source 3800 that illustrates a linear array of two solid-state light sources 3500 connected in an anti-parallel configuration to an AC current source 3802 by electrical connections or wires 3804. In an anti-parallel configuration, the n-electrode of the upper solid-state light source 3500 is connected to the p-electrode of the lower solid-state light source 3500 and the p-electrode of the upper solid-state light source 3500 is connected to the n-electrode of the lower solid-state light source 3500.

Figure 39:
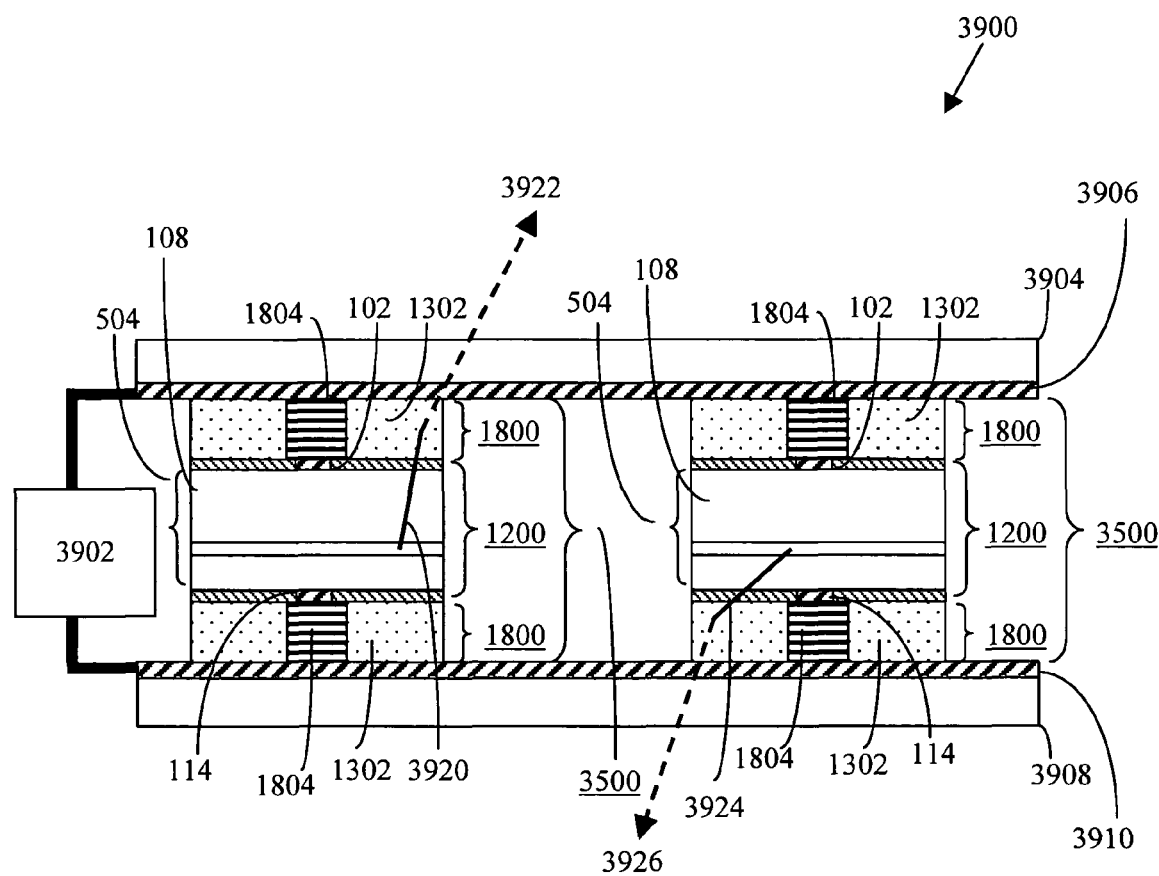
FIG. 39 is a side cross-sectional view of an embodiment of this invention that includes an array of two stacks of elements sandwiched between a transparent substrate and a transparent superstrate. Both the substrate and the superstrate include transparent, electrically-conducting layers that connect the stacks to a current source. Light is emitted through both the substrate and the superstrate.

FIG. 39 illustrates a solid-state light source 3900 that is includes an array of two stacks 3500 of elements. Each stack 3500 includes an LED chip 1200 and two wavelength conversion chips 1800 bonded to opposing sides of the LED chip. The top electrodes of stacks 3500 are connected to a transparent electrical conductor 3906 that is formed on the bottom surface of a transparent superstrate 3904. The bottom electrodes of stacks 3500 are connected to a transparent electrical conductor 3910 that is formed on the top surface of a transparent substrate 3908. The transparent electrical conductors 3906 and 3910 can be made from appropriate transparent conductive oxide (TCO) materials such as, for example, indium-tin oxide or aluminum-doped zinc oxide. The transparent electrical conductors 3906 and 3910 are connected to DC current source 3902. When a current is applied to stacks 3500, light can be emitted both through the bottom substrate and the top superstrate. For example, internally generated light ray 3920 of a first wavelength range is emitted by LED chip 1200 on the left side of solid-state light source 3900. Internally generated light ray 3920 is converted by a wavelength conversion chip 1800 to light ray 3922 of a second wavelength range. Light ray 3922 exits solid-state light source 3900 through the superstrate 3904. Internally generated light ray 3924 of a first wavelength range is emitted by LED chip 1200 on the right side of solid-state light source 3900. Internally generated light ray 3924 is converted by a wavelength conversion chip 1800 to light ray 3926 of a second wavelength range. Light ray 3926 exits solid-state light source 3900 through the substrate 3908.

Another embodiment of this invention is a solid-state light source that includes at least one stack of elements enclosed in a sealed transparent envelope. Each stack includes at least one LED chip and at least one wavelength conversion chip. The stack is substantially cooled by convection utilizing direct contact with an optically transparent fluid. The fluid can be either a gas or a liquid and can be either a single chemical element or compound or can be a mixture of chemical elements or compounds.

Figure 40A:
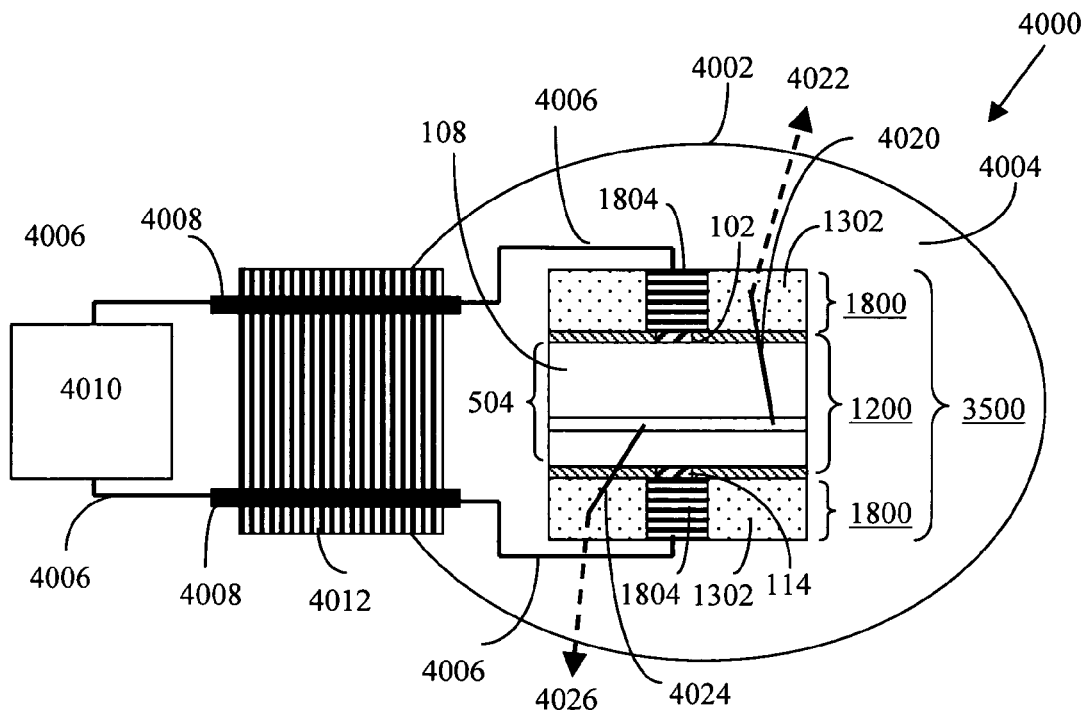
FIG. 40A is a side cross-sectional view of solid-state light source that includes a stack of three elements, an substrate-free LED chip and two wavelength conversion chips. The stack is sealed in a transparent envelope that is filled with a fluid.

FIG. 40A illustrates a side cross-sectional view of solid-state light source 4000. Solid-state light source 4000 includes stack 3500 that is enclosed in a transparent envelope 4002. Seal 4012 allows electrical feedthroughs 4008 to enter transparent envelope 4002. Stack 3500 includes LED chip 1200 and two wavelength conversion chips 1800 bonded to opposing sides of the LED chip. The two feedthroughs 1804 of stack 3500 are connected to DC current source 4010 by electrical connectors or wires 4006 and by electrical feedtroughs 4008. The transparent envelope 4002 is filled with an optically transparent fluid 4004. Transparent fluid 4004 can be a liquid or a gas. The fluid can be a single chemical element or compound or can be a mixture of chemical elements or compounds. Example liquids include, but are not limited to, water, fluoro-carbon liquids and chloro-carbon liquids. Example gases include, but are not limited to, air, nitrogen and inert gases such as argon and helium. Light is emitted by LED chip 1200 of stack 3500, is converted by a wavelength conversion chip 1800, and exits solid-state light source 4000 through transparent envelope 4002. For example, internally generated light ray 4020 of a first wavelength range is emitted by LED chip 1200, is converted to light ray 4022 of a second wavelength range by the upper wavelength conversion chip 1800 and exits solid-state light source 4000 through transparent envelope 4002. In a second example, internally generated light ray 4024 of a first wavelength range is emitted by LED chip 1200, is converted to light ray 4026 of a second wavelength range by the lower wavelength conversion chip 1800 and exits solid-state light source 4000 through transparent envelope 4002.

Figure 40B:
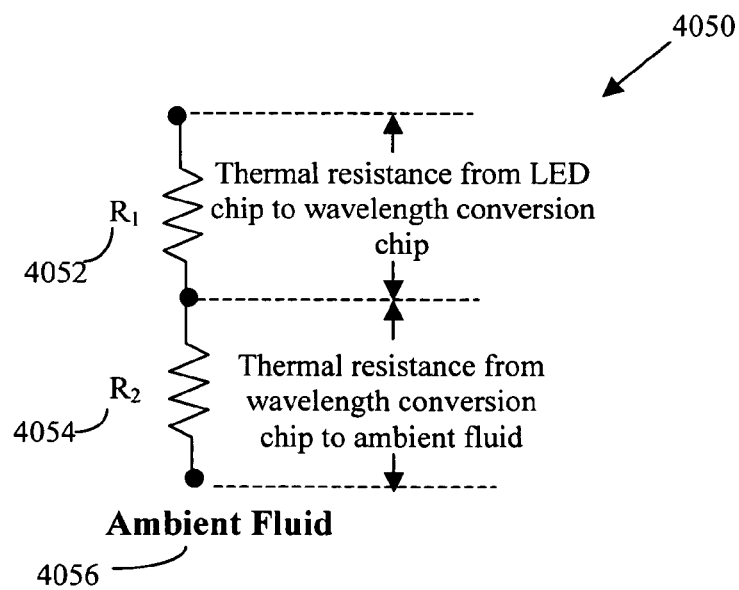
FIG. 40B is a heat flow diagram for the stack of elements illustrate in FIG. 40A.

FIG. 40B illustrates the heat flow from the LED chip of stack 3500 to the ambient fluid 4004. The stack 3500 includes no growth substrates, no transfer substrates, no metal heat sinks and no heat fins. Heat flows from the LED chip to the wavelength conversion chip with thermal resistance 4052 and from the wavelength conversion chip to the ambient fluid 4056 with thermal resistance 4054. If necessary, the area of each wavelength conversion chip illustrated in FIG. 40A can be made larger than the area of the LED chip in order to provide greater surface area for cooling stack 3500

Figure 41:
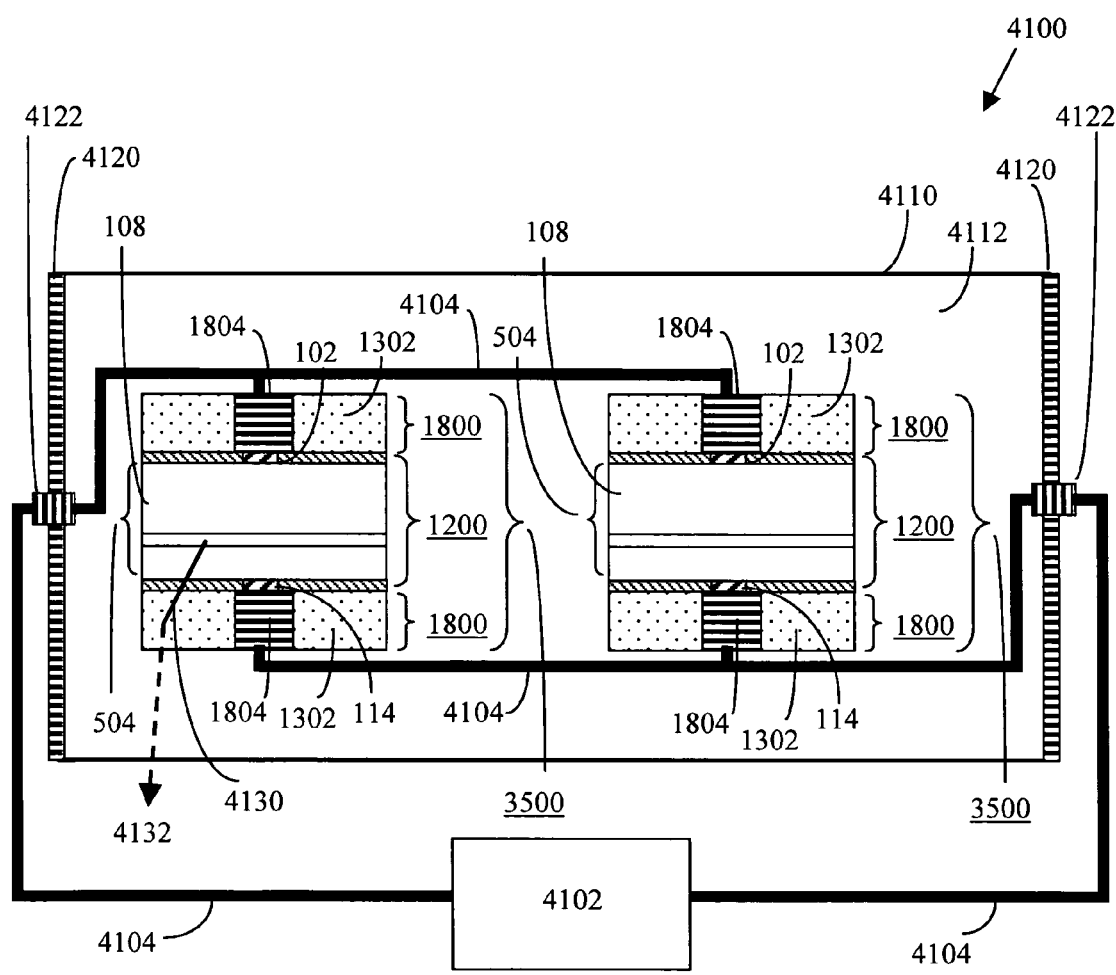
FIG. 41 is a side cross-sectional view of solid-state light source that includes two stacks of elements. The stacks are electrically connected in parallel. Each stack includes a substrate-free LED chip bonded between two wavelength conversion chips. The stacks are sealed in a transparent envelope that is filled with a fluid.

FIG. 41 illustrates a side cross-sectional view of another solid-state light source 4100. Solid-state light source 4100 includes at least two stacks 3500 that are enclosed in a transparent envelope 4110. Although there can be more than two stacks inside the envelope, the additional stacks are not shown to simplify the figure. Seals 4120 allow electrical feedthroughs 4122 to enter transparent envelope 4110. Stacks 3500 each include a substrate-free LED chip 1200 and two wavelength conversion chips 1800 bonded to opposing sides of the LED chip. The four feedthroughs 1804 in the two stacks 3500 are connected to DC current source 4102 by electrical connectors or wires 4104 and by electrical feedtroughs 4120. The transparent envelope 4110 is filled with an optically transparent fluid 4112. Transparent fluid 4112 can be a liquid or a gas. The fluid can be a single chemical element or compound or can be a mixture of chemical elements or compounds. Example liquids include, but are not limited to, water, fluoro-carbon liquids and chloro-carbon liquids. Example gases include, but are not limited to, air, nitrogen and inert gases such as argon and helium.

In solid-state light source 4100, light is emitted by LED chip 1200 of one of the stacks 3500, is converted by a wavelength conversion chip 1800 in the same stack, and exits solid-state light source 4100 through transparent envelope 4110. For example, internally generated light ray 4130 of a first wavelength range is emitted by LED chip 1200 in the left stack, is converted to light ray 4132 of a second wavelength range by a wavelength conversion chip 1800 in the left stack and exits solid-state light source 4100 through transparent envelope 4110.

Another embodiment of this invention is a solid-state light source that includes at least one stack of elements, where the elements in the stack include at least two inorganic LED chips. Preferably, at least one of the inorganic LED chips is substantially transparent to light emitted by the second LED chip. Optionally the stack can also include at least one wavelength conversion chip.

Figure 42:
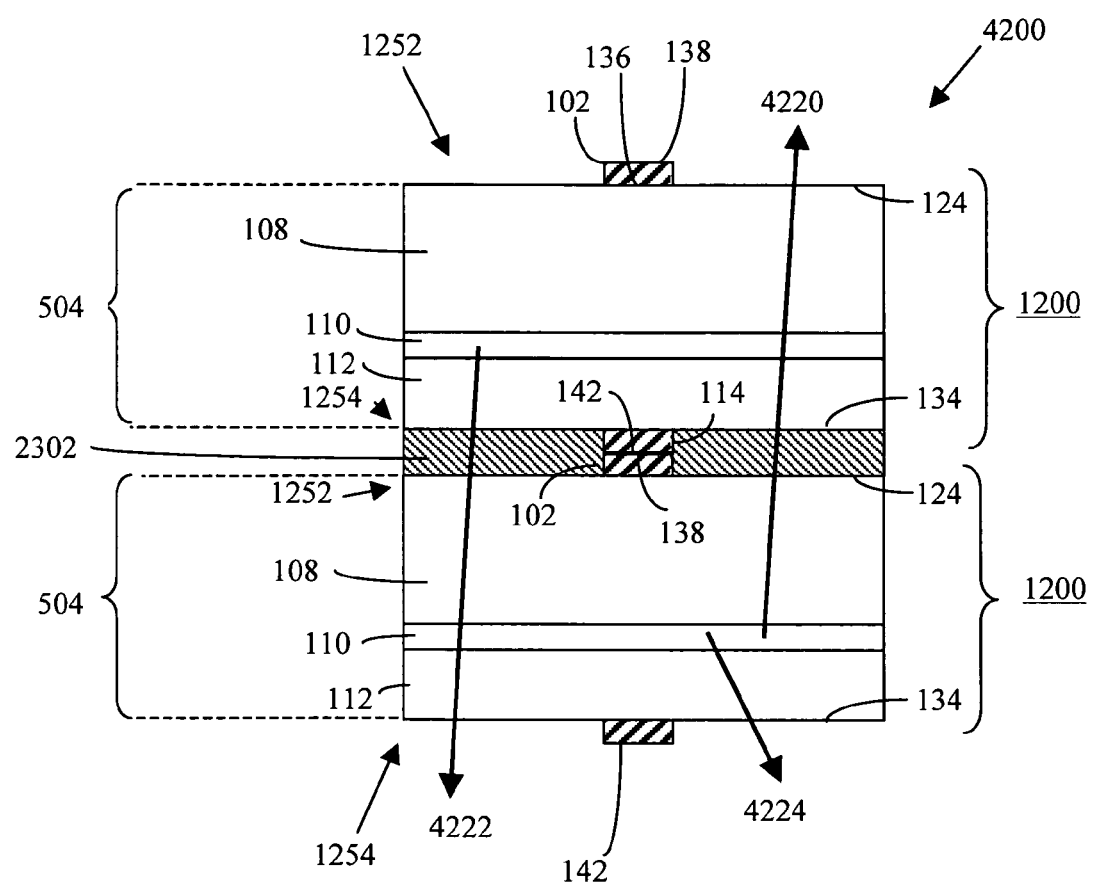
FIG. 42 is a side cross-sectional view of another embodiment of this invention that is a stack or two substrate-free LED chips bonded together. Light is emitted from all sides of the stack.

FIG. 42 is a side cross-sectional view of solid state light source 4200. Solid-state light source 4200 is a stack of two substrate-free LED chips 1200 bonded together. The bond is formed by bonding layer 2302. Electrode 102 of the lower LED chip 1200 is electrically attached to electrode 114 of the upper LED chip 1200 in a series configuration. The attachment of the electrodes can be done, for example, by using a solder or a conductive epoxy (neither is shown in the figure). When a current is applied through the two LEDs of the stack, light is emitted by both active regions 110. For example, internally generated light ray 4224 is emitted by the active region 110 of the lower LED and exits the same LED. Light emitted from one LED can also pass through the other LED as illustrated by light rays 4220 and 4222. Internally generated light ray 4220 is emitted by the lower LED, passes through the upper LED and exits the light source. Internally generated light ray 4222 is emitted by the upper LED, passes through the lower LED and exits the light source.

Another embodiment of this invention is a method for fabricating a solid-state light source that is a stack of elements, where the elements include a light emitting diode chip and a wavelength conversion chip.

FIGS. 43A to 43G are side cross-sectional views illustrating an example set of steps for fabricating a solid-state light source that is a stack of elements.

Figure 43A:
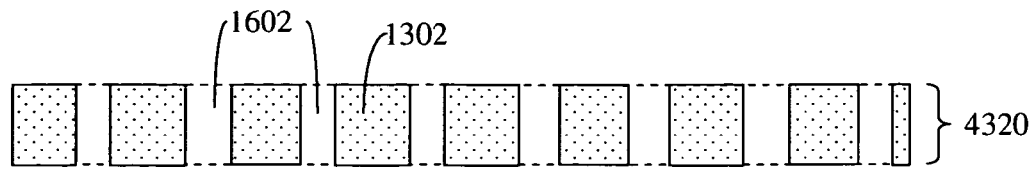
FIGS. 43A-43G illustrate a method for fabricating a solid-state light source that includes a stack of elements.

One initial step is to provide a wafer of unsegmented wavelength conversion chips. A side cross-sectional view of wafer 4302 of unsegmented wavelength conversion chips is illustrated in FIG. 43A. The wafer includes a wavelength conversion layer 1302 that includes vias 1602 that pass through the wafer. Appropriate wavelength conversion materials for the wavelength conversion layer 1302 were described above.

Figure 43B:
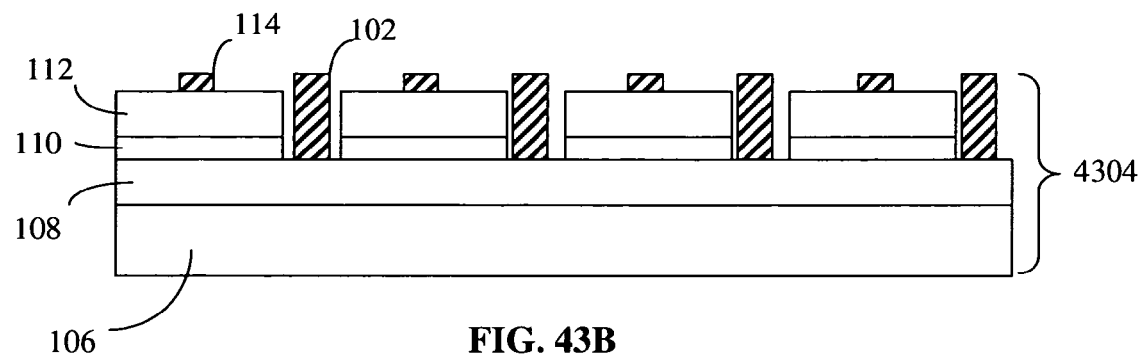

Another step is to provide a wafer of unsegmented light emitting diode chips that includes either a growth substrate or a transfer substrate. FIG. 43B illustrates a side cross-sectional view of a wafer 4304 of unsegmented light emitting diode chips. The wafer 4304 includes a growth substrate 106, a first doped layer 108, an active region 110, a second doped layer 112, an array of first electrodes 102 and an array of second electrodes 114.

Figure 43C:
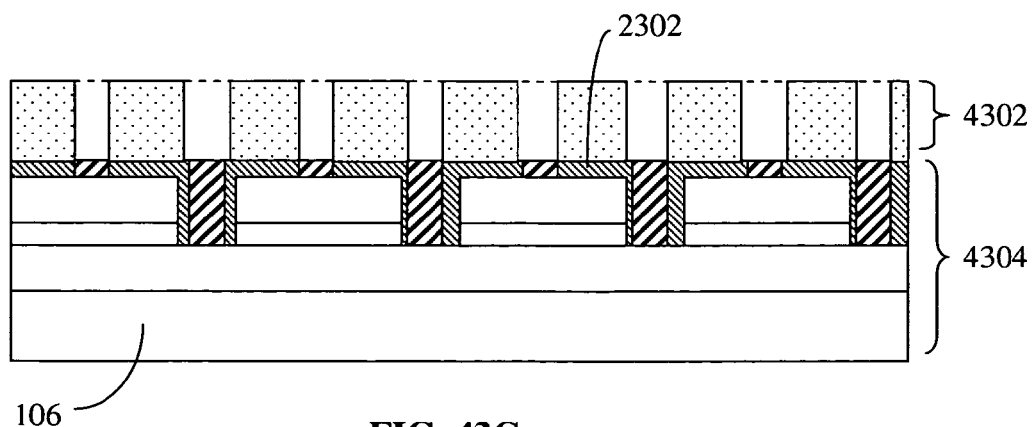

The wafer 4302 of unsegmented wavelength conversion chips and the wafer 4304 of unsegmented LED chips are bonded together by transparent bonding layer 2302. This is illustrated in FIG. 43C in a side cross-sectional view.

Figure 43D:
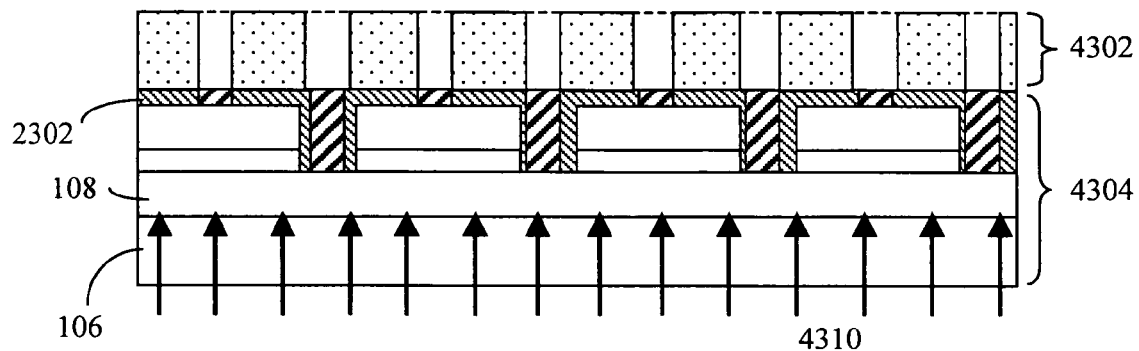
Figure 43E:
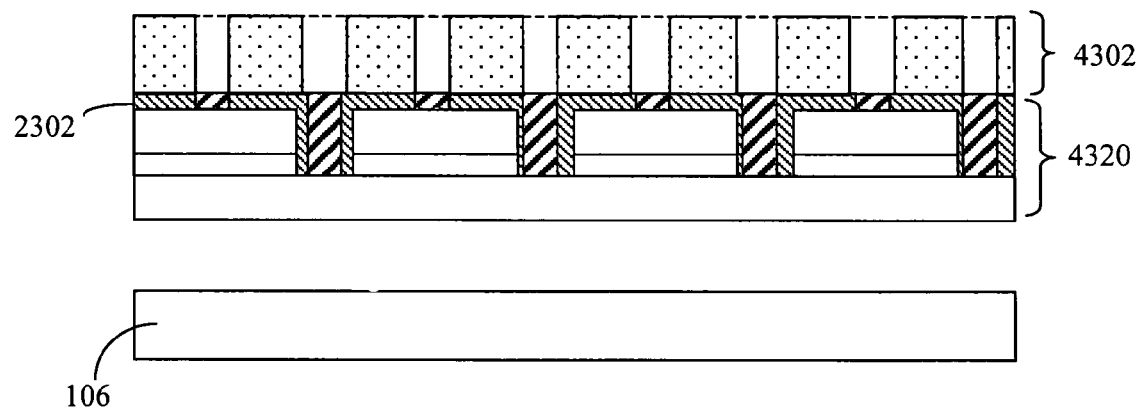
Figure 43F:
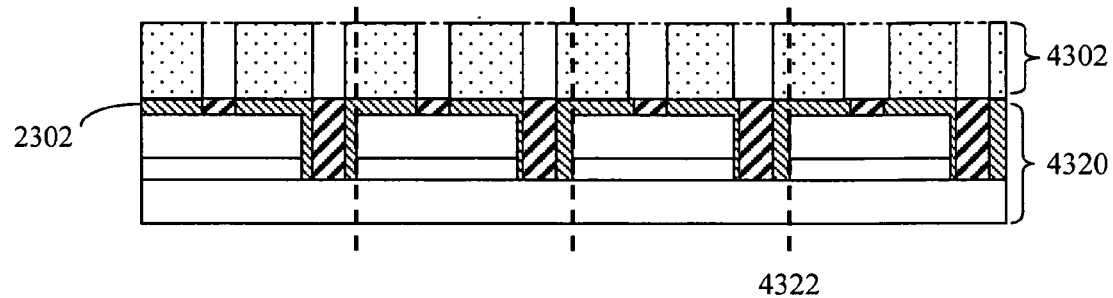

Optionally, the growth substrate 106 or the transfer substrate (not shown) is removed by standard processes that include, but are not limited to, laser liftoff, chemical processes or mechanical polishing. FIG. 43D illustrates directing laser radiation 4310 through the substrate 106 to the first doped layer in order to detach the growth substrate. In FIG. 43E, the growth substrate 106 is removed, leaving the wavelength conversion wafer 4302 bonded to the remainder 4320 of the wafer of unsegmented LED chips.

Figure 43G:
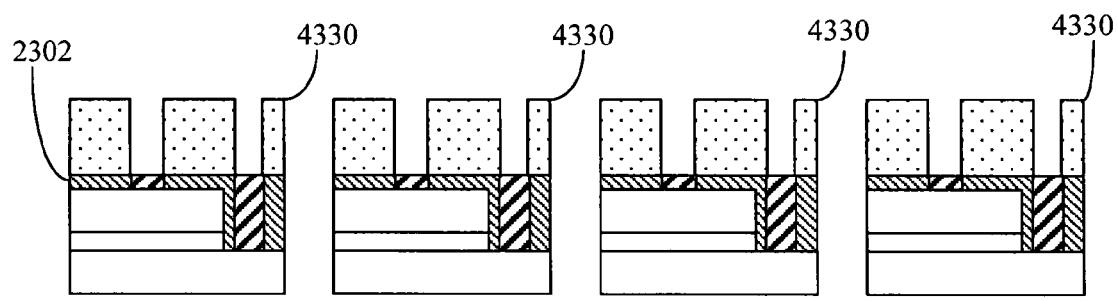

Finally, the bonded wafers are segmented into a plurality of solid-state light sources. The dotted lines in FIG. 43F indicated where the segmentation is to occur. Segmentation can be done by any standard technique including, but not limited to, dicing, mechanical cutting or laser cutting. The segmented solid-state light sources 4330 are illustrated in FIG. 43G.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A substrate-free inorganic light emitting diode chip comprising:
   a multilayer semiconductor structure that includes a first doped layer, a second doped layer and an active region interposed between and immediately adjacent to said first doped layer and said second doped layer, without any intervening layer between the active region and either of said first and second doped layers;
   a first electrode in electrical contact with said first doped layer; and
   a second electrode in electrical contact with said second doped layer;
   wherein said first doped layer or said second doped layer is between 10 microns and 100 microns thick; and
   wherein said active region emits internally generated light in a first wavelength range when an electrical current is applied between said first electrode and said second electrode.

2. A substrate-free inorganic light emitting diode chip as in claim 1, wherein said first doped layer or said second doped layer that is between 10 microns and 100 microns thick is a doped GaN, AlN, InN, AlGaN, InGaN or AlInGaN layer fabricated by hydride vapor phase epitaxy.

3. A substrate-free inorganic light emitting diode chip as in claim 2, wherein the said first doped layer or said second doped layer is between 15 microns and 100 microns thick.

4. A substrate-free inorganic light emitting diode chip as in claim 3, wherein the said first doped layer or said second doped layer is between 20 microns and 100 microns thick.

5. An inorganic light emitting diode chip as in claim 4, wherein the said first doped layer or said second doped layer is between 25 microns and 100 microns thick.

6. A substrate-free inorganic light emitting diode chip as in claim 1, wherein said first electrode or said second electrode comprises a transparent or semi-transparent conductive oxide.

7. A substrate-free inorganic light emitting diode chip as in claim 6, wherein said conductive oxide is aluminum-doped zinc oxide.

8. A substrate-free inorganic light emitting diode chip as in claim 7, wherein said aluminum-doped zinc oxide is greater than 500 nanometers thick.

9. The substrate-free inorganic light emitting diode chip as in claim 1 wherein said first electrode or said second electrode or both said first electrode and said second electrode are a high temperature fusible material.

10. The substrate-free inorganic light emitting diode chip as in claim 9 wherein said high temperature fusible material contains silver or aluminum.

11. The substrate-free inorganic light emitting diode chip as in claim 1 wherein said first doped layer or said second doped layer that is between 10 microns and 100 microns thick is n-doped and is grown by HVPE.

12. The substrate-free inorganic light emitting diode chip as in claim 1 wherein said first doped layer or said second doped layer that is between 10 microns and 100 microns thick is p-doped and is grown by HVPE.

13. The substrate-free inorganic light emitting diode chip as in claim 1 wherein said first electrode or said second electrode is a metal, metal alloys, high-temperature-fusible conductive material, or semiconductor material.

14. The substrate-free inorganic light emitting diode chip as in claim 1 wherein said multilayer semiconductor structure has a first side and an opposing second side, said active region emitting light from both said first side and said second side.

15. A substrate-free inorganic light emitting diode chip comprising:
   a multilayer semiconductor structure that includes a first doped layer, a second doped layer and an active region interposed between said first doped layer and said second doped layer;
   a first electrode in electrical contact with said first doped layer; and
   a second electrode in electrical contact with said second doped layer;
   wherein said first doped layer or said second doped layer is between 10 microns and 100 microns thick; and
   wherein said active region emits internally generated light in a first wavelength range when an electrical current is applied between said first electrode and said second electrode; and
further comprising a wavelength conversion chip, said wavelength conversion chip bonded to said substrate-free inorganic light emitting diode chip wherein said wavelength conversion chip contains at least one of the following elements, extraction elements, dichroic layer, electrical interconnect, and via.

16. The substrate-free inorganic light emitting diode chip as in claim 1 wherein said first electrode or said second electrode is an omni-directional reflector.

17. The substrate-free inorganic light emitting diode chip as in claim 1 wherein said first electrode or said second electrode have a reflectivity greater than 90 percent to both internally generated light and externally incident light in the emitting wavelength range.

18. The substrate-free inorganic light emitting diode chip as in claim 6 wherein said transparent conductive oxide is indium tin oxide (ITO), zinc oxide (ZnO), indium-doped zinc oxide (IZO) or aluminum-doped zinc oxide (AZO).

* * * * *